US012568602B2

(12) United States Patent
El-Akkad et al.

(10) Patent No.: US 12,568,602 B2
(45) Date of Patent: Mar. 3, 2026

(54) MODULAR SYSTEM FOR DETECTING, TRACKING, AND TRANSMITTING TO IDENTIFIED OBJECTS

(71) Applicant: Anduril Industries, Inc., Costa Mesa, CA (US)

(72) Inventors: Sam El-Akkad, Poway, CA (US); Christopher Fischer, Lake Forest, CA (US); Travis Whitaker, Costa Mesa, CA (US); Bryden Pearson, Irvine, CA (US); Todd Berk, Lake Forest, CA (US); Thao Pham, San Diego, CA (US); Jon Hsu, Yorba Linda, CA (US); Cameron Dart, Fountain Valley, CA (US)

(73) Assignee: Anduril Industries, Inc., Costa Mesa, CA (US)

( * ) Notice: Subject to any disclaimer, the term of this patent is extended or adjusted under 35 U.S.C. 154(b) by 461 days.

(21) Appl. No.: 17/978,822

(22) Filed: Nov. 1, 2022

(65) Prior Publication Data

US 2024/0094378 A1     Mar. 21, 2024

Related U.S. Application Data

(60) Provisional application No. 63/420,247, filed on Oct. 28, 2022, provisional application No. 63/365,115, filed on May 20, 2022.

(51) Int. Cl.
*H05K 7/20* (2006.01)
*G06F 1/20* (2006.01)
*H04B 1/38* (2015.01)

(52) U.S. Cl.
CPC ........... *H05K 7/20163* (2013.01); *G06F 1/20* (2013.01); *H04B 1/38* (2013.01)

(58) Field of Classification Search
None
See application file for complete search history.

(56) References Cited

U.S. PATENT DOCUMENTS 6,232,928 B1    5/2001  Zimmerman et al.
7,046,513 B2 *  5/2006  Nishiyama ......... H05K 7/20572
361/689

(Continued)

FOREIGN PATENT DOCUMENTS

CN      104363736 A      2/2015
CN      108696774 A     10/2018

(Continued)

OTHER PUBLICATIONS

U.S. Appl. No. 18/051,743, Modular System for Detecting, Tracking, and Transmitting to Identified Objects, filed Nov. 1, 2022.

(Continued)

*Primary Examiner* — Courtney L Smith
(74) *Attorney, Agent, or Firm* — Knobbe, Martens, Olson & Bear, LLP

(57) ABSTRACT

A modular, radio frequency ("RF") system includes one or more directional antennas and is configured with both hardware and software components to enable the RF system to monitor (e.g., detect or track signals or objects) and/or interact with (e.g., track signals or objects, or transmit signals) objects in particular directions. The RF system includes one or more machine learning models to determine, based on received signals, one or more signals to transmit.

12 Claims, 22 Drawing Sheets

(56) References Cited

U.S. PATENT DOCUMENTS

| | | | | |
|---|---|---|---|---|
| 7,129,908 | B2 * | 10/2006 | Edward | H01Q 21/061 |
| | | | | 343/890 |
| 7,859,835 | B2 * | 12/2010 | Puzella | H01Q 1/02 |
| | | | | 343/702 |
| 8,494,464 | B1 | 7/2013 | Kadambe et al. | |
| 9,182,481 | B2 | 11/2015 | Bowring et al. | |
| 9,545,991 | B1 | 1/2017 | Alley et al. | |
| 9,555,873 | B1 | 1/2017 | Alley et al. | |
| 9,580,165 | B1 | 2/2017 | Alley et al. | |
| 9,902,487 | B2 | 2/2018 | Alley et al. | |
| 9,902,488 | B2 | 2/2018 | Alley et al. | |
| 10,494,081 | B2 | 12/2019 | Alley et al. | |
| 10,506,436 | B1 | 12/2019 | Newman et al. | |
| 10,812,978 | B2 | 10/2020 | Newman et al. | |
| 10,965,388 | B2 | 3/2021 | Patel et al. | |
| 11,091,227 | B2 | 8/2021 | Lebo et al. | |
| 11,117,649 | B2 | 9/2021 | Alley et al. | |
| 11,182,043 | B2 | 11/2021 | Luckey et al. | |
| 11,214,370 | B2 | 1/2022 | Alley et al. | |
| 11,240,932 | B1 | 2/2022 | Andrade | |
| 11,268,651 | B2 | 3/2022 | Carlson et al. | |
| 11,350,277 | B2 | 5/2022 | Newman et al. | |
| 11,385,659 | B2 | 7/2022 | Levin et al. | |
| 11,443,640 | B2 | 9/2022 | Luckey et al. | |
| 11,916,279 | B1 | 2/2024 | El-Akkad et al. | |
| 12,255,404 | B2 | 3/2025 | El-Akkad et al. | |
| 2006/0002084 | A1 * | 1/2006 | Wei | H05K 7/20745 |
| | | | | 361/695 |
| 2007/0058339 | A1 * | 3/2007 | Hoffman | H05K 7/20136 |
| | | | | 361/688 |
| 2007/0247809 | A1 * | 10/2007 | McClure | G06F 1/20 |
| | | | | 361/695 |
| 2010/0027222 | A1 * | 2/2010 | Abert | H05K 7/20136 |
| | | | | 361/715 |
| 2011/0176762 | A1 | 7/2011 | Fujikata et al. | |
| 2013/0144166 | A1 | 6/2013 | Specht et al. | |
| 2013/0279111 | A1 | 10/2013 | Lee | |
| 2014/0015693 | A1 | 1/2014 | Komoguchi et al. | |
| 2015/0264742 | A1 * | 9/2015 | Merola | H04B 1/036 |
| | | | | 370/338 |
| 2015/0349810 | A1 | 12/2015 | Baxley et al. | |
| 2015/0350228 | A1 | 12/2015 | Baxley et al. | |
| 2015/0382508 | A1 | 12/2015 | Tatta et al. | |
| 2017/0031005 | A1 | 2/2017 | Jaeger et al. | |
| 2017/0094527 | A1 | 3/2017 | Shattil et al. | |
| 2017/0192089 | A1 | 7/2017 | Parker et al. | |
| 2017/0269650 | A1 | 9/2017 | Kilgore et al. | |
| 2018/0246547 | A1 * | 8/2018 | Degner | G08B 21/18 |
| 2018/0308013 | A1 | 10/2018 | O'Shea | |
| 2019/0053400 | A1 | 2/2019 | Hendrix et al. | |
| 2019/0146076 | A1 | 5/2019 | Kravets et al. | |
| 2019/0180630 | A1 | 6/2019 | Kleinbeck | |
| 2019/0285748 | A1 | 9/2019 | DeVries et al. | |
| 2020/0102065 | A1 | 4/2020 | Alley et al. | |
| 2020/0143279 | A1 | 5/2020 | West et al. | |
| 2020/0167059 | A1 | 5/2020 | Luckey et al. | |
| 2020/0184832 | A1 | 6/2020 | Kleinbeck | |
| 2020/0363824 | A1 | 11/2020 | Levin et al. | |
| 2021/0065564 | A1 | 3/2021 | Vacek | |
| 2021/0211212 | A1 | 7/2021 | Derr et al. | |
| 2021/0249701 | A1 | 8/2021 | Shine et al. | |
| 2021/0371067 | A1 | 12/2021 | Lebo et al. | |
| 2021/0403143 | A1 | 12/2021 | Alley et al. | |
| 2022/0027038 | A1 | 1/2022 | Luckey et al. | |
| 2022/0075056 | A1 | 3/2022 | Esmail | |
| 2022/0166909 | A1 | 5/2022 | Kelly et al. | |
| 2022/0166915 | A1 | 5/2022 | Kelly et al. | |
| 2022/0166948 | A1 | 5/2022 | Kelly et al. | |
| 2022/0174235 | A1 | 6/2022 | Kelly et al. | |
| 2022/0187416 | A1 | 6/2022 | Miu et al. | |
| 2022/0214009 | A1 | 7/2022 | Carlson et al. | |
| 2022/0256343 | A1 | 8/2022 | Newman et al. | |
| 2022/0274704 | A1 | 9/2022 | Alley et al. | |
| 2022/0335840 | A1 | 10/2022 | Luckey et al. | |
| 2023/0375693 | A1 | 11/2023 | El-Akkad et al. | |
| 2023/0408619 | A1 | 12/2023 | El-Akkad et al. | |
| 2024/0094372 | A1 | 3/2024 | El-Akkad et al. | |
| 2024/0094375 | A1 | 3/2024 | El-Akkad et al. | |
| 2024/0097352 | A1 | 3/2024 | El-Akkad et al. | |
| 2024/0097353 | A1 | 3/2024 | El-Akkad et al. | |
| 2024/0372272 | A1 | 11/2024 | El-Akkad et al. | |

FOREIGN PATENT DOCUMENTS

| | | |
|---|---|---|
| CN | 213580570 U | 6/2021 |
| DE | 10-2021-209451 | 3/2022 |
| EP | 4336210 | 3/2024 |
| TW | M504351 U | 7/2015 |
| WO | WO 2021/108361 | 6/2021 |
| WO | WO 2021/187455 | 9/2021 |
| WO | WO 2023/225417 | 11/2023 |

OTHER PUBLICATIONS

U.S. Appl. No. 18/051,801, Modular System for Detecting, Tracking, and Transmitting to Identified Objects, filed Nov. 1, 2022.

U.S. Appl. No. 17/978,736, Modular System for Detecting, Tracking, and Transmitting to Identified Objects, filed Nov. 1, 2022.

U.S. Appl. No. 17/978,701, Modular System for Detecting, Tracking, and Transmitting to Identified Objects, filed Nov. 1, 2022.

U.S. Appl. No. 17/978,807, Detecting, Tracking, and Transmitting to Identified Objects Using Models in a Modular System, filed Nov. 1, 2022.

U.S. Appl. No. 17/978,868, Detecting, Tracking, and Transmitting to Identified Objects Using Models in a Modular System, filed Nov. 1, 2022.

U.S. Appl. No. 17/978,821, Detecting, Tracking, and Transmitting to Identified Objects Using Models in a Modular System, filed Nov. 1, 2022.

Invitation to Pay Additional Fees in Application No. PCT/US2023/062772, mailed on Mar. 29, 2023, in 5 pages.

International Search Report and Written Opinion in Application No. PCT/US2023/062772, mailed on May 22, 2023, in 32 pages.

Examination Report received in Australian application No. 2023202807, dated Jun. 23, 2023, in 5 pages.

European Search Report in application No. EP 23172878, dated Jan. 23, 2024, in 8 pages.

U.S. Pat. No. 12,255,404, Modular System for Detecting, Tracking, and Transmitting to Identified Objects, Mar. 18, 2025.

U.S. Pat. No. 11,916,279, Modular System for Detecting, Tracking, and Transmitting to Identified Objects, Feb. 27, 2024.

Extended European Search Report in application No. EP 23720532, dated Mar. 6, 2024, in 10 pages.

Office Action in Taiwan application No. 112118626, dated Jun. 27, 2024, in 11 pages.

Examination Report in European application No. 23172878.3, dated Oct. 4, 2024, in 5 pages.

Office Action with English translation in Japanese application No. 2023-528636, dated Nov. 27, 2024, in 9 pages.

International Preliminary Report on Patentability and Written Opinion in Application No. PCT/US2023/062772, dated Nov. 7, 2024, in 14 pages.

U.S. Appl. No. 18/773,330, Modular System for Detecting, Tracking, and Transmitting to Identified Objects, filed Jul. 15, 2024.

* cited by examiner

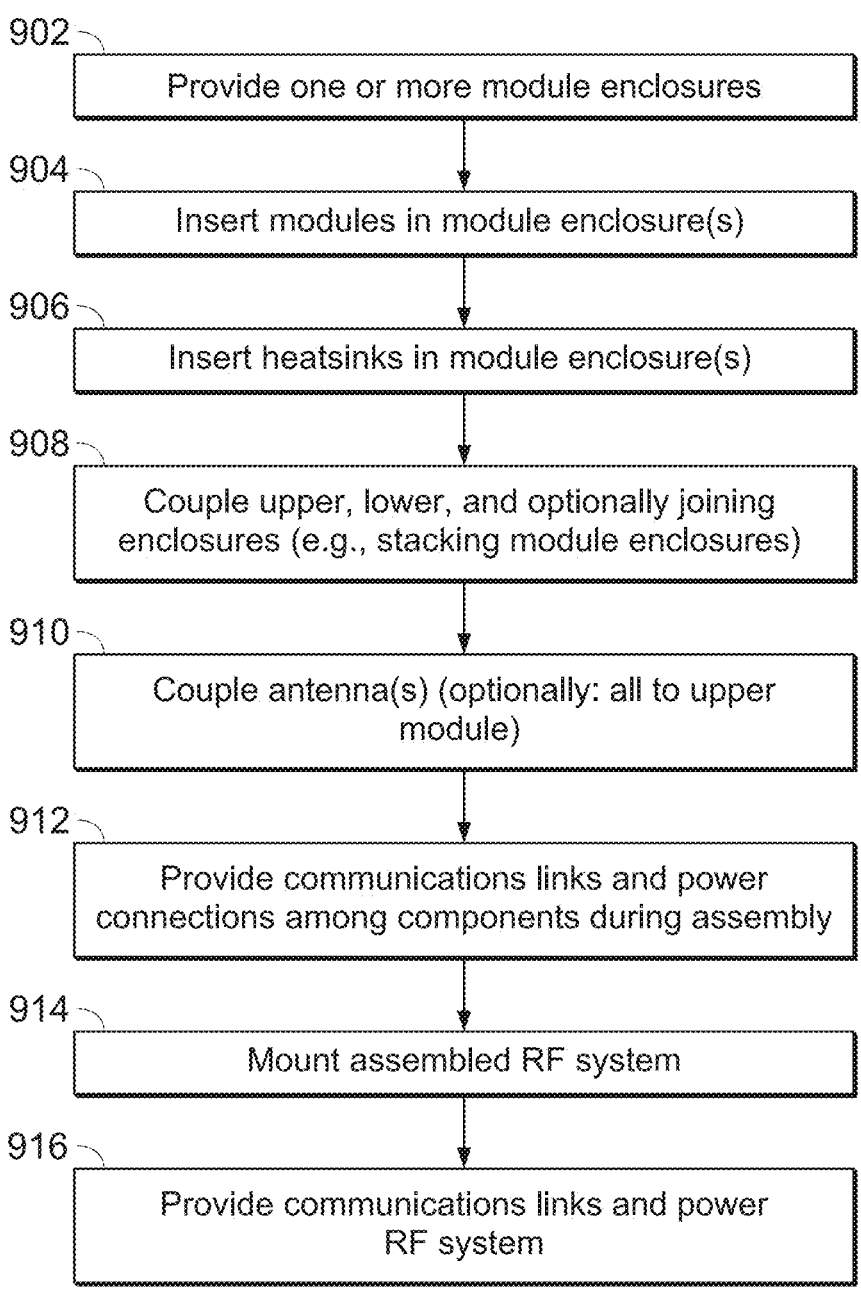

902 — Provide one or more module enclosures

904 — Insert modules in module enclosure(s)

906 — Insert heatsinks in module enclosure(s)

908 — Couple upper, lower, and optionally joining enclosures (e.g., stacking module enclosures)

910 — Couple antenna(s) (optionally: all to upper module)

912 — Provide communications links and power connections among components during assembly 914 — Mount assembled RF system 916 — Provide communications links and power RF system

FIG. 9A

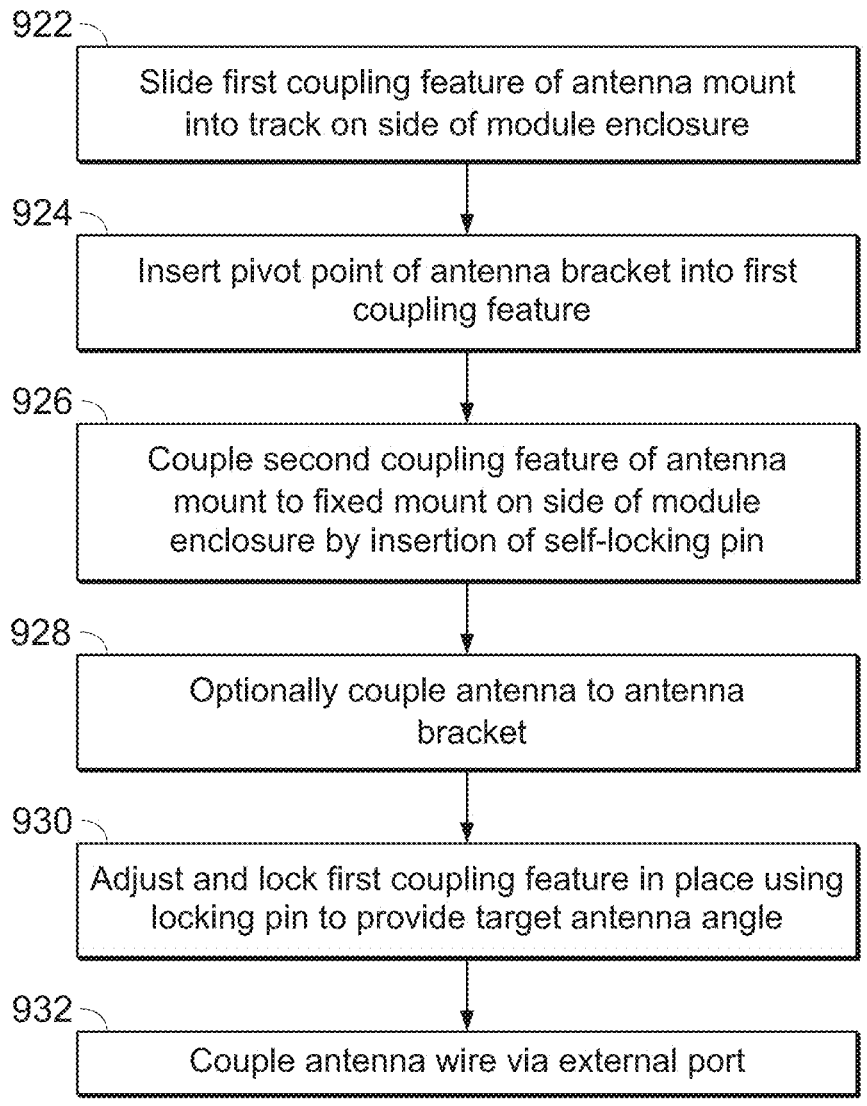

922

Slide first coupling feature of antenna mount into track on side of module enclosure

924

Insert pivot point of antenna bracket into first coupling feature

926

Couple second coupling feature of antenna mount to fixed mount on side of module enclosure by insertion of self-locking pin

928

Optionally couple antenna to antenna bracket

930

Adjust and lock first coupling feature in place using locking pin to provide target antenna angle

932

Couple antenna wire via external port

FIG. 9B

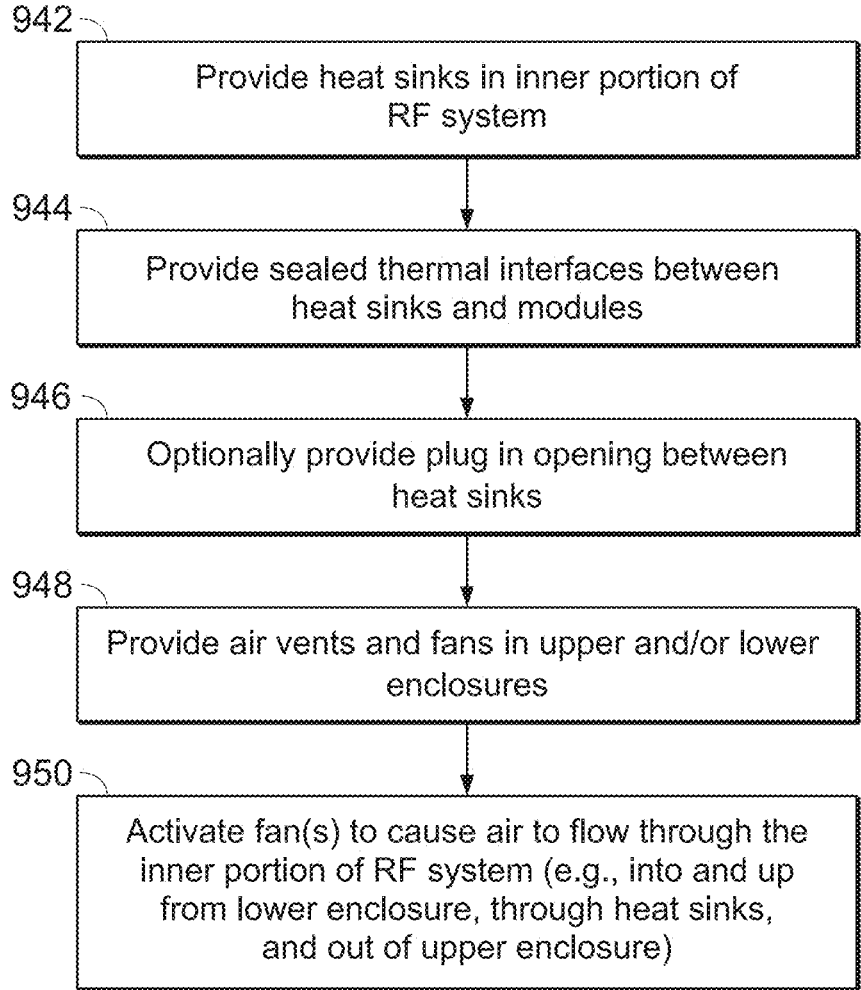

942 — Provide heat sinks in inner portion of RF system

944 — Provide sealed thermal interfaces between heat sinks and modules

946 — Optionally provide plug in opening between heat sinks

948 — Provide air vents and fans in upper and/or lower enclosures

950 — Activate fan(s) to cause air to flow through the inner portion of RF system (e.g., into and up from lower enclosure, through heat sinks, and out of upper enclosure)

FIG. 9C

MODULAR SYSTEM FOR DETECTING, TRACKING, AND TRANSMITTING TO IDENTIFIED OBJECTS

CROSS-REFERENCE TO RELATED APPLICATIONS

This application claims benefit of U.S. Provisional Patent Application No. 63/365,115, filed May 20, 2022, and titled "MODULAR SYSTEM FOR DETECTING, TRACKING, AND TRANSMITTING TO IDENTIFIED OBJECTS," and U.S. Provisional Patent Application No. 63/420,247, filed Oct. 28, 2022, and titled "MODULAR SYSTEM FOR DETECTING, TRACKING, AND TRANSMITTING TO IDENTIFIED OBJECTS." The entire disclosure of each of the above items is hereby made part of this specification as if set forth fully herein and incorporated by reference for all purposes, for all that it contains.

Any and all applications for which a foreign or domestic priority claim is identified in the Application Data Sheet as filed with the present application are hereby incorporated by reference under 37 CFR 1.57 for all purposes and for all that they contain.

TECHNICAL FIELD

Embodiments of the present disclosure relate to modular, directional transceiver systems and methods for detecting, tracking, and/or transmitting to identified objects. Embodiments of the present disclosure further relate to devices, systems, and methods for locating or identifying an object in three-dimensional space, tracking the object's movement or location, determining properties associated with one or more signals emanating from or near the object, and generating and transmitting one or more signals in the direction of the object.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Radio frequency ("RF") systems may provide monitoring and/or transmitting functionality for particular radio frequencies. Such RF systems may generally include an omnidirectional antenna, and may be configured to either transmit, or receive, particular radio frequencies.

SUMMARY

The systems, methods, and devices described herein each have several aspects, no single one of which is solely responsible for its desirable attributes. Without limiting the scope of this disclosure, several non-limiting features will now be described briefly.

To monitor a surrounding area, a plurality of specialized equipment can be installed to identify objects, track objects, and transmit signals towards objects. Conventional equipment, and its associated software components, if any, is typically manufactured and/or programmed for one function or purpose only and may be limited to such preconfigured functions. These conventional systems may not be adjusted easily, and in some cases, they cannot be adjusted at all. For example, if the systems can monitor over a particular RF range, the system may not be easily updated to monitor additional RF ranges without significant expense or effort (e.g., new hardware, rewriting of software, and/or the like). Such systems also may not be moved around or installed in new locations or orientations without testing, calibration, new hardware, and the like. Further, such systems may make use of omni directional antennas that radiates in, or receives from, many directions simultaneously, which may eliminate the opportunity to target signal transmission in particular directions, and may have high power requirements.

The systems, methods, and devices of the present disclosure (generally collectively referred to herein as the "RF system") may overcome one or more of these disadvantages, and may include a modular, adaptable, and movable system that can be updated and/or reprogrammed to execute multiple or different purposes and functions.

Hardware components of the described radio frequency ("RF") system can include one or more directional broad-bandwidth antennas, one or more module enclosures, one or more processing modules, and one or more RF modules, among other hardware components described in more detail herein. The one or more directional antennas can be physically positioned and configured to transmit or receive at varying power levels and frequencies in one or more specific directions, such that the antennas can collectively provide greater directionality and sensitivity in certain direction(s) than in other directions. Hardware components of the described systems can also include a direction finder, also referred to herein as a radio direction finder or direction finding antenna. The direction finder can use reception of radio waves to determine the direction in which an object is located. In various embodiments, by combining the direction information from multiple sources (e.g., other direction finders in the area, other systems, or one or more of the directional broad-bandwidth antennas, and/or the like), the source of a transmission may be located (e.g., via triangulation or other similar means). In various embodiments, each directional antenna and its associated electronic circuitry can operate independently as well as in a coordinated way with the other directional antennas. The antennas can also be configured to comprise automated or manual adjustability with respect to a vertical angle so that the antenna can face more downwards towards the ground or be adjusted to face more upwards towards the sky.

The RF system can advantageously be modular to enable multiple configurations for various applications. The modularity of the RF system can be found in both the modularity of a particular RF system that can operate on its own (including in coordination with one or more additional systems or sensors), and multiple RF systems that can operated in coordination with one another (including in coordination with one or more additional systems or sensors). For example, the RF system can be implemented with one module enclosure, two module enclosures, or more module enclosures. In the example of two or more module enclosures, the module enclosures of the RF system may be joined together by one or more joining enclosures. Accordingly, in an implementation the RF system may include two stacked module enclosures, joined together by a joining enclosure. In the various implementations, the RF system may further include components for mounting the RF system, such as one or more mounts, clips, slides, pins, and/or the like. Advantageously, the RF system, given its modularity, may be appropriately configured for a given application, and mounted on a tripod, a vehicle, a building, and/or the like.

Each of the module enclosures may house one or more processing modules, one or more RF modules, and one or more power supply modules, as described herein. In various embodiments, a single module enclosure can be connected to two directional broad-bandwidth antennas, where the antennas can be placed at a single location, or the antennas can be placed a distance apart from each other (e.g., 5, 10, 100 feet apart) and connected to the same module enclosure. In various embodiments, the RF modules can include power amplifier technology and positioning, navigation, and timing ("PNT") capabilities (which, in some implementations may be provided in the direction finder).

In various embodiments, the processing modules can include a machine learning component that can be used to assist the RF system in detecting and/or identifying one or more RF signals captured by a connected antenna. For example, the machine learning component can implement machine learning ("ML") algorithms, artificial intelligence ("AI") algorithms, and/or any other types of algorithms (generally collectively referred to herein as "AI/ML algorithms", "AI/ML models", or simply as "ML algorithms", "ML models", and/or the like) that may, for example, implement models that are executed by one or more processors. Having an ML model to identify RF signals can advantageously provide significant improvements as compared to conventional systems because many detected signals may include some level of interference, be relatively weak and hard to detect, or otherwise hard to identify due to other factors. In various embodiments, the machine learning component can use one or more machine learning algorithms to implement one or more models or parameter functions for the detections/identifications. The machine learning component can be configured to apply a model that can help detect which types of RF signals (e.g., a range of RF signals, particular frequencies or combinations of frequencies, and/or the like) indicate which types of objects. Thus, the model can be applied, by the RF system, to received or captured RF signals for identification purposes. For example, various embodiments, the machine learning model of the RF system can be trained by: (1) raw signal sampling, (2) application of trained model, and/or (3) output of classes and probabilities (e.g., associated with type of objects). Then, for example, the processing module can identify a type of object based on the (3) output of classes and probabilities. Also, in various embodiments, application of the trained machine learning model can comprise the preliminary step of (0) filtering base line signal and/or friendly signals.

In various embodiments, the RF system (e.g., via one or more processing modules and/or one or more RF modules) can use identified types of objects (e.g., output from the applied machine learning model) to generate one or more new signals and, using one or more of the directional antennas, transmit the new signals. The new signals may be transmitted in the direction of the identified signal or one or more objects. Generating a signal based on the identified signal can advantageously be beneficial due to increased power efficiency/optimization. For example, instead of transmitting signals in all frequency bands, only signal in a specific frequency or narrow range of frequencies can be transmitted instead, thereby increasing power efficiency and/or signal power to reach father distances.

In various embodiments, there may be other sensors or systems (e.g., and including other RF systems in the area) that can connect to the RF system to provide additional data that can be used to: (1) further train the machine learning model; (2) assist RF system in continuing to track, or begin tracking, an object or signal; and/or (3) generate and transmit, or continue generating and transmitting, a specific signal in the direction of an object, among other functions.

In various embodiments, the RF system may include many other advantageous characteristics, features, functionality, and/or aspects, including, for example, a configurable antenna mount that can be installed without tools and which may enable adjustment of an angle of the directional antennas; a physical modular configuration and materials that efficiently dissipate heat from the components of the system to enable the RF system to operate in high temperature and/or extreme environments; a physical modular configuration that provides physical protection to the components for use in, for example, dirty or extreme environments; and/or electromagnetic interference ("EMI") shielding for components of the RF system; among others described herein.

Further, according to various embodiments, various interactive graphical user interfaces can be provided for allowing various types of users to interact with the systems and methods described herein to, for example, generate, review, and/or modify data captured by or used by one or more RF systems or connected systems.

The interactive and dynamic user interfaces described herein are enabled by innovations in efficient interactions between the user interfaces and underlying systems and components. For example, disclosed herein are improved methods of receiving user inputs, translation and delivery of those inputs to various system components, automatic and dynamic execution of complex processes in response to the input delivery, automatic interaction among various components and processes of the system, and automatic and dynamic updating of the user interfaces. The interactions and presentation of data via the interactive user interfaces described herein may accordingly provide cognitive and ergonomic efficiencies and advantages over previous systems.

Accordingly, in various embodiments, large amounts of data may be automatically and dynamically gathered and analyzed in response to user inputs and configurations, and the analyzed data may be efficiently presented to users. Thus, in some embodiments, the systems, devices, configuration capabilities, graphical user interfaces, and the like described herein are more efficient as compared to previous systems, and/or the like.

Various embodiments of the present disclosure provide improvements to various technologies and technological fields, and practical applications of various technological features and advancements. For example, as described above, some existing systems are limited in various ways, and various embodiments of the present disclosure provide significant improvements over such systems, and practical applications of such improvements. Additionally, various embodiments of the present disclosure are inextricably tied to, and provide practical applications of, computer technology. In particular, various embodiments rely on specialized hardware installed in specific locations as well as software components to improve energy and processing efficiency. Such features and others are intimately tied to, and enabled by, computer technology, artificial intelligence, and digital signal technology and would not exist except for computer technology, artificial intelligence, and digital signal technology. For example, the RF system, processing module, RF module, and signal detection, generation, and transmission functionality and interactions with detected objects/signals described herein in reference to various embodiments cannot reasonably be performed by humans alone, without the computer and technology upon which they are implemented. Further, the implementation of the various embodiments of the present disclosure via computer technology enables many of the advantages described herein, including more efficient interaction with, and analysis of, various types of electronic data, and the like.

Various combinations of the above and below recited features, embodiments, and aspects are also disclosed and contemplated by the present disclosure.

Additional embodiments of the disclosure are described below in reference to the appended claims, which may serve as an additional summary of the disclosure.

In various embodiments, systems and/or computer systems are disclosed that comprise a computer-readable storage medium having program instructions embodied therewith, and one or more processors configured to execute the program instructions to cause the systems and/or computer systems to perform operations comprising one or more aspects of the above- and/or below-described embodiments (including one or more aspects of the appended claims).

In various embodiments, computer-implemented methods are disclosed in which, by one or more processors executing program instructions, one or more aspects of the above- and/or below-described embodiments (including one or more aspects of the appended claims) are implemented and/or performed.

In various embodiments, computer program products comprising a computer-readable storage medium are disclosed, wherein the computer-readable storage medium has program instructions embodied therewith, the program instructions executable by one or more processors to cause the one or more processors to perform operations comprising one or more aspects of the above- and/or below-described embodiments (including one or more aspects of the appended claims).

BRIEF DESCRIPTION OF THE DRAWINGS

The following drawings and the associated descriptions are provided to illustrate embodiments of the present disclosure and do not limit the scope of the claims. Aspects and many of the attendant advantages of this disclosure will become more readily appreciated as the same become better understood by reference to the following detailed description, when taken in conjunction with the accompanying drawings, wherein:

FIGS. 9A-9D are flowcharts illustrating example flows or methods of assembly, operation, functionality, and/or the like, of an RF system, according to various embodiments of the present disclosure;

DETAILED DESCRIPTION

Figure 1A:
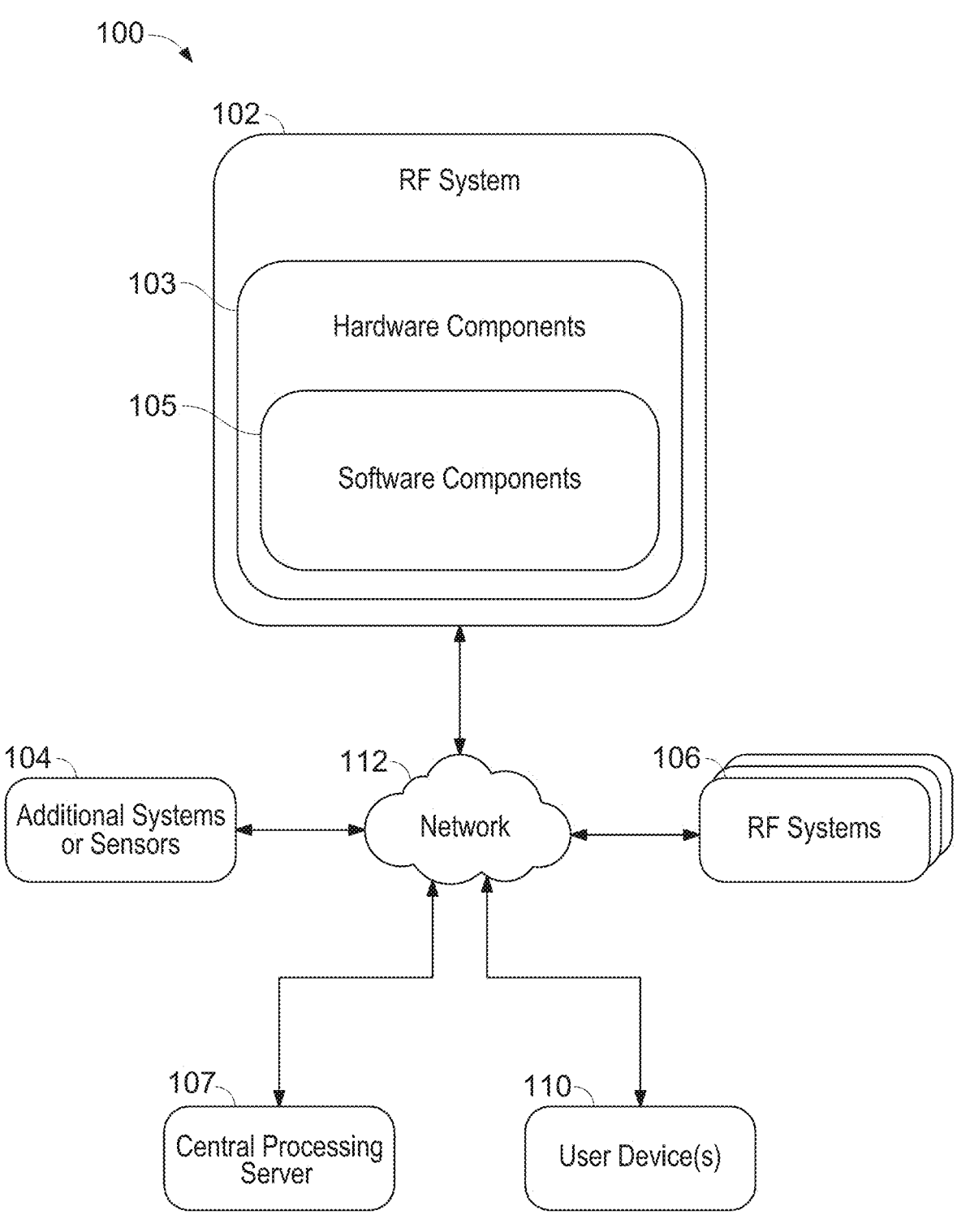
FIG. 1A illustrates a block diagram of an example operating environment in which one or more aspects of the present disclosure may operate, according to various embodiments of the present disclosure.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

I. Overview

As mentioned above, to monitor a surrounding area, a plurality of specialized equipment can be installed to identify objects, track objects, and transmit signals towards objects. Conventional equipment, and its associated software components, if any, is typically manufactured and/or programmed for one function or purpose only and may be limited to such preconfigured functions. These conventional systems may not be adjusted easily, and in some case, they cannot be adjusted at all. For example, if the systems can monitor over a particular RF range, the system may not be easily updated to monitor additional RF ranges without significant expense or effort (e.g., new hardware, rewriting of software, and/or the like). Such systems also may not be moved around or installed in new locations or orientations without testing, calibration, new hardware, and the like. Further, such systems may make use of omni directional antennas that radiates in, or receives from, many directions simultaneously, which may eliminate the opportunity to target signal transmission in particular directions, and may have high power requirements.

As also mentioned above, the systems, methods, and devices of the present disclosure (generally collectively referred to herein as the "RF system") may overcome one or more of these disadvantages, and may include a modular, adaptable, and movable system that can be updated and/or reprogrammed to execute multiple or different purposes and functions. The RF system may advantageously include the capability of being updated over time for new purposes not currently considered at the time of manufacturing or installation. The systems, methods, and devices described herein pertain to hardware and software components related to one or more modular, adaptable, and movable systems that can be reprogrammed to execute multiple purposes and functions at once or over time.

Hardware components of the described radio frequency ("RF") system can include one or more directional broad-bandwidth antennas, one or more module enclosures, one or more processing modules, and one or more RF modules, among other hardware components described in more detail below. With respect to directionality, the one or more directional antennas can be physically positioned and configured to transmit or receive at varying power levels and frequencies in one or more specific directions, such that the antennas can collectively provide greater directionality and sensitivity in certain direction(s) than in other directions. Directional antennas can provide increased performance over dipole antennas, or omnidirectional antennas, when greater concentration of radiation in a certain direction is desired. Additionally, such directional broad-bandwidth antennas can be used to transmit, receive, or transmit and receive radio signals with a wide frequency spectrum. In various embodiments, the antennas can be configured to transmit and/or receive radio signals in a subset of the wide frequency spectrum. For example, there may be nearby equipment that emits signals in a particular frequency range where an antenna is facing and the system can be programmed to filter received signals (e.g., with software) so as to not interfere with analysis of received signals and/or filter transmitted signals (e.g., with software or additional digital signal filtering equipment) so as to minimize or remove interference with the operation of the nearby equipment.

Accordingly, the RF system may selectively transmit signals of varying powers via the various direction antennas.

Hardware components of the described systems can also include a direction finder, also referred to herein as a radio direction finder or direction finding antenna. The direction finder can use reception of radio waves to determine the direction in which an object is located. In various embodiments, by combining the direction information from multiple sources (e.g., other direction finders in the area, other systems, or one or more of the directional broad-bandwidth antennas, and/or the like), the source of a transmission may be located (e.g., via triangulation or other similar means). The direction finder can be used to detect any radio source. The direction finder may communicate with one or more (or all) of the processing modules of the RF system in any given configuration.

In various embodiments, each directional antenna and its associated electronic circuitry can operate independently as well as in a coordinated way with the other directional antennas. For example, a single directional antenna can be configured to face and monitor a 90° field of view, and four of the described directional antennas can be configured to monitor a full 360° (or approximately 360°) field of view. In various embodiments, there can be additional antennas used (e.g., 5 antennas each covering 72°, 6 antennas each covering 60°, 7 antennas each covering about 52°, and/or the like), fewer antennas used (e.g., 1 antenna each covering 360°, 2 antennas each covering 180°, 3 antennas each covering 120°), and/or some fields of view can overlap as well (e.g., 4 antennas with each antenna covering 120°, or the like). The antennas can also be configured to comprise automated or manual adjustability with respect to a vertical angle so that the antenna can face more downwards towards the ground or be adjusted to face more upwards towards the sky. In some applications, there may be an optimum angle that the antenna can adjust to based on empirical data or artificial intelligence/machine learning.

In various embodiments, the directional broad-bandwidth antennas and their associated electronic circuitry can comprise multiple physical configurations. For example, the antennas and associated electronic circuitry can be configured to be detachable and/or stackable so that multiple antennas can be used in one specified location. For example, there might be two antennas at one location, where each antenna is configured to monitor a 90° field of view, for a total field of view of 180° being monitored by the two antennas.

The RF system can advantageously be modular to enable multiple configurations for various applications. The modularity of the RF system can be found in both the modularity of a particular RF system that can operate on its own (including in coordination with one or more additional systems or sensors), and multiple RF systems that can operated in coordination with one another (including in coordination with one or more additional systems or sensors). For example, the RF system can be implemented with one module enclosure, two module enclosures, or more module enclosures. In the example of two or more module enclosures, the module enclosures of the RF system may be joined together by one or more joining enclosures. Accordingly, in an implementation the RF system may include two stacked module enclosures, joined together by a joining enclosure. In the various implementations, the RF system may also include an upper enclosure and a lower enclosure, and may further include components for mounting the RF system, such as one or more mounts, clips, slides, pins, and/or the like. Advantageously, the RF system, given its modularity, may be appropriately configured for a given application, and mounted on a tripod, a vehicle, a building, and/or the like.

Each of the module enclosures may house one or more processing modules, one or more RF modules, and one or more power supply modules, as described herein. In various implementations, the processing modules may comprise system-on-module ("SOM") aspects, and may thus be referred to herein as "SOM modules". Each of the module enclosures, and associated processing module(s), RF module(s), and power supply module(s) may support one or more directional antennas and/or a direction finder, as described herein.

In an implementation, each of the module enclosures includes a single processing module/SOM module, two RF modules, and a power supply module. In this implementation, each of the RF modules supports a single directional antenna (and thus the module enclosure supports up to two directional antennas), the processing module/SOM module supports the two RF modules, and the power supply module provides power to the processing module/SOM module and the two RF modules. Accordingly, in a configuration in which the RF system includes one module enclosure, the RF system can support up to two directional antennas, and in a configuration in which the RF system includes two module enclosures, the RF system can support up to four directional antennas. Additionally, in any of these configurations the RF system can additionally support one or more direction finders via one or more components of the module enclosures (e.g., the processing module/SOM module, the RF module(s), and/or the power supply module).

As noted above, each module enclosure of the RF system can include processing modules and RF modules that include electronic circuitry that can be configured to connect to and operate 1, 2, 3, 4, or more individual directional broad-bandwidth antennas. For example, each processing module can comprise one or more motherboards, one or more processors, one or more graphics processing units ("GPUs"), one or more software-defined radio ("SDR") transceivers, and/or the like, and can be configured to control and operate one or more directional antennas. In various embodiments, a single module enclosure can be connected to two directional broad-bandwidth antennas, where the antennas can be placed at a single location, or the antennas can be placed a distance apart from each other (e.g., 5, 10, 100 feet apart) and connected to the same module enclosure.

In various embodiments, an RF system can be manufactured or assembled with a module enclosure (among other hardware components as described herein) and one or more antennas that can be configured to have a compact, movable, and/or adaptable design. Additionally, in various embodiments, the RF system can be manufactured into a compact and/or lightweight design so that the RF system can be placed in a variety of positions and locations. For example, in an implementation, the RF system may have a total height (e.g., length) of between about 20 cm and about 250 cm, and may have a total weight of between about 10 kg and about 100 kg. Additionally, the directional broad-bandwidth antennas can be disconnected from the module enclosure of the RF system and swapped with different types of antennas that might provide different functionality (e.g., wider or narrower field of view such as omnidirectional, longer range sensitivity, shorter range sensitivity, and the like) and/or different physical attributes for improved mobility or adaptability depending on the application (e.g., reduced or increased size, different shape, and the like). For example, if the RF system is going to be moved from the roof of a building onto a vehicle, there may be the need to use one or more different antennas that are configured to be secured safely to the vehicle while the vehicle is in operation, and satisfy the new requirements associated with the placement at the same time. Such requirements might include being able to monitor a wider field of view than the prior position of being placed on the side of a building, and the wider field of view can be achieved with additional antennas and/or different antennas that are configured differently.

The RF system can also advantageously include a physical modular configuration and materials that efficiently dissipate heat from the components of the system to enable the RF system to operate in high temperature and/or extreme environments. For example, the upper and lower enclosures can include fans, and the upper and lower enclosures, the module enclosure(s), and the joining enclosures, if applicable, together can provide a cavity or channel for air to flow through the RF system to cool the various components of the RF system. The module enclosures can, for example, include heat sinks within the cavity or channel, and thermally coupled to the processing modules, the RF modules, and power supply modules, over which air may flow as pushed or pulled by the fans to cool the components of the RF system. The fans may cause air to flow up from the lower enclosure, through the heat sinks of one or more module enclosures, and out through the upper enclosure.

The RF system can also advantageously include a physical modular configuration that provides physical protection to the components for use in, for example, dirty or extreme environments. For example, each of the module enclosures can include cavities into which the processing module(s), the RF module(s), and the power supply module(s) can be placed. The cavities can be sealed or hermetically sealed from the outside environment. The module enclosures and the upper, lower, and joining enclosures can also include additional cavities for routing of connections and wiring among the various components. These additional cavities can also be sealed or hermetically sealed from the outside environment. These various cavities can also advantageously provide shielding from electromagnetic interference ("EMI") for the various components of the RF system. EMI shielding can be provided, for example, by constructing the cavities of metal and/or other EM shielding materials or components. Additionally, the upper and lower enclosures can include vents, grates, filters, or the like to prevent intrusion of sand or other debris into the cavity or channel of the RF system through which air can flow.

In various embodiments, the RF system, including the various components such as the module enclosures, the upper and lower enclosures, the processing modules, the RF modules, and power supply modules, and/or the antennas can be manufactured to account for and tolerate high temperature and/or extreme environments. For example, specific materials, such as metals, can be used to dissipate heat more quickly. Additionally, for example, each of the processing modules, the RF modules, and power supply modules can include individual housings that can provide additional environmental protection, shock protection, and thermal conductivity for the internal components (e.g., to provide thermal conductivity and heat dissipation to the outside of the individual components). Accordingly, the RF system can advantageously provide shielding of sensitive components from weather, sunlight (e.g., heat), and other external threats that might damage or reduce the efficiency of the equipment (e.g., processor throttling due to high temperatures).

In various embodiments, the RF modules can include power amplifier technology. For example, the RF modules can include a radio frequency ("RF") power amplifier as an electronic amplifier that converts a low-power radio-frequency signal into a higher power signal. The RF modules can also include digital and/or analog filter technology. For example, a digital filter (e.g., in signal processing) can perform mathematical operations on a sampled, discrete-time signal to reduce or enhance certain aspects of that signal. The RF modules can also include multiplexers to provide for receiving and transmitting via the directional antennas.

In various embodiments, the RF system, e.g., the processing modules, can also include positioning, navigation, and timing ("PNT") capabilities. Such PNT capabilities may be provided by one or more PNT components that may include, for example, global navigation satellite system capabilities (e.g., global positioning system ("GPS") capabilities), among other PNT functions. The one or more PNT components may further provide orientation information, altitude information, angle/tilt information, and/or the like. In some implementations, the PNT capabilities may be provided in and/or by the direction finder, in whole or in part. The PNT capabilities of the RF system may be provided by one or more PNT components, and/or the like. The PNT capabilities may also be referred to herein as "positioning capabilities", and the one or more PNT components may also be referred to herein as "positioning components", and/or the like. The PNT capabilities of the RF system may be used, for example, in object location determinations and/or tracking, as described herein, because such functionality may be dependent on the position, orientation, tilt, and/or the like, of the RF system (e.g., such that the correct directional antenna, with the correct orientation and tilt, may be used to detect or target an object).

In various embodiments, the processing modules can include a machine learning component that can be used to assist the RF system in detecting and/or identifying one or more RF signals captured by a connected antenna. For example, the machine learning component can implement machine learning ("ML") algorithms, artificial intelligence ("AI") algorithms, ML models, other programmed algorithms, and/or the like (generally collectively referred to herein as "AI/ML algorithms", "AI/ML models", or simply as "ML algorithms", "ML models", and/or the like) that may, for example, implement models that are executed by one or more processors. Having an AI/ML model to identify RF signals can advantageously provide significant improvements as compared to conventional systems because many detected signals may include some level of interference, be relatively weak and hard to detect, or otherwise hard to identify due to other factors. In various embodiments, the machine learning component can use one or more machine learning algorithms to implement one or more models or parameter functions for the detections/identifications. The machine learning component can be configured to apply a model that can help detect which types of RF signals (e.g., a range of RF signals, particular frequencies or combinations of frequencies, and/or the like) indicate which types of objects.

In various embodiments, a machine learning model of the RF system can be programmed or trained by: (1) sampling raw signals (e.g., captured from one or more connected antennas), (2) signal annotation (e.g., frequency, time, and intensity), (3) signal filtering, and (4) model training. The trained model can then be applied, by the RF system, to received or captured RF signals for identification purposes.

For example, in various embodiments, application of the trained machine learning model can comprise: (1) raw signal sampling, (2) application of trained model, and/or (3) output of classes and probabilities (e.g., associated with type of objects). Then, for example, the processing module can identify a captured RF signal and/or a type of object based on the (3) output of classes and probabilities. Also, in various embodiments, application of the trained machine learning model can comprise the preliminary step of (0) filtering base line signal and/or friendly signals.

In various embodiments, sampling raw signals or raw signal (e.g., RF) data can include any form of data sampling. Data sampling, for example, can include a statistical analysis technique used to select, manipulate, and analyze a representative subset of data points to identify patterns and trends in the larger data set being examined. It can enable working with a small, manageable amount of data that may be representative of a larger, unmanageable amount of data. Sampling can advantageously enable analysis of data sets that are too large to efficiently analyze in full or within a desired amount of time. In various embodiments, the RF system may sample the raw signal for some period of time (e.g., some number of milliseconds, such as 1 ms, 2 ms, 3 ms, 5 ms, 10 ms, 50 ms, or some other period of time). In various embodiments, other, or additional, sampling methods may be employed.

In various embodiments, the RF system (e.g., via one or more processing modules and/or one or more RF modules) can use identified types of objects (e.g., output from the applied machine learning model) to generate one or more new signals and, using one or more of the directional antennas, transmit the new signals. The new signals may be transmitted in the direction of the identified signal or one or more objects. Accordingly, the RF system may selectively transmit signals of varying powers via the various direction antennas. In various embodiments, the identified signal corresponds to one or more mobile objects (e.g., vehicle, boat, aircraft, drone, and/or the like), and the transmitted signals may affect communications in the vicinity of the mobile object during transmission. In various embodiments, detections or identification of objects, or identification of signals corresponding to objects, can be received from one or more other systems or sensors. Generating a signal based on the identified signal can advantageously be beneficial due to increased power efficiency/optimization. For example, instead of transmitting signals in all frequency bands, only signal in a specific frequency or narrow range of frequencies can be transmitted instead, thereby increasing power efficiency and/or signal power to reach father distances. In various embodiments, the transmitted signal can be further filtered to limit interference of sensitive friendly systems in the area.

In various embodiments, the RF system can track an identified signal or object (e.g., while the RF system is transmitting or not). In various embodiments, the direction finder can provide more accurate tracking as well. For example, the direction finder in conjunction with the one or more antennas can identify a direction where a detected signal is emanating from (e.g., while the antennas are transmitting or not).

In various embodiments, there may be other sensors or systems (e.g., and including other RF systems in the area) that can connect to the RF system to provide additional data that can be used to: (1) improve the detections performed by the RF system using the machine learning models; (2) assist RF system in continuing to track, or begin tracking, an object or signal; and/or (3) generate and transmit, or continue generating and transmitting, a specific signal in the direction of an object, among other functions.

In various embodiments, each RF system may include software, including the machine learning models or component, that can be updated over-the-air ("OTA") or via electrical hardwire connection. For example, the RF system may connect to the central processing server to receive updates. As another example, if multiple RF systems are installed in an area it may be beneficial for the RF systems to connect and update each other's machine learning models (e.g., by sending the updated models, or relevant data captured so that each RF system can train based on the additional data) over time so that each RF system has the most up-to-date data or model available. In various embodiments, although RF systems may be in the same area, it might be beneficial to only share portions of data or machine learning models between the RF systems since there might be subtle differences between each RF systems field of view that might result in one model being better suited for a first environment/area than another model that is better suited in a second environment/area.

In various embodiments, a series of one or more RF systems can be placed in an area. For example, a first RF system can be placed on the northeast corner of a building with one antenna facing north and another facing east. Also, a second RF system can be placed on the southwest corner of the same building with one antenna facing south and the other facing west. Accordingly, the four antennas connected to the two RF systems (and/or additional RF systems and associated antennas) can monitor a 360° area (or approximately a 360° area) surrounding the building, and at the same time omitting any signal detection coming from the building itself. As a consequence of the orientation, while any of the antennas are transmitting signals, the transmission can be away from the building so that the building and any equipment or personnel in the building are not impacted or affected by any transmissions. The orientation and the signal filtering described herein can further limit interference of friendly areas and equipment in an improved manner.

Further, according to various embodiments, various interactive graphical user interfaces can be provided for allowing various types of users to interact with the systems and methods described herein to, for example, generate, review, and/or modify data captured by or used by one or more RF systems or connected systems.

The interactive and dynamic user interfaces described herein are enabled by innovations in efficient interactions between the user interfaces and underlying systems and components. For example, disclosed herein are improved methods of receiving user inputs, translation and delivery of those inputs to various system components, automatic and dynamic execution of complex processes in response to the input delivery, automatic interaction among various components and processes of the system, and automatic and dynamic updating of the user interfaces. The interactions and presentation of data via the interactive user interfaces described herein may accordingly provide cognitive and ergonomic efficiencies and advantages over previous systems.

Accordingly, in various embodiments, large amounts of data may be automatically and dynamically gathered and analyzed in response to user inputs and configurations, and the analyzed data may be efficiently presented to users. Thus, in some embodiments, the systems, devices, configuration capabilities, graphical user interfaces, and the like described herein are more efficient as compared to previous systems, and/or the like.

Various embodiments of the present disclosure provide improvements to various technologies and technological fields, and practical applications of various technological features and advancements. For example, as described above, some existing systems are limited in various ways, and various embodiments of the present disclosure provide significant improvements over such systems, and practical applications of such improvements. Additionally, various embodiments of the present disclosure are inextricably tied to, and provide practical applications of, computer technology. In particular, various embodiments rely on specialized hardware installed in specific locations as well as software components to improve energy and processing efficiency. Such features and others are intimately tied to, and enabled by, computer technology, artificial intelligence, and digital signal technology and would not exist except for computer technology, artificial intelligence, and digital signal technology. For example, the RF system, processing module, RF module, and signal detection, generation, and transmission functionality and interactions with detected objects/signals described herein in reference to various embodiments cannot reasonably be performed by humans alone, without the computer and technology upon which they are implemented. Further, the implementation of the various embodiments of the present disclosure via computer technology enables many of the advantages described herein, including more efficient interaction with, and analysis of, various types of electronic data, and the like.

Embodiments of the disclosure are described below with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the disclosure. Furthermore, embodiments of the disclosure may include several novel features, no single one of which is solely responsible for its desirable attributes or which is essential to practicing the embodiments of the disclosure herein described.

II. Terms

To facilitate an understanding of the systems and methods discussed herein, a number of terms are defined below. The terms defined below, as well as other terms used herein, should be construed broadly to include the provided definitions, the ordinary and customary meaning of the terms, and/or any other implied meaning for the respective terms. Thus, the definitions below do not limit the meaning of these terms, but only provide example definitions.

User Input (also referred to as "Input"): Any interaction, data, indication, and/or the like, received by a system/device from a user, a representative of a user, an entity associated with a user, and/or any other entity or object. Inputs may include any interactions that are intended to be received and/or stored by the system/device; to cause the system/ device to access and/or store data items; to cause the system to analyze, integrate, and/or otherwise use data items; to cause the system to update to data that is displayed; to cause the system to update a way that data is displayed; to transmit or access data; and/or the like. Non-limiting examples of user inputs include keyboard inputs, mouse inputs, digital pen inputs, voice inputs, finger touch inputs (e.g., via touch sensitive display), gesture inputs (e.g., hand movements, finger movements, arm movements, movements of any other appendage, and/or body movements), and/or the like. Additionally, user inputs to the system may include inputs via tools and/or other objects manipulated by the user. For example, the user may move an object, such as a tool, stylus, or wand, to provide inputs. Further, user inputs may include motion, position, rotation, angle, alignment, orientation, configuration (e.g., fist, hand flat, one finger extended, and/or the like), and/or the like. For example, user inputs may comprise a position, orientation, and/or motion of a hand or other appendage, a body, a 3D mouse, and/or the like.

Data Store: Any computer-readable storage medium and/or device (or collection of data storage mediums and/or devices). Examples of data stores include, but are not limited to, optical disks (e.g., CD-ROM, DVD-ROM, and/or the like), magnetic disks (e.g., hard disks, floppy disks, and/or the like), memory circuits (e.g., solid-state drives, random-access memory (RAM), and/or the like), and/or the like. Another example of a data store is a hosted storage environment that includes a collection of physical data storage devices that may be remotely accessible and may be rapidly provisioned as needed (commonly referred to as "cloud" storage).

Database: Any dataset or data structure (and/or combinations of multiple datasets or data structures) for storing and/or organizing data, including, but not limited to, relational databases (e.g., Oracle databases, PostgreSQL databases, and/or the like), non-relational databases (e.g., NoSQL databases, and/or the like), in-memory databases, spreadsheets, comma separated values (CSV) files, eXtensible markup language (XML) files, TeXT (TXT) files, flat files, spreadsheet files, and/or any other widely used or proprietary format for data storage. Databases are typically stored in one or more data stores. Accordingly, each database referred to herein (e.g., in the description herein and/or the figures of the present application) is to be understood as being stored in one or more data stores. Additionally, although the present disclosure may show or describe data as being stored in combined or separate databases, in various embodiments such data may be combined and/or separated in any appropriate way into one or more databases, one or more tables of one or more databases, and/or the like. As used herein, a data source may refer to a table in a relational database, for example. May also be referred to herein as "dataset" and/or the like.

III. Example Operating Environment

FIG. 1A illustrates a block diagram of an example operating environment 100 in which one or more aspects of the present disclosure may operate, according to various embodiments of the present disclosure. The operating environment 100 may include an RF system 102, optional additional RF systems 106, additional systems or sensors 104, a central processing server 107, and one or more user devices 110. Each RF system 102 (and optional additional RF systems 106) can include various hardware components 103, and software components 105, with can provide various functionality as described further herein.

In various embodiments, communications among the various components of the example operating environment 100 may be accomplished via any suitable device, systems, methods, and/or the like. For example, the RF system 102 and optional additional RF systems 106) may communicate with one another, the additional systems or sensors 104, the central processing server 107, and one or more user devices 110 via any combination of the network 112 or any other wired or wireless communications networks, method (e.g., Bluetooth, WiFi, infrared, cellular, and/or the like), and/or any combination of the foregoing or the like. As further described below, network 112 may comprise, for example, one or more internal or external networks, the Internet, and/or the like.

Further details and examples regarding the implementations, operation, and functionality of the various components of the RF system 102 and the example operating environment 100 are described herein in reference to various figures.

a. Network 112

The network 112 may include any wired network, wireless network, or combination thereof. For example, the network 112 may be a personal area network, local area network, wide area network, over-the-air broadcast network (e.g., for radio or television), cable network, satellite network, cellular telephone network, or combination thereof. As a further example, the network 112 may be a publicly accessible network of linked networks, possibly operated by various distinct parties, such as the Internet. In various embodiments, the network 112 may be a private or semi-private network, such as a corporate or university intranet. The network 112 may include one or more wireless networks, such as a Global System for Mobile Communications (GSM) network, a Code Division Multiple Access (CDMA) network, a Long Term Evolution (LTE) network, C-band, mmWave, sub-6 GHz, or any other type of wireless network. The network 112 can use protocols and components for communicating via the Internet or any of the other aforementioned types of networks. For example, the protocols used by the network 112 may include Hypertext Transfer Protocol (HTTP), HTTP Secure (HTTPS), Message Queue Telemetry Transport (MQTT), Constrained Application Protocol (CoAP), and the like. Protocols and components for communicating via the Internet or any of the other aforementioned types of communication networks are well known to those skilled in the art and, thus, are not described in more detail herein.

In various embodiments, the network 112 can represent a network that may be local to a particular organization, e.g., a private or semi-private network, such as a corporate or university intranet. In some implementations, devices (e.g., RF system 102, RF systems 106, additional systems or sensors 104, central processing server 107, device(s) 110, and/or the like) may communicate via the network 112 without traversing an external network, such as the Internet. In some implementations, devices connected via the network 112 may be walled off from accessing the Internet, e.g., the network 112 may be not be connected to the Internet. Accordingly, e.g., the user device(s) 110 may communicate with the RF system 102, RF systems 106, or additional systems or sensors 104 directly (via wired or wireless communications) or via the network 112, without using the Internet. Thus, even if the network 112 or the Internet is down, the RF system 102, RF systems 106, or additional systems or sensors 104 may continue to communicate and function via direct communications (and/or via the network 112).

In various implementations, the network 112 and/or various other aspects of the operating environment 100 may incorporate "mesh" type communications among components, and/or secure communications among components. Examples of such mesh and/or secure communications are described in U.S. Pat. No. 10,506,436, issued Dec. 10, 2019, and titled "Lattice Mesh" (the '436 Patent), the entire disclosure of which is hereby made part of this specification as if set forth fully herein and incorporated by reference for all purposes, for all that it contains. For example, and in some embodiments as described herein, detection and/or identification of object(s), and/or responding to such a detection and/or identification (e.g., by transmitting one or more RF signals) can be performed by one more systems (e.g., RF systems), devices, sensors, or the like. For instance, any devices and/or sensors can communicate with one or more of the RF systems described herein so that any information transmitted between devices can be used, in whole or in part (e.g., in combination with one or more of the RF systems' own detections), to initiate a response (e.g., transmit one or more RF signals).

b. Additional Systems or Sensors 104

The additional systems or sensors 104 may include, for example, various sensors and monitoring equipment. For example, non-limiting examples of additional systems or sensors 104 may include: sensors/monitors (e.g., temperature, positioning/location, PNT, direction finder, altitude, angle/tilt, levels, vibration, power, pressure, and/or the like); video cameras (e.g., video, audio, position, motion, heat, and/or the like); antennas (e.g., long range, short range, and/or the like); radar devices; light detection and ranging ("LIDAR") devices; mobile systems or sensors (e.g., a sensor on a vehicle or an aerial drone); stationary systems or sensors (e.g., a sensor on a tower station); other types of systems or sensors; and/or any combination of the foregoing. Additional examples of systems or sensors 104 that may be included in the operating environment 100, and which may provide information to, or receive information from, RF systems 102, 106, as described herein, are described in U.S. Patent Application Publication No. 2020/0167059, filed Nov. 27, 2018, and titled "Interactive Virtual Interface" (the '059 Publication), and in U.S. Patent Application Publication No. 2020/0363824, filed May 17, 2019, and titled "Counter Drone System" (the '824 Publication), the entire disclosures of each of which are hereby made part of this specification as if set forth fully herein and incorporated by reference for all purposes, for all that it contains.

As described herein, RF system 102 may communicate with, provide information to, or receive information from, additional systems or sensors 104. Similarly, RF system 102 may communicate with, provide information to, or receive information from, one or more RF systems 106. Similarly, RF systems 106 may communicate with, provide information to, or receive information from, additional systems or sensors 104. In various embodiments, communications among the various components of the operating environment 100 may be accomplished via intermediate communications with a centralized server or database (e.g., central processing server 107), which may store data associated with the additional systems or sensors 104. Alternatively, additional systems or sensors 104 may be communicated with and/or configured via communication with user device(s) 110. Data and information gathered from the additional systems or sensors 104 may be provided directly or indirectly to the RF system 102.

In various implementations, one or more of, or a combination of, the RF system 102, RF systems 106, and/or the user device(s) 110 may provide an application programming interface ("API") by which communications may be accomplished with the additional systems or sensors 104.

The various communications among the components of the operating environment 100 may, as described herein, be used to determine locations of objects (which may include mobile objects) via various methods. Examples of such communications and methods of determining locations of objects are provided in, for example, the '059 Publication and the '824 Publication.

c. Central Processing Server

The central processing server 107 may include, for example, one or more computing systems connected (e.g., via network 112) to the RF systems (e.g., 102 and 106), additional systems or sensors 104, and/or user device(s) 110. For example, data and information gathered from the additional systems or sensors 104, the RF system 102, or RF systems 106 may be provided directly or indirectly to the central processing server 107 for storage, analysis, and/or transmission to other connected systems. For example, one RF system 106 might detect/identify a specific signal and/or object, and the RF system 106 can transmit that data to the central processing service 107, which can then transmit an indication of the detected signal to other systems (e.g., RF system 102). For example, in some examples described herein, RF systems (e.g., 102 and 106) can work together in a network to detect signals around a designated area or location (e.g., a building) since each RF system includes antennas that only face certain directions. In various embodiments, the central processing server 107 may be communicated with and/or configured via communication with user device(s) 110.

As noted above, the various components of the operating environment 100 may, as described herein, be used to determine locations of objects (which may include mobile objects) via various methods. Examples of such methods of determining locations of objects are provided in, for example, the '059 Publication and the '824 Publication. Accordingly, the central processing server 107 and/or user device(s) 110 of the present disclosure may be analogous, in whole or in part, to the interactive virtual interface system of the '059 Publication in that various sensor data and location determinations may be integrated together. Such location information may further be shared among the various components of the operating environment 100, e.g., the RF systems 102, 106, to enable coordination among the components for transmitting generated signals to located objects (which may include mobile objects). Further, as noted above, communications among the various components of the operating environment 100 may be provided via various methods, some examples of which are described in the '436 Patent.

Figure 3:
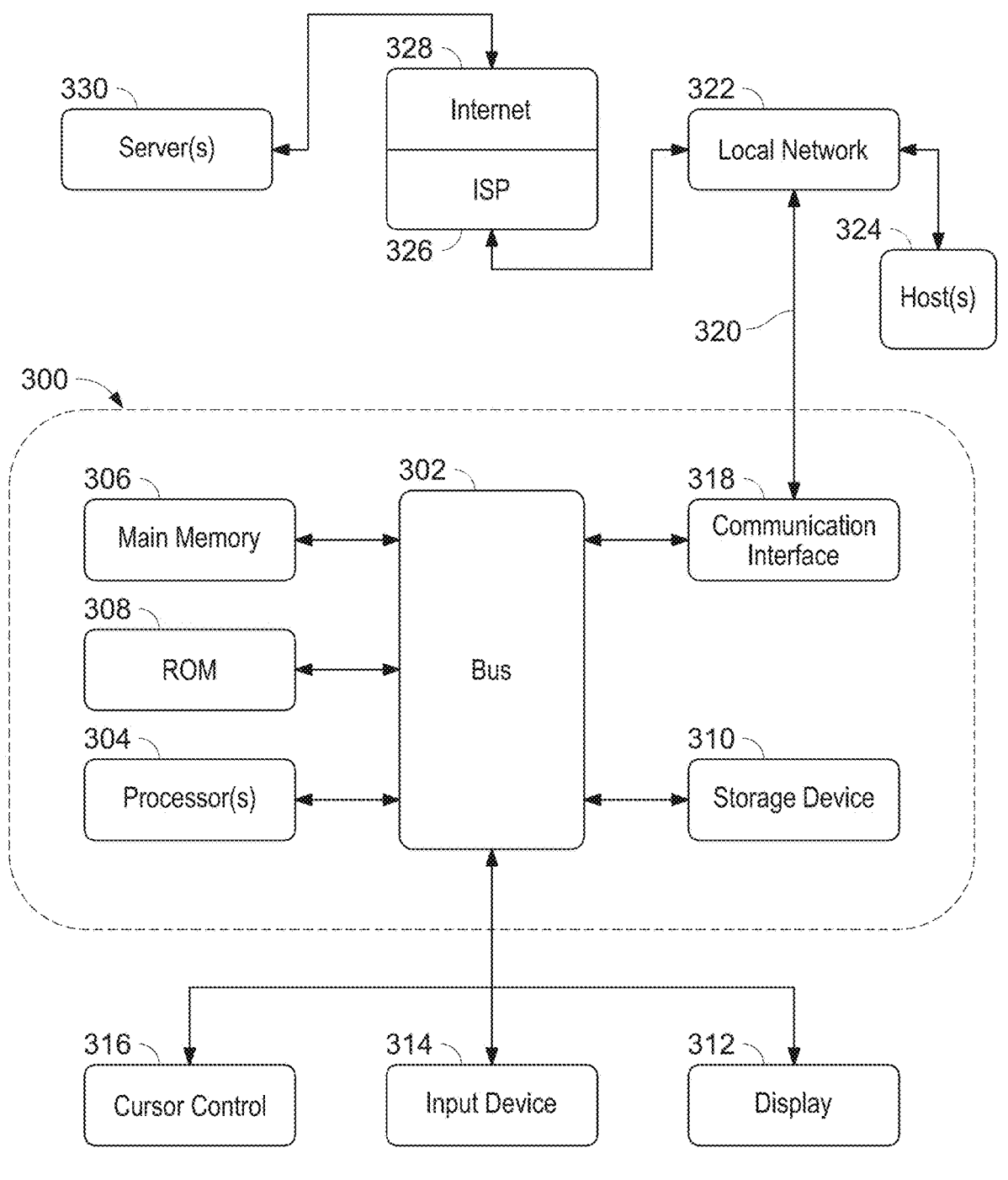
FIG. 3 shows a block diagram illustrating example computer system components by which various aspects of the present disclosure may be implemented.

In various embodiments, the central processing server 107 can comprise hardware similar to that of the computer system described herein in reference to FIG. 3. Alternatively, in various embodiments, the central processing server 107 can exist via software thereby linking a number of RF systems and any other optional additional systems or sensors together so that the systems or sensors can share information among themselves (in such implementations, the various collective components of the RF systems may provide similar functionality to that of the computer system described in reference to FIG. 3). In various embodiments, the central processing server 107 can create a mesh network, an example of which is described in the '436 Patent (as noted above). For example, the central processing server 107 can comprise an interface and a processor. The interface can be configured to receive a request to register from a host, wherein the request to register includes a key and a set of asset identifications ("IDs") that the host wishes to claim. The processor can be configured to sign the key to generate a resource authority ("RA") certificate signed key with an RA certificate; update an asset database with the RA certificate signed key; distribute the RA certificate signed host public key through the network; and provide the host with the RA certificate signed key. In various embodiments, the server can further comprise a memory that is coupled to the processor and configured to provide the processor with instructions. The system for a mesh network can include a secure mechanism for communication between nodes (e.g., RF system 102, RF system 106, additional systems or sensors 104, user device 110, and/or the like) that is enabled for messages that have a targeted destination both in a point-to-point mode and a publication mechanism where a message can be targeted at multiple destinations. The security for the communications can be designed to prevent compromised nodes from being used to acquire significant message traffic from the network once the node is compromised. In addition, the network can prioritize real-time data despite variable performance of network links. The network can also ensure security by establishing secure routing using point to point authorizations. The network can also strategically cache data flowing in the network so that when channels are available data can be sent. The mesh network can be an improvement over other networks by improved security. The network can be designed to overcome unstable communication links and the potential for nodes becoming compromised. The mesh network can overcome potential issues using security systems that secure messages, secure routes, and secure backfilling of messages that wait to be sent through the network.

In various implementations, the central processing server 107 may provide an application programming interface ("API") by which communications may be accomplished with the RF system 102, RF systems 106, user device(s) 110, and/or additional systems or sensors 104. For example, data collected or generated by RF system 102 can be sent to the central processing server 107 to be combined with other data collected (e.g., from RF system 106 and/or additional systems or sensors 104) and stored for later transmission to any system on the network 112 or outside of the network 112 (e.g., via the internet using an API). In various embodiments, the central processing server 107 can also implement some or all of the machine learning and/or data or signal processing that the RF systems (e.g., 102 and 106) perform, for example.

d. Example User Device(s)

The user device(s) 110 may comprise computing devices that provide a means for a user or admin to interact with a device (e.g., RF system 102, RF systems 106, additional systems or sensors 104, or central processing server 107). User devices 110 may comprise user interfaces or dashboards that connect a user with a machine, system, or device, commonly used in industrial processes. In various implementations, user device(s) 110 comprise computer devices with a display and a mechanism for user input (e.g., mouse, keyboard, voice recognition, touch screen, and/or the like). In various implementations, the user device(s) 110 comprise tablet computing devices, laptop computing devices, or smart phones.

As noted above, the user device(s) 110 may communicate with the RF system 102, RF systems 106, additional systems or sensors 104, and/or central processing server 107 via direct (e.g., not via a network) wired and/or wireless communications, and/or via a network (e.g., a local network) wired and/or wireless communications. Advantageously, according to various embodiments, a user may configure an interactive user interface layout, and may then push the interactive user interface layout configuration to one or more RF systems 102 and/or 106. In various embodiments, the RF systems 102 and/or 106 may then provide the configured interactive user interface remotely to any user devices 110 connecting to the RF systems 102 and/or 106. Advantageously, such functionality may enable remote and centralized configuration of interactive user interfaces without requiring direct programming or interaction with the RF systems 102 and/or 106 or user device(s) 110. Advantageously, according to various embodiments, because connection interface is provided by the RF systems 102 and/or 106, multiple user devices 110 may simultaneously access and/or communicate with the RF systems 102 and/or 106, and a current configuration/status of the RF systems 102 and/or 106 may be accurately kept synchronized/kept up-to-date from each device and between such devices.

In various implementations, a user may operate the RF system 102 (and/or RF systems 106, among other components of the operating environment 100) via one or more user interfaces accessible via device(s) 110 (and/or other user interfaces of the central processing server 107). Via such user interfaces, the user may review and/or set a configuration or status of the RF system 102, may receive indications from the RF system 102 (and/or central processing server 107, which may provide coordination among various components of the operating environment 100) of an identified object, may provide approval to the RF system 102 (and/or central processing server 107, which may provide coordination among various components of the operating environment 100) to begin transmission to an identified object, may review a battery health of the RF system 102, may access automated logs associated with the RF system 102 (and/or central processing server 107); and/or the like.

In various embodiments, the user devices 110 may comprise relatively streamlined interactive graphical user interfaces. For example, the interactive user devices 110 may comprise relatively few large buttons by which a user may select to stop a currently running configuration, may select a different configuration from a list, may search for a different configuration, and/or may monitor a current status of inputs/outputs, analyses, machine learning models, and/or the like (and as noted above).

Additionally, it has been noted that design of computer user interfaces "that are useable and easily learned by humans is a non-trivial problem for software developers." (Dillon, A. (2003) User Interface Design. MacMillan Encyclopedia of Cognitive Science, Vol. 4, London: MacMillan, 453-458.) The present disclosure describes various embodiments of interactive and dynamic graphical user interfaces that are the result of significant development. This non-trivial development has resulted in the graphical user interfaces described herein which may provide significant cognitive and ergonomic efficiencies and advantages over previous systems. The interactive and dynamic graphical user interfaces include improved human-computer interactions that may provide reduced mental workloads, improved decision-making, improved capabilities, reduced work stress, and/or the like, for a user. For example, user interaction with the interactive graphical user interface via the inputs described herein may provide an optimized display of, and interaction with, video gateway devices or controller devices, and may enable a user to more quickly and accurately access, navigate, assess, and digest analyses, configurations, received/operational data, and/or the like, than previous systems.

Further, the interactive and dynamic graphical user interfaces described herein are enabled by innovations in efficient interactions between the user interfaces and underlying systems and components. For example, disclosed herein are improved methods of receiving user inputs (including methods of interacting with, and selecting, received data), translation and delivery of those inputs to various system components (e.g., RF systems 102 and/or 106), automatic and dynamic execution of complex processes in response to the input delivery (e.g., execution of configurations on RF systems 102 and/or 106), automatic interaction among various components and processes of the system, and automatic and dynamic updating of the user interfaces (to, for example, display the information related to RF systems 102 and/or 106). The interactions and presentation of data via the interactive graphical user interfaces described herein may accordingly provide cognitive and ergonomic efficiencies and advantages over previous systems.

IV. RF Systems

The RF system 102 can comprise hardware and software components, and can be a modular, adaptable, and movable system including one or more antennas. The RF system 102 can be configured to receive or capture external RF signals from one or more directions (e.g., the direction(s) the antennas are facing in conjunction with the configured field of view angle), determine one or more RF signals to transmit based on the received RF signals (e.g., by applying one or more machine learning models and determining a type of object), and generate and transmit the determined one or more RF signals in particular directions and with particular powers, among other functionality as described in more detail herein.

In various implementations, in addition to RF system 102, one or more additional RF systems 106 can be provided (e.g., as illustrated in the example operating environment 100 of FIG. 1A). Each of the RF systems 106 may generally include similar configurations and functionality as the RF system 102. For example, each of the RF system 102 and RF systems 106 may include similar hardware components and software components and functionality. Each of the RF systems may also differ in various ways, for example, each may include one or more module enclosures, and one or more directional antennas, among other features. The description herein provides details of the implementation of RF system 102, but each of RF systems 106 may be similarly implemented.

Although the RF system 102 is shown separately from RF systems 106, in some embodiments, each RF system shown can have functionality that is unique to itself (e.g., based on location/placement, particularities of its trained data model that may be the same or different than other RF systems, different hardware or software, different ranges of frequencies to monitor due to a configured blacklist or whitelist, or other features) or shared functionality among all RF systems (e.g., a shared machine learning model, shared data inputs, shared blacklist of whitelist, or other features). So, in some embodiments, functionality of the RF systems can reside on one device or multiple devices. For example, processing of data signals received by one RF system 102 can be performed by the RF system 102 or a combination of the RF system 102 and other RF systems 106. In some embodiments, RF system 102 can perform functions unique to the RF system 102, and RF system 106 can perform functions unique to the RF system 106. In some embodiments, a combination of features might be available to all RF systems, some features unique to each RF system and some features that can be shared. In some applications, there may only be one RF system used and thus all available features or functionality for the single RF system would reside on the single RF system. In some embodiments, additional systems or sensors 104 can provide additional data or functionality to the RF system(s), as described herein. As described above, coordination among the various components of the operating environment 100 may be direct, and/or via the central processing server 107, among other possible configurations.

In various embodiments, there may be additional RF systems 106 installed in an area associated with or nearby the RF system 102. In various embodiments, the RF systems 102 and 106 can be placed in an area and connected together (e.g., via network 112, or hardwire connection). For example, an RF system 102 can be placed on the northeast corner of a building with one antenna that is connected to RF system 102 facing north and another antenna connected to RF system 102 facing east. Also, RF system 106 can be placed on the southwest corner of the same building with one antenna connected to RF system 106 facing south and the other antenna connected to RF system 106 facing west. Accordingly, the four antennas connected to the two RF systems (and/or additional RF systems and associated antennas) can monitor a 360° area (or approximately a 360° area) surrounding the building, and at the same time omitting any signal detection coming from the building itself. As a consequence of the orientation, while any of the antennas are transmitting signals, the transmission can be away from the building so that the building and any equipment or personnel in the building are not impacted or affected by any transmissions. The orientation and the signal filtering described herein can further limit interference of friendly areas and equipment in an improved manner.

In various embodiments, the RF system can be manufactured into a compact, lightweight, movable, and/or adaptable design such that the RF system can be placed in a variety of positions and locations. For example, in an implementation, the RF system may have a total height (e.g., length) of between about 20 cm and about 180 cm, and may have a total weight of between about 10 kg and about 100 kg. Additionally, the directional broad-bandwidth antennas can be disconnected from the module enclosure of the RF system and swapped with different types of antennas that might provide different functionality (e.g., wider or narrower field of view such as omnidirectional, longer range sensitivity, shorter range sensitivity, and the like) and/or different physical attributes for improved mobility or adaptability depending on the application (e.g., reduced or increased size, different shape, and the like). For example, if the RF system is going to be moved from the roof of a building onto a vehicle, there may be the need to use one or more different antennas that are configured to be secured safely to the vehicle while the vehicle is in operation, and satisfy the new requirements associated with the placement at the same time. Such requirements might include being able to monitor a wider field of view than the prior position of being placed on the side of a building, and the wider field of view can be achieved with additional antennas and/or different antennas that are configured differently.

a. Example Hardware Components of the RF System

Figure 1B:
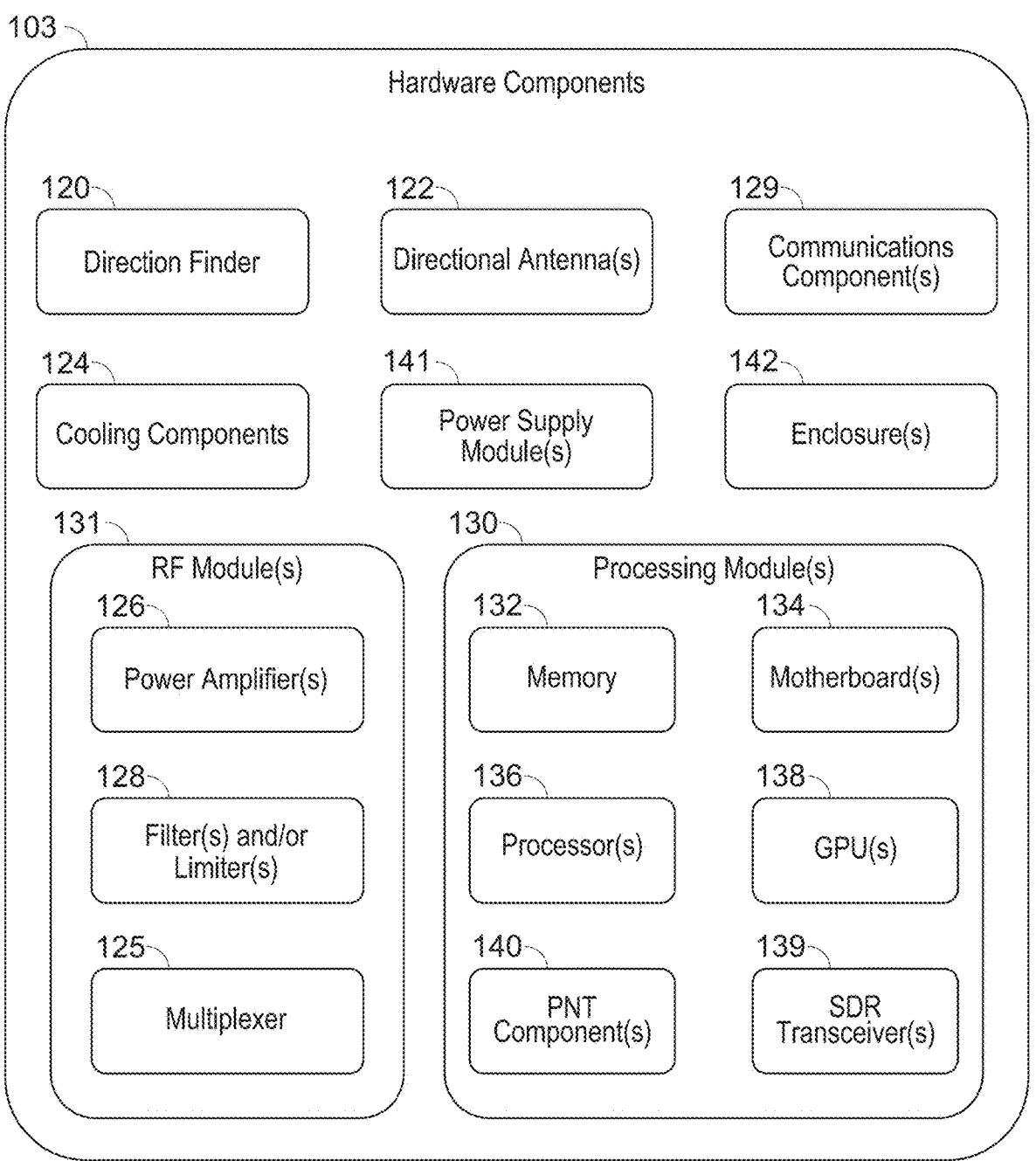
FIG. 1B illustrates a block diagram of example hardware components of an RF system, according to various embodiments of the present disclosure.

FIG. 1B illustrates a block diagram of example hardware components 103 of the RF system 102, according to various embodiments of the present disclosure. In addition to the description below, further details of the hardware components and related functionality are described below in reference to, for example, FIGS. 4A-4D, 5A-5E, 7A-7B, 8, and 9A-9D. The hardware components 103 may include for example, a direction finder 120, one or more directional antennas 122, communication components 129, cooling components 124, one or more power supply modules 141, one or more enclosure components 142, one or more RF modules 131, and one or more processing modules 130. Software components 105 of the RF module 102 may be implemented on various components of the RF system 102, but, according to various implementations, primarily on the one or more processing modules 130, as described herein.

As noted above, the RF system 102 can advantageously be modular to enable multiple configurations for various applications. The modularity of the RF system can be found in both the modularity of a particular individual RF system that can operate on its own (including in coordination with one or more additional systems or sensors), and multiple RF systems that can operated in coordination with one another (including in coordination with one or more additional systems or sensors). The modularity of the RF system can be enabled, in part, by the various enclosures 142 of the RF system 102, which may house or provide attachments for the various other hardware components 103.

For example, the RF system 102 can be implemented with one module enclosure, two module enclosures, or more module enclosures. In the example of two or more module enclosures, the module enclosures of the RF system 102 may be joined together by one or more joining enclosures. Accordingly, in an implementation the RF system 102 may include two stacked module enclosures, joined together by a joining enclosure. In the various implementations, the RF system may also include an upper enclosure and a lower enclosure, and may further include components for mounting the RF system, such as one or more mounts, clips, slides, pins, and/or the like. Advantageously, the RF system, given its modularity, may be appropriately configured for a given application, and mounted on a tripod, a vehicle, a building, and/or the like.

Figure 1C:
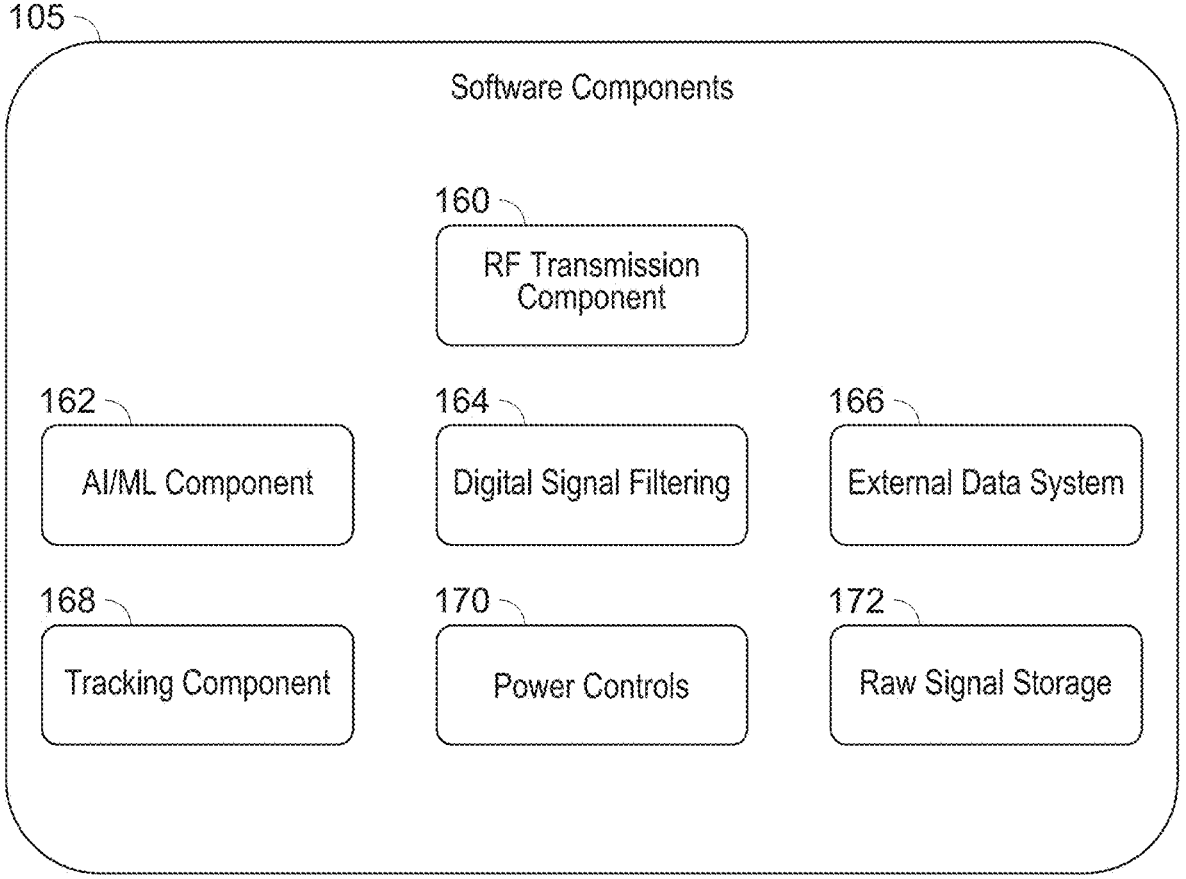
FIG. 1C illustrates a block diagram of example software components of an RF system, according to various embodiments of the present disclosure.
Figure 1D:
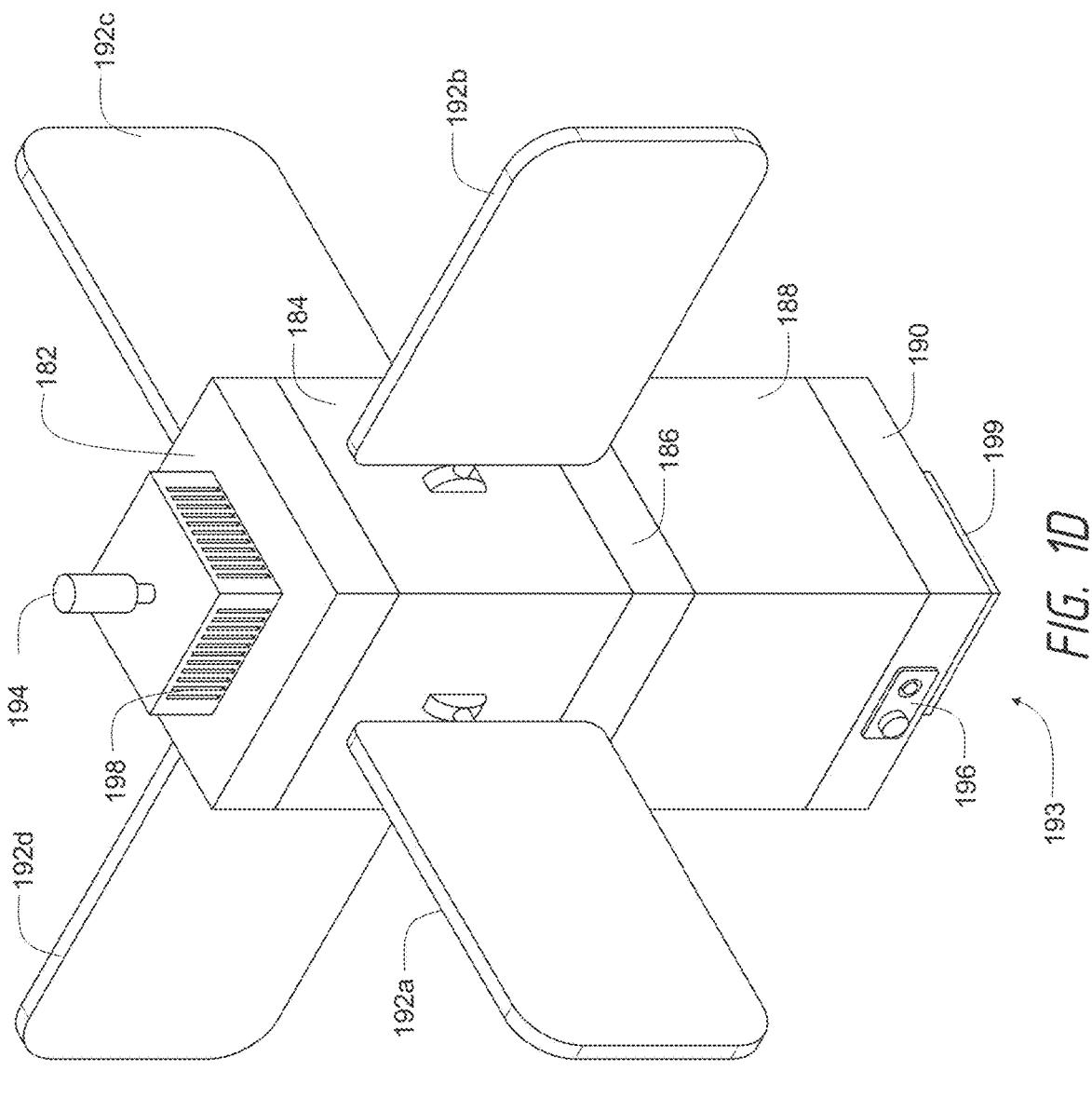
FIG. 1D illustrates a perspective view of an example implementation of an RF system comprising two module enclosures, according to various embodiments of the present disclosure.

FIG. 1D illustrates a perspective view of an example implementation 180 of the RF system 102 comprising two module enclosures and four directional antennas, according to various embodiments of the present disclosure. However, in various implementations that RF may include more or fewer antennas, and may include a single module enclosure or more than two module enclosures. The example implementation 180 of the RF system 102 comprises an upper enclosure 182, a first (e.g., top) module enclosure 184, a joining enclosure 186, a second (e.g., bottom) module enclosure 188, and a lower enclosure 190. The example implementation 180 of the RF system 102 further comprises, directional antennas 192a-192d, a direction finder 194, and one or more control panels 196. While not shown in FIG. 1D, the RF system 102 can also include one or more mounting points or surfaces 193, such as on a bottom surface of the lower enclosure 190, for mounting the RF system 102.

As illustrated in FIG. 1D, the various enclosures of the RF system 102 may be joined together to form a main housing of the RF system 102. As shown, the directional antennas 192a-192d, and the direction finder 194, may be mounted to outside (or exterior) surfaces of the enclosures by one or more coupling points or antenna mounts. Each of the one or more antenna mounts can provide one or more degrees of freedom. Each degree of freedom can reflect an ability of the respective antennas to tilt, rotate, or translate along one or more axes.

The upper enclosure can include one or more air vents 198, and the lower enclosure can include one or more air vents 199. The air vents 198, 199 can enable or promote air flow within the RF system housing, such as within an inner portion or cavity of the RF system 402. Such air flow can be caused by one or more fans, which may be located within the upper and/or lower enclosures, to promote the flow of air from the air vents in the lower enclosure 190, up through an interior portion (also referred to herein as an inner portion) or cavity of the RF system 180, and out through the air vents 198. The interior portion or cavity of the RF system may include one or more heat sinks that may be thermally coupled to one or more modules located within a periphery interior portion of the RF system (e.g., within a housing of the modules enclosures 184, 188, as described herein).

Referring again to FIG. 1B, each of the module enclosures may house one or more processing modules 130, one or more RF modules 131, and one or more power supply modules 141. In various implementations, the processing modules 130 may comprise system-on-module ("SOM") aspects, and may thus be referred to herein as "SOM modules". Each of the module enclosures, and associated processing module(s) 130, RF module(s) 131, and power supply module(s) 141 may support one or more directional antennas 122 (e.g., antennas 192a-192d of FIG. 1D) and/or a direction finder 120 (e.g., direction finder 194 of FIG. 1D). In an implementation, each of the module enclosures includes a single processing module 130, two RF modules 131, and a power supply module 141. In this implementation, each of the RF modules 131 supports a single directional antenna 122 (and thus the module enclosure supports up to two directional antennas 122), the processing module 130 supports the two RF modules 131, and the power supply module 141 provides power to the processing module 130 and the two RF modules 131. Accordingly, in a configuration in which the RF system 102 includes one module enclosure, the RF system 102 can support up to two directional antennas 122, and in a configuration in which the RF system 102 includes two module enclosures, the RF system 102 can support up to four directional antennas 122. In the implementations including two or more module enclosures, the multiple processing modules 130 may communicate with one another directly to provide the functionality described herein, or may communicate with one another via a system management module. Additionally, in any of these configurations the RF system 102 can additionally support one or more direction finders 120 via one or more components of the module enclosures (e.g., the processing module 130, the RF module(s) 131, and/or the power supply module 141).

The RF system 102 can advantageously include a physical modular configuration that provides physical protection to the components for use in, for example, dirty or extreme environments. For example, each of the enclosures 142 can include cavities (which may be included in a periphery of the module enclosures) into which the processing module(s) 130, the RF module(s) 131, and the power supply module(s) 141 can be placed. The cavities can be sealed or hermetically sealed from the outside environment. The enclosures can also include additional cavities for routing of connections and wiring among the various components. These additional cavities can also be sealed or hermetically sealed from the outside environment. These various cavities can also advantageously provide shielding from electromagnetic interference ("EMI") for the various components of the RF system 102. EMI shielding can be provided, for example, by constructing the cavities of metal and/or other EM shielding materials or components. Additionally, the upper and lower enclosures can include vents, grates, filters, or the like to prevent intrusion of sand or other debris into portions of the RF system through which air can flow.

Accordingly, in an implementation, each RF module 131 may comprise its own enclosure housing its related components, each processing module 130 may comprise its own enclosure housing its related components, and each power supply module 141 may comprise its own enclosure housing its related components. Each module's housing may be made of a thermally conductive material, such as metal. Each of these individual enclosures of the various modules may then be placed within the cavities of, for example, the module enclosure(s) of the RF system 102. Additionally, the various electrical components of the RF system 102 can be wired for power and data communication with one another via the various cavities. For example, the processing module 130 can be in wired communication with the RF module(s) 131, and the RF module(s) 131 can be in wired communication with the directional antenna(s) 122 and/or direction finder 120. Such data and power wired communications can be accomplished via routing through the cavities of the enclosures, and via connectors on and through surfaces of the enclosures and outside of the enclosures. In some implementations, one or more of the various components of the RF system 102 can in communication with one another through wireless communications.

In addition to the internal power supply modules 141 described above (which can provide appropriate power to the various other modules and components of the RF system 102), the power supply module(s) 141 may also include an external or internal main power supply module that may provide main power to the RF system 102. Such power may be from a wired main power source or a battery source. In some implementations, the RF system 102 includes an internal battery power source that provides power to the components of the RF system 102 via the power supply module(s) 141.

i. Direction Finder

The direction finder 120 (also referred to herein as a radio direction finder or direction finding antenna) can comprise a radio direction finder ("RDF") or other direction finding device, and can be a device configured to find or otherwise identify a direction, or bearing, to a radio source. The direction finder 120 can include one or more antennas configured to conduct direction finding. Direction finding can include using two or more measurements from different locations. Based on the two or more measurements, the location of an unknown object (e.g., a transmitter, vehicle, drone, and/or the like) or other target can be determined. In various embodiments, by combining the direction information from multiple sources (e.g., other direction finders in the area, other systems or sensors, or one or more of the directional broad-bandwidth antennas, and/or the like), the source of a transmission may be located (e.g., via triangulation or other similar means).

The direction finder 120 can be used to detect any radio source. The size of a receiver antenna of the direction finder 120 can be a function of a wavelength of a receiving signal. For example, longer wavelengths (low frequencies) can include larger antennas. The ability to locate a position of a transmitter can be particularly valuable in various applications, including transmission object location searching and identifying. The direction finder 120 can include one or more phased array antennas to allow more rapid beam forming for more accurate finding. The direction finder 120 can include a sense antenna, a dipole antenna, a parabolic antenna, and/or the like. The direction finder 120 may employ one or more of a phase or a doppler technique. In various embodiments, a plurality of direction finders 120 can obtain direction information from two or more suitably spaced receivers (or a single mobile receiver), the source of a transmission may be located via triangulation.

The direction finder 120 may communicate with one or more (or all) of the processing modules 130 of the RF system 102 in any given configuration. In various embodiments, a plurality of direction finders 120 may be coupled to a common processing unit (e.g., processing module 130). As noted herein, in some implementations, the PNT capabilities (e.g., some or part of the PNT components 14) may be provided in and/or by the direction finder 120, in whole or in part.

ii. Directional Antennas

The one or more directional antennas 122 can be configured to transmit and/or receive radio signals. As noted above, each of the directional antennas 122 may be in electrical/wired communication with an RF module 131, which RF module 131 may provide signal receipt or transmission amplification, among other functionalities. In various embodiments, the directional antennas 122 can be designed to transmit and receive radio waves in a particular direction (directional, or high-gain, or "beam" antennas). For example, in various embodiments the directional antennas 122 can be directional and can be configured to radiate or receive signals over an area that is between 80 degrees and 110 degrees in a direction the first antenna is configured to face (e.g., a primary received and/or transmitting angular arc of the antenna). In some implementations, each of the one or more directional antennas 122 can be configured to provide communications within about a 90° angle, and thus two directional antennas can be configured to provide communications within about a 180° angle, three directional antennas can be configured to provide communications within about a 270° angle, and four directional antennas can be configured to provide communications within about a 360° angle. Other combinations of antennas and various arrangements are possible. In various embodiments, the directional antennas 122 can include one or more reflectors (e.g., parabolic reflectors), horns, and/or parasitic elements, which may direct the radio waves into a beam or other desired radiation pattern.

The one or more directional antennas 122 can be physically positioned and configured to transmit or receive at varying power levels and frequencies in one or more specific directions, such that the antennas can collectively provide greater directionality and sensitivity in certain direction(s) than in other directions. Advantageously, this can allow for increased performance and reduced interference from unwanted sources (e.g., sources that are not in the direction of the antenna's directionality). Directional antennas 122 can provide increased performance over dipole antennas, or omnidirectional antennas, when greater concentration of radiation in a certain direction is desired. Additionally, the directional antennas 122 can be broad-bandwidth antennas that can be used to transmit, receive, or transmit and receive radio signals with a wide frequency spectrum. In various embodiments, the directional antennas 122 can be configured to transmit and/or receive radio signals in a subset of the wide frequency spectrum. For example, there may be nearby equipment that emits signals in a particular frequency range where an antenna is facing and the RF system can be programmed to filter received signals (e.g., with software) so as to not interfere with analysis of received signals and/or filter transmitted signals (e.g., with software or additional digital signal filtering equipment) so as to minimize or remove interference with the operation of the nearby equipment. Accordingly, the RF system may selectively transmit signals of varying powers via the various direction antennas.

In various embodiments, each directional antenna 122 and its associated electronic circuitry (e.g., associated RF module 131) can operate independently as well as in a coordinated way with the other directional antennas. For example, a single directional antenna 122 can be configured to face and monitor a 90° field of view, and four of the described directional antennas (e.g., using 1, 2, 3, or 4 RF systems) can be configured to monitor a full 360° (or approximately 360°) field of view. In various embodiments, there can be additional antennas used (e.g., 5 antennas each covering 72°, 6 antennas each covering 60°, 7 antennas each covering about 52°, and/or the like), fewer antennas used (e.g., 1 antenna each covering 360°, 2 antennas each covering 180°, 3 antennas each covering 120°), and/or some fields of view can overlap as well (e.g., 4 antennas with each antenna covering 120°, or the like).

The antennas can also be configured to comprise automated or manual adjustability with respect to a vertical angle or tilt so that the antenna can face more downwards towards the ground or be adjusted to face more upwards towards the sky. In some applications, there may be an optimum angle that the antenna can adjust to based on empirical data or artificial intelligence/machine learning (e.g., the machine learning models described herein, or other models). Adjustability of the angle of the antennas may be provided by an antenna mount that is user-adjustable. The measured angle of an antenna may comprise an angle of elevation or tilt as compared to a plane the RF system is stationed on (which may be the same as a line perpendicular or normal to a side surface of the RF system on which the antenna is mounted, if the RF system is mounted level).

In various embodiments, for the RF system 102, the corresponding one or more directional broad-bandwidth antennas 122 and associated electronic circuitry can comprise multiple physical configurations. For example, the antennas and associated electronic circuitry can be configured to be detachable and/or stackable so that multiple antennas can be used in one specified location. For example, there might be two antennas at one location, where each antenna is configured to monitor a 90° field of view, for a total field of view of 180° being monitored by the two antennas.

iii. Cooling Components, Environmental Protection

The cooling components 124 can be configured to remove heat produced by one or more of the hardware components 103. For example, the cooling components 124 can help avoid temporary malfunction or permanent failure by overheat of power supplies, amplifiers, integrated circuits such as central processing units ("CPUs") and graphics processing units ("GPUs"), and/or other elements described herein. The other hardware components 103 described herein may be configured to generate little heat, but more heat may still be produced than can be removed without use of the cooling components 124. The cooling components 124 can include one or more fans, one or more heat sinks, one or more thermal couplings, one or more heat pipes or conductors, and/or the like, configured to allow removal of heat from the system. Thus, the RF system can advantageously include a physical modular configuration and materials that efficiently dissipate heat from the components of the system to enable the RF system to operate in high temperature and/or extreme environments.

For example, the upper and lower enclosures can include fans, and the upper and lower enclosures, the module enclosure(s), and the joining enclosures, if applicable, together can provide a cavity or channel for air to flow through the RF system to cool the various components of the RF system. The module enclosures can, for example, include heat sinks within the cavity or channel, and thermally coupled to the processing modules, the RF modules, and power supply modules, over which air may flow as pushed or pulled by the fans to cool the components of the RF system. The fans may cause air to flow up from the lower enclosure, through the heat sinks of one or more module enclosures, and out through the upper enclosure. Further, each of the modules (e.g., the processing module(s) 130, the RF module(s) 131, and/or the power supply module(s) 141) may internally include various thermal couplings, heat pipes or conductors, and/or the like, to conduct heat to the thermal interfaces and thereby to the heat sinks.

In various embodiments, the RF system, including the various components such as the module enclosures, the upper and lower enclosures, the processing modules, the RF modules, and power supply modules, and/or the antennas can be manufactured to account for and tolerate high temperature and/or extreme environments. For example, specific materials, such as metals, can be used to dissipate heat more quickly. Additionally, for example, each of the processing modules, the RF modules, and power supply modules can include individual housings that can provide additional environmental protection, shock protection, and thermal conductivity for the internal components (e.g., to provide thermal conductivity and heat dissipation to the outside of the individual components). Accordingly, the RF system can advantageously provide shielding of sensitive components from weather, sunlight (e.g., heat), and other external threats that might damage or reduce the efficiency of the equipment (e.g., processor throttling due to high temperatures). As noted above, the RF system may also include EMI protection, e.g., for the various modules of the system.

In various embodiments, the cooling components 124 can include liquid cooling elements that use liquid (e.g., water, liquid nitrogen) to cool other hardware components 103. Use of the cooling components 124 can maintain or increase a clock speed of the elements of the processing module 130 (e.g., a processor 136, a GPU 138).

iv. Communications Components

Communications components 129 can include various components of the RF system that provide or enable communications among the components of the RF system, and communications with other systems and sensors. Such communications components 129 can include, for example, wires, optical fibers, transceivers, plugs, jacks, connectors, and/or the like.

Communications components 129 include wiring between the directional antennas 122 and the respective RF modules 131. Such wiring may include a plug providing an interface to an exterior of the RF system, and an associated connector on a wire from an antenna to enable plugging the antenna's wire into the plug to provide electrical communications between the antenna and the RF module. Communications components 129 include similar wiring between the direction finder 120 and one or more of the RF modules 131 and/or processing modules 130 (including wires, plugs, connectors, and/or the like to provide electrical communications). Communications components 129 also include wiring or communications among the RF modules 131 and the processing modules 130; among multiple processing modules 130; and between processing modules 130 and external systems or sensor 104, central processing server 107, and/or user devices 110.

In various implementations, the communications components 129 may include electrical, optical, and/or electromagnetic communication channels. The communications components 129 can include components for communicating with other systems remote from the system. For example, the communications components 129 can include a remote data interface, such as a wireless transmitter.

In various embodiments the communications components 129 may include one or more digital data interfaces to send or receive digital data via a wired or a wireless link. For example, the communications components 129 may include one or more wireless transceivers, one or more antennas, and/or one or more electronic systems (e.g., front end modules, antenna switch modules, digital signal processors, power amplifier modules, and/or the like) that support communication over one or more communication links and/or networks. In some examples, each transceiver may be configured to receive or transmit different types of signals based on different wireless standards via the antenna (e.g., an antenna chip). Some transceivers may support communication using a low power wide area network ("LPWAN") communication standard. In some examples, one or more transceivers may support communication with wide area networks ("WANs") such as a cellular network transceiver that enables 3G, 4G, 4G-LTE, or 5G. Further, one or more transceivers may support communication via a Narrowband Long-Term Evolution ("NB-LTE"), a Narrowband Internet-of-Things ("NB-IoT"), or a Long-Term Evolution Machine Type Communication ("LTE-MTC") communication connection with the wireless wide area network. In some cases, one or more transceivers may support Wi-Fi communication. In some cases, one or more transceivers may support data communication via a Bluetooth or Bluetooth Low Energy ("BLE") standard. In some examples, one or more transceivers may be capable of down-converting and/or up-converting a baseband or data signal from and/or to a wireless carrier signal. In some examples, the communications components 129 may wirelessly exchange data between other components, such as other portions of the system or another system, a mobile device (e.g., smartphone, a laptop, and/or the like), a Wi-Fi network, WLAN, a wireless router, a cellular tower, a Bluetooth device, and/or the like. The antenna may be capable of sending and receiving various types of wireless signals including, but not limited to, Bluetooth, LTE, or 3G.

The communications components 129, in various embodiments, may also comprise aspects of the PNT component 140.

v. Processing Module

As noted above, each module enclosure of the RF system can include processing modules and RF modules that include electronic circuitry that can be configured to connect to and operate 1, 2, 3, 4, or more individual directional broad-bandwidth antennas. For example, each processing module 130 can comprise can include memory 132, one or more motherboards 134, one or more processors 136, one or more GPUs 138, one or more software-defined radio ("SDR") transceivers, and one or more positioning, navigation, and timing ("PNT") components 140. The processing modules 130 can be configured to receive transmissions from, and provide transmission via, one or more directional antennas. In various embodiments, a single module enclosure can be configured with one processing module 130, and can support two directional broad-bandwidth antennas, where the antennas can be placed at a single location, or the antennas can be placed a distance apart from each other (e.g., 5, 10, 100 feet apart) and connected to the same module enclosure. For example, one might be placed on the north side of the building facing north, and another may be placed on the east side of the same building facing east. Alternatively, the antennas might be placed at the northeast corner at the same location, with one antenna facing north and the other facing east. In various embodiments, two module enclosures joined together in a single RF system can be configured with two processing modules 130, and can support four directional broad-bandwidth antennas, where the antennas can be placed at a single location, or the antennas can be placed a distance apart from each other (e.g., 5, 10, 100 feet apart) and connected to the same RF system.

As also noted above, each of the processing modules 130 may comprise system-on-module ("SOM") aspects, and may thus be referred to herein as "SOM modules". In implementations in which a given RF system 102 includes two or more processing modules 130 (e.g., when the RF system includes two or more module enclosures) the multiple processing modules 130 may communicate with one another directly to provide the functionality described herein, or may communicate with one another via a system management module that may provide coordination functionality among the multiple processing modules 130. In implementations using a system management module, the system management module may provide communications with other external systems or sensors, and may relay those communications to the multiple processing modules 130. In various implementations, the system management module may incorporate components and/or functionality of one or more of the processing modules, such as the PNT components 140. In various implementations, when the RF system 102 includes two or more processing modules 130, one of the processing modules can be manually and/or automatically designated to act as the system management module (and thus no physically separate system management module is present) to provide the coordination and communication functionality described above. The system management module can also be referred to as a system controller module and/or the system management module may comprise a system controller module.

The memory 132 can include non-volatile memory and/or volatile memory. The non-volatile memory may include flash memory or solid-state memory. The memory 132 can store software instructions for implementing operation of the RF system as described herein. The memory 132 can also store the AI/ML model(s) and other information needed for executing the detection of objects, and generation of signals.

The motherboard 134 can be referred to a mainboard, a main circuit board, or some other central processing system. The motherboard 134 can include a main printed circuit board ("PCB"). The motherboard 134 can include various communications interfaces or buses to allow for communications among components of the processing module 130, such as memory 132, one or more processors 136, one or more GPUs 138, one or more SDR transceivers, and one or more PNT components 140. The motherboard 134 can provide connectors for other elements described herein. The motherboard 134 can include significant sub-systems, such as the central processor, the chipset's input/output and memory controllers, interface connectors, and other components integrated for general use.

The one or more processors 136 can include any type of general-purpose central processing unit ("CPU"). In various embodiments, the one or more processors 136 may include more than one processor of any type including, but not limited to complex programmable logic devices ("CPLDs"), field programmable gate arrays ("FPGAs"), application-specific integrated circuits ("ASICs"), or the like.

The one or more GPUs 138 can include any type of specialized electronic circuit that may execute advanced computations that may be executed more slowly, or less efficiently, on a general-purpose processor (or which may not be executable on a general-purpose processor). The GPUs 138 can include fast memory and highly parallel structure to process large blocks of data in parallel. For example, the GPUs 138 may be configured to perform matrix calculation, perform linear algebra calculations, execute Fourier transforms, and/or other advanced calculations, including executing the ML models as described herein. Also, for example, the GPUs 138 may be configured to perform many calculations per second (e.g., 10, 15, 20, 30, or more Tera FLOPS per second). These GPUs 138 may include their own memory and/or processors or may execute instructions stored in the memory 132 and/or as instructed by the processors 136. The instructions may be executed by the processor(s) 136 and/or the GPUs 138. For example, the processor(s) 136 may instruct the GPUs 138 to apply an ML model to sampled RF data to, e.g., determine a type of object, as described herein. Additionally or alternatively, the processor(s) 136 may support in making the calculations and other determinations.

Various aspects and functionality of the processing modules 130 may correspond to aspects of the system described in reference to FIG. 3, and thus the components and functionality described in reference to FIG. 3 may be applicable to the processing modules 130.

The SDR transceivers 139 comprise circuitry and functionality to produce, modify, detect, sense, or otherwise work with RF signals as described herein. For example, the SDR transceivers 139 may be configured to transmit/receive signals that can be mixed, filtered, amplified, modulated/demodulated, and/or detected using one or more components described herein. As a further example, the SDR transceivers 139 can receive instructions from the processor 136 to generate one or more signals to be transmitted by the RF system (e.g., to target an identified object). Thereafter, the SDR transceivers 139 can generate the signals, which can then be communicated to the RF modules 131 (as appropriate for targeting, and including instructions regarding an amount of power to transmit on any applicable antenna) for amplification and transmission via the directional antennas 122.

The SDR transceivers 139 may include one or more analog-to-digital ("ADCs") converters and one or more digital-to-analog converts ("DAC"). For example, received signals (received, e.g., via a directional antenna and RF module, and communicated to the processing module) may be passed through an ADC for further digital domain sampling and analysis, as described herein. Signals to be transmitted may be generated by the SDR transceiver, and passed through a DAC before being communicated to an RF module for amplification and transmission via a directional antenna). In various implementations, the ADCs and DACs may be located elsewhere in the system, e.g., as separate components of the processing modules and/or RF modules.

In various embodiments, the RF system, e.g., the processing modules 130, can include PNT capabilities. Such PNT capabilities may be provided by the one or more PNT components 140 that may include, for example, global navigation satellite system capabilities (e.g., global positioning system ("GPS") capabilities), among other PNT functions. The one or more PNT components 140 may further provide orientation information, altitude information, angle/tilt information, and/or the like. In some implementations, the PNT capabilities 140 may be provided in and/or by the direction finder 120, in whole or in part. The PNT capabilities may also be referred to herein as "positioning capabilities", and the one or more PNT components 140 may also be referred to herein as "positioning components", and/or the like. The PNT capabilities of the RF system may be used, for example, in object location determinations and/or tracking, as described herein, because such functionality may be dependent on the position, orientation, tilt, and/or the like, of the RF system (e.g., such that the correct directional antennas 122, with the correct orientation and tilt, may be used to detect or target an object).

vi. RF Module

Each of the RF modules 131 can include one or more power amplifiers 126, one or more filters and/or limiters 128, and one or more multiplexers 125. As described herein, in various implementations, each RF module 131 may be in communication with one directional antenna 122. Further, each RF module 131 may both receive RF signals via the associated directional antenna, and cause transmission of RF signals via the associated directional antenna. The received signal may be communicated to the processing module 130, with which the RF module 131 is in communication. Similarly, the processing module 130 (via the SDR transceivers 139) can provide signals to the RF module 131 for transmission.

The radio frequency ("RF") power amplifiers 126 can include amplifiers both for received signals, and for transmission of signals. In various implementations, that system can include multiple signal channels, and thus multiple amplifiers, both for receiving and for transmission. In various implementations, the power amplifiers 126 can drive an antenna, or modify a received signal, such that the output can include improved gain, power output, bandwidth, power efficiency, linearity (e.g., low signal compression at rated output), input and output impedance matching, and/or heat dissipation. In various implementations, the power amplifiers 126 can amplify signals in the radio frequency range between about 20 kHz and about 300 GHz, and/or can include preamplifiers that may precede other signal processing stages.

The one or more filters and/or limiters 128 can provide signal filtering and/or limiting, primarily for received signals, but optionally also for transmitting signals. Filters can include, for example, broadband, narrowband, high-pass, low-pass, notch, and/or other kinds of filters for RF signals. In some embodiments, the filters can be configured to reduce noise within a received and/or transmitted RF signal. The limiters can include various circuit elements for limiting the power of signals, e.g., received by the RF system. In general, the RF modules 131 operate in the analog domain (e.g., analog signals are communicated to the RF module from the processing modules/SDR transceivers), but some aspects, in some implementations, may be digital domain (e.g., if ADCs and/or DACs are provided on the RF module, and/or if some filtering and/or limiting is performed by the RF module in the digital domain).

The RF modules can also include multiplexers to provide for receiving and transmitting via the directional antennas. For example, a multiplexer of the RF module can switch between receiving RF signal from the directional antenna (and providing the received signal to the processing module) and transmitting an RF signal (received from the processing module) via the directional antenna. In various implementations, at least two communications links are provided between the processing module and the RF module to enable receiving and transmitting functionality. In various embodiments, the RF system may periodically, intermittently, on demand, rapidly, and/or according to a program, switch between receiving signals and transmitting signals. In various embodiments, the RF system may simultaneously receive and transmit signals (e.g., one set of directional antenna and RF module may be receiving, which another set of direction antenna and RF module is transmitting). In various embodiments, the multiplexer can modulate and/or demodulate a signal that is received and/or transmitted.

In various embodiments, the RF system may include one or more FPGAs or ASICs can be used instead of a general-purpose processor, or a specialized digital signal processor ("DSP") with specific paralleled architecture for expediting operations such as filtering. In various embodiments, the RF system may include one or more additional amplifiers and/or other circuit components to provide the functionality described herein.

a. Example Software Components of the RF System

FIG. 1C illustrates a block diagram of example software components 105 of the RF system 102 (and/or RF systems 106), according to various embodiments of the present disclosure. The software components 105 may include RF transmission component 160, AI/ML component 162, digital signal filtering 164, external data system 166, tracking component 168, power controls 170, and raw signal storage 172. In various embodiments, the software components 105 are implemented in one or more of the hardware components 103 of the RF system 102. For example, the software components 105 may be implemented by the processing modules 130 (e.g., may comprise software instructions stored in the memory, and executed by the processor(s), GPU(s), SDR transceiver(s), and/or the like, of the processing modules 130).

In various embodiments, the one or more of the software components 105 may comprise executable software instructions, modules, engines, and/or the like, that may communicate with one another to share computer resources to execute various tasks in conjunction with a specific functionality such as: tracking a signal or object, identifying a signal, generating a signal, transmitting a signal, training/sharing/applying an AI/ML model, reducing/increasing power output, or the like. Each task may include one component of the software components 105 or multiple components. In various embodiments, functionality can be shared by each of the software components 105. In various embodiments, functionality can be shared by some of the software components 105 as well as hardware components (e.g., 103) or other devices and systems.

In general, the software components 105 of the RF system can enable tracking of objects, detecting and/or identifying one or more RF signals captured by a connected antenna, and/or determining and causing transmission of a signal to a tracked object via the one or more directional antennas. For example, software components can implement, e.g., via a machine learning component, machine learning ("ML") algorithms, artificial intelligence ("AI") algorithms, ML models, programmed algorithms, and/or the like (generally collectively referred to herein as "AI/ML algorithms", "AI/ML models", or simply as "ML algorithms", "ML models", and/or the like) that may, for example, implement models that are executed by one or more processors. Having an AI/ML model to identify RF signals can advantageously provide significant improvements as compared to conventional systems because many detected signals may include some level of interference, be relatively weak and hard to detect, or otherwise hard to identify due to other factors. In various embodiments, the machine learning component can apply one or more ML models or parameter functions for the detections/identifications. The machine learning component can be configured to apply one or more ML models that can help detect which types of RF signals (e.g., a range of RF signals, particular frequencies or combinations of frequencies, and/or the like) indicate which types of objects.

The AI/ML component 162 (also referred to above as "machine learning component") can be configured to store, update, and/or apply one or more AI/ML models, programmed algorithms, and/or the like. As will be described in greater detail herein, the AI/ML models implemented at the AI/ML component may be, for example, one or more models trained to identify frequencies (or related signal properties), objects, classes or types of objects, or other characteristics of detected objects based on received RF signals emitted from objects. In some embodiments, the AI/ML component 162 may also be involved with generating and/or training the one or more AI/ML models. In various implementations, the AI/ML component is performed by one or more of the processors or the GPUs of the processing modules 130.

The one or more ML models may be used to determine an expected RF signal frequency range or additional signal properties based on analysis of received or captured data. In various embodiments, signal monitoring criteria or signal identification criteria can be designated by a user, admin, or automatically. For example, the signal monitoring criteria or signal identification criteria can indicate which types of detections to monitor, record, or analyze. By designating specific types of detections, resources (e.g., processing power, bandwidth, and/or the like) can be preserved for only the types of detections desired. Various types of detections are described in more detail herein.

A number of different types of AI/ML algorithms and AI/ML models may be used by RF system. Further, these AI/ML models may be developed, programmed, and/or trained using various methods. For example, certain embodiments herein may use a logistical regression model, decision trees, random forests, convolutional neural networks, deep networks, or others. However, other models are possible, such as a linear regression model, a discrete choice model, or a generalized linear model. The machine learning aspects can be configured to adaptively develop and update the models over time based on new input. For example, the models can be trained, retrained, or otherwise updated on a periodic basis as new received data is available to help keep the predictions in the model more accurate as the data is collected over time. Also, for example, the models can be trained, retrained, or otherwise updated based on configurations received from a user, admin, or other devices. Some non-limiting examples of machine learning algorithms that can be used to train, retrain, or otherwise update the models can include supervised and non-supervised machine learning algorithms, including regression algorithms (such as, for example, Ordinary Least Squares Regression), instance-based algorithms (such as, for example, Learning Vector Quantization), decision tree algorithms (such as, for example, classification and regression trees), Bayesian algorithms (such as, for example, Naive Bayes), clustering algorithms (such as, for example, k-means clustering), association rule learning algorithms (such as, for example, Apriori algorithms), artificial neural network algorithms (such as, for example, Perceptron), deep learning algorithms (such as, for example, Deep Boltzmann Machine), dimensionality reduction algorithms (such as, for example, Principal Component Analysis), ensemble algorithms (such as, for example, Stacked Generalization), support-vector machines, federated learning, and/or other machine learning algorithm. These machine learning algorithms may include any type of machine learning algorithm including hierarchical clustering algorithms and cluster analysis algorithms, such as a k-means algorithm. In some cases, the performing of the machine learning algorithms may include the use of an artificial neural network. By using machine-learning techniques, large amounts (such as terabytes or petabytes) of received data may be analyzed to generate or implement models with minimal, or with no, manual analysis or review by one or more people. In some embodiments, the algorithms may be programmed based on empirical data (e.g., in addition to, or without, machine learning or artificial intelligence being implemented).

In various embodiments, an ML model of the RF system may be trained by: (1) sampling raw signals (e.g., captured from one or more connected antennas), (2) signal annotation (e.g., frequency, time, and intensity), (3) signal filtering, and (4) model training. The trained model can then be applied, by the RF system, to received or captured RF signals for identification purposes. For example, in various embodiments, application of the trained machine learning model can comprise: (1) raw signal sampling, (2) application of trained model, (3) output of classes and probabilities (e.g., associated with type of objects). Then, for example, the processing module can identify a captured RF signal and/or a type of object based on the (3) output of classes and probabilities. Also, in various embodiments, application of the trained machine learning model can comprise the preliminary step of (0) filtering base line signal and/or friendly signals.

In various embodiments, sampling raw signals or raw signal (e.g., RF) data can include any form of data sampling. Data sampling, for example, can include a statistical analysis technique used to select, manipulate, and analyze a representative subset of data points to identify patterns and trends in the larger data set being examined. It can enable working with a small, manageable amount of data that may be representative of a larger, unmanageable amount of data. Sampling can advantageously enable analysis of data sets that are too large to efficiently analyze in full or within a desired amount of time. In various embodiments, the RF system may sample the raw signal for some period of time (e.g., some number of milliseconds, such as 1 ms, 2 ms, 3 ms, 5 ms, 10 ms, 50 ms, or some other period of time). In various embodiments, other, or additional, sampling methods may be employed.

In various embodiments, the machine learning model can be configured (e.g., by its training automatically, or manually, or a combination) to monitor a specific subset of frequencies or subset of other wave properties. For example, although the processing module, via signals received from one or more antennas, can detect and scan for a set of frequencies, the processing module may limit analysis to a specific subset of frequencies. For example, this may be a consequence of the machine learning model training where certain frequencies are not important or useful and are therefore ignored freeing up processing power to analyze other frequencies. Also, for example, the subset of frequencies can be configured manually if there is friendly equipment in the area emitting certain frequencies that the system doesn't need to identify (e.g., the equipment is already known/identified). In various embodiments, each antenna can be operated by the processing module (via one or more RF modules) separately, as well where one antenna may monitor one subset of frequencies and another antenna in communication with the same processing module may monitor a second subset of frequencies different from the first subset. For example, this might be implemented if one antenna is facing friendly equipment and another is not. Also, in various embodiments, the subset of frequencies may adjust based on the time of the day, week, month, or year. For example, during the day a vehicle may be positioned in front of one antenna emitting a signal at a specific frequency, and the vehicle may move such that it is not in front of the antenna during the night.

In various embodiments, the RF system (e.g., via one or more processing modules and/or one or more RF modules) can use identified types of objects (e.g., output from the applied machine learning model) to generate one or more new signals and, using one or more of the directional antennas, transmit the new signals. The new signals may be transmitted in the direction of the identified signal or one or more objects. Accordingly, the RF system may selectively transmit signals of varying powers via the various direction antennas. In various embodiments, the identified signal corresponds to one or more mobile objects (e.g., vehicle, boat, aircraft, drone, and/or the like), and the transmitted signals may affect communications in the vicinity of the mobile object during transmission. In various embodiments, detections or identification of objects, or identification of signals corresponding to objects, can be received from one or more other systems or sensors. Generating a signal based on the identified signal can advantageously be beneficial due to increased power efficiency/optimization. For example, instead of transmitting signals in all frequency bands, only signals in a specific frequency or narrow range of frequencies can be transmitted instead, thereby increasing power efficiency and/or signal power to reach father distances. In various embodiments, the transmitted signal can be further filtered to limit interference of sensitive friendly systems in the area.

The RF transmission component 160 can be configured to cause transmission of RF signals and/or to generate RF signals to be transmitted, as described above and herein. For example, the RF transmission component 160 may be in communication with one or more antennas (e.g., directional antenna(s) 122 of FIG. 1B) or other transmitting devices and configured to cause the one or more antennas to transmit RF signals. In various embodiments, the RF transmission component 160 can include at least a portion of the SDR transceiver, and/or may provide instructions to the SDR transceiver, including software configured to selectively cause transmission of signals at desired frequencies, intensities, and/or directions. The RF transmission component 160 may further be configured to receive tracking data from the tracking component 168, such as to transmit RF signals to an object being tracked by the system.

The digital signal filtering component 164 can be configured to filter raw RF signal data collected by the system, e.g., before the RF signal data is provided to the AI/ML component 162 for signal analysis based on a trained AI/ML model. For example, in various embodiments, the RF system can remove RF signals from the raw RF signal data collected that may correspond to RF signals associated with friendly equipment, equipment that has been manually or automatically flagged as friendly, or filter raw RF signal data based on a whitelist and/or blacklist (e.g., manually and/or automatically populated). The digital signal filtering component 164 can also be configured to filter raw RF signal data transmitted or emitted by the system. For example, in various embodiments, the RF system can remove RF signal frequencies from any generated RF signals (e.g., as transmitted by the RF transmission component 160 or one or more antenna(s)) may correspond to RF signals associated with friendly equipment, equipment that has been manually or automatically flagged as friendly, or based on a whitelist and/or blacklist (e.g., manually and/or automatically populated). As the digital signal filtering is mostly accomplished in the digital domain, received signals are typically converted to digital before this filtering, and generated signals are typically converted to analog after this filtering. In some implementations, the filtering described above may be perform in part or in whole in the analog domain. In various implementations, the digital filtering is performed by one or more of the processors or the SDR transceivers of the processing modules 130.

The tracking component 168 can be configured to track detected objects based on identified RF transmissions received from the detected objects. In various embodiments, the tracking component 168 can track an identified signal or object (e.g., while the RF system is transmitting or not). In various embodiments, the direction finder can provide more accurate tracking as well. For example, the direction finder in conjunction with the one or more antennas can identify a direction where a detected signal is emanating from (e.g., while the antennas are transmitting or not).

In various embodiments, there may be other sensors or systems (e.g., and including other RF systems in the area) that can connect to the RF system to provide additional data that can be used to: (1) improve the detections performed by the RF system using the machine learning models; (2) assist RF system in continuing to track, or begin tracking, an object or signal; and/or (3) generate and transmit, or continue generating and transmitting, a specific signal in the direction of an object, among other functions. For example, if an object or signal is moving from out of range of one antenna connected a first RF system (e.g., RF system 102) into range of another antenna connected to a second RF system (e.g., RF system 106), the two RF systems can communicate and hand-off the task (e.g., identifying, tracking, transmitting, and/or the like) being implemented by the first RF system can continue to be performed by the second RF system. In various embodiments, the first RF system can shut off and the second RF system can turn on during the transition. In various embodiments, the first RF system and second RF system can stay on and perform the same tasks over a period of time (e.g., 5 second, 1 minute, 10 minutes, and/or the like), or at least until the task is completed and both RF systems stop. In various embodiments, the first RF system can reduce the power utilized to implement the task as the second RF system increases power in conjunction (e.g., there may be a threshold power usage set that limits the total amount of power used by one or both RF systems at one time).

The external data system component 166 can store or retrieve, from any external data storage of external devices, sensors, or systems (e.g., additional systems or sensors 104, central processing server 107, and/or the like), any desired data for implementation in conjunction with the systems and methods of the present technology. For example, AI/ML models, data associated with known objects or classes of objects and/or RF signal characteristics associated with the known objects or classes of objects, data defining signal content to be transmitted to detected and/or tracked objects, and the like, may be stored and/or retrieved via the external data system 166. In various embodiments, the external data system component 166 or associated external data sources or devices can include one or more databases connected to a user device (e.g., 110), a central processing server (e.g., 107), one or more RF systems (e.g., 102 or 106), or additional systems or sensors (e.g., 104), for example. In various embodiments, the data described above may similarly be stored in a memory of the processing modules, as described herein.

The power controls 170 can be configured for software control of power supplied to any of various components of the system, such as any of the hardware components 103 (e.g., FIG. 1B). For example, the power controls 170 may control selective RF transmissions from antennas 122 based at least in part on the power supplied to the antennas 122 (e.g., via RF modules) for transmission.

The raw signal storage 172 can store raw RF signals or complex data related to the raw RF signals received by an antenna. In various embodiments, the raw signal storage 172 can store, for example, raw data corresponding to an analog-to-digital conversion of an RF signal received at an antenna, spectrogram data corresponding to the raw data, determined RF signals to be transmitted based on any received RF signals (e.g., as determined by the AI/ML component), or any other type of data structure indicative of a raw RF signal received or transmitted by one or more antennas.

In various embodiments, each RF system may also include software components for performing over-the-air ("OTA") (or via electrical hardwire connection) updates of the various software, components, machine learning models or components, and/or the like. For example, the RF system may connect to the central processing server 107 to receive updates. As another example, if multiple RF systems are installed in an area it may be beneficial for the RF systems to connect and update each other's machine learning models (e.g., by sending the updated models, or relevant data captured so that each RF system can train based on the additional data) over time so that each RF system has the most up-to-date data or model available. In various embodiments, although RF systems may be in the same area, it might be beneficial to only share portions of data or machine learning models between the RF systems since there might be subtle differences between each RF systems field of view that might result in one model being better suited for a first environment/area than another model that is better suited in a second environment/area.

V. Example Implementation of RF Systems

Figure 2A:
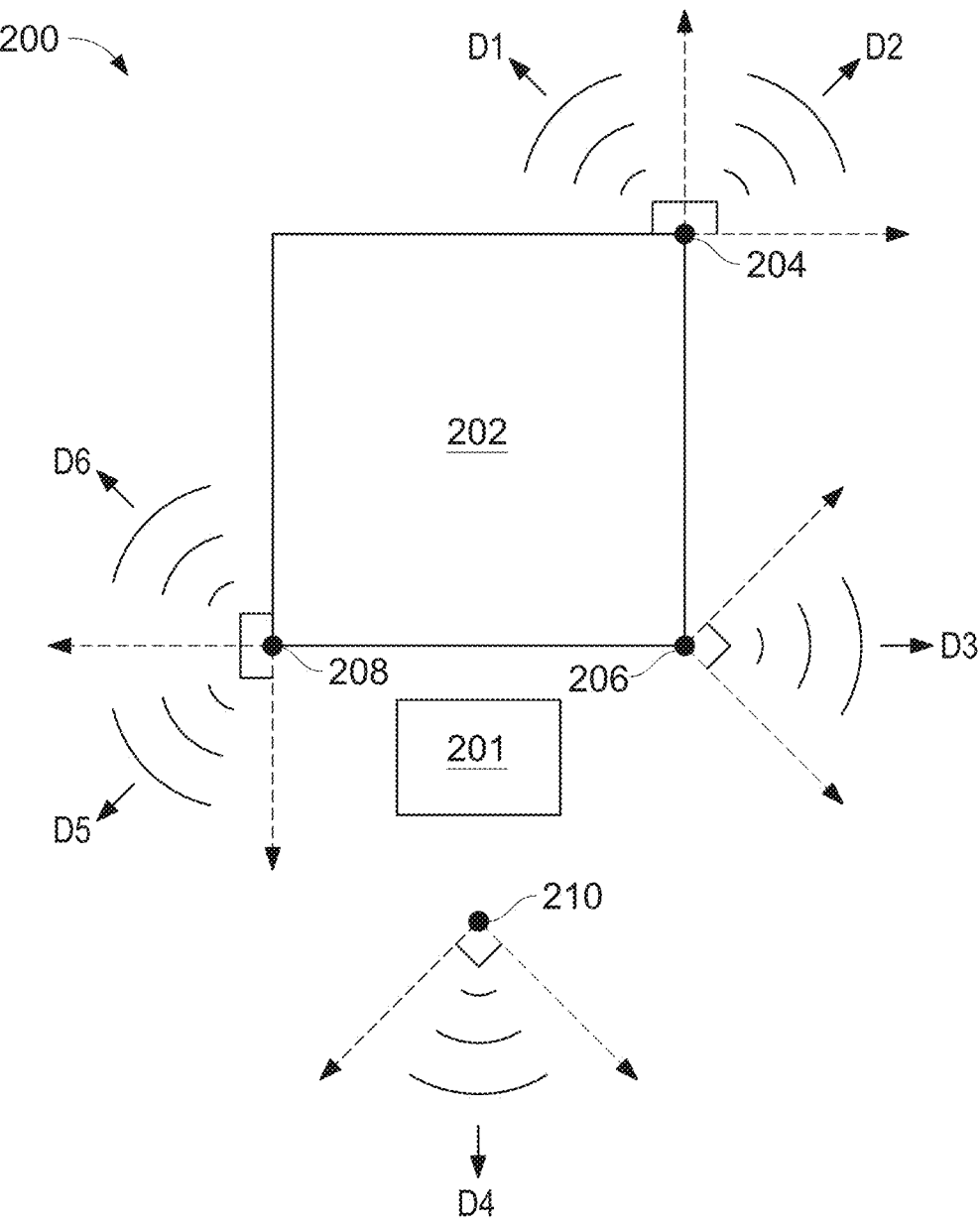
FIG. 2A illustrates an example implementation and orientation of a plurality of RF systems, according to various embodiments of the present disclosure.
Figure 2B:
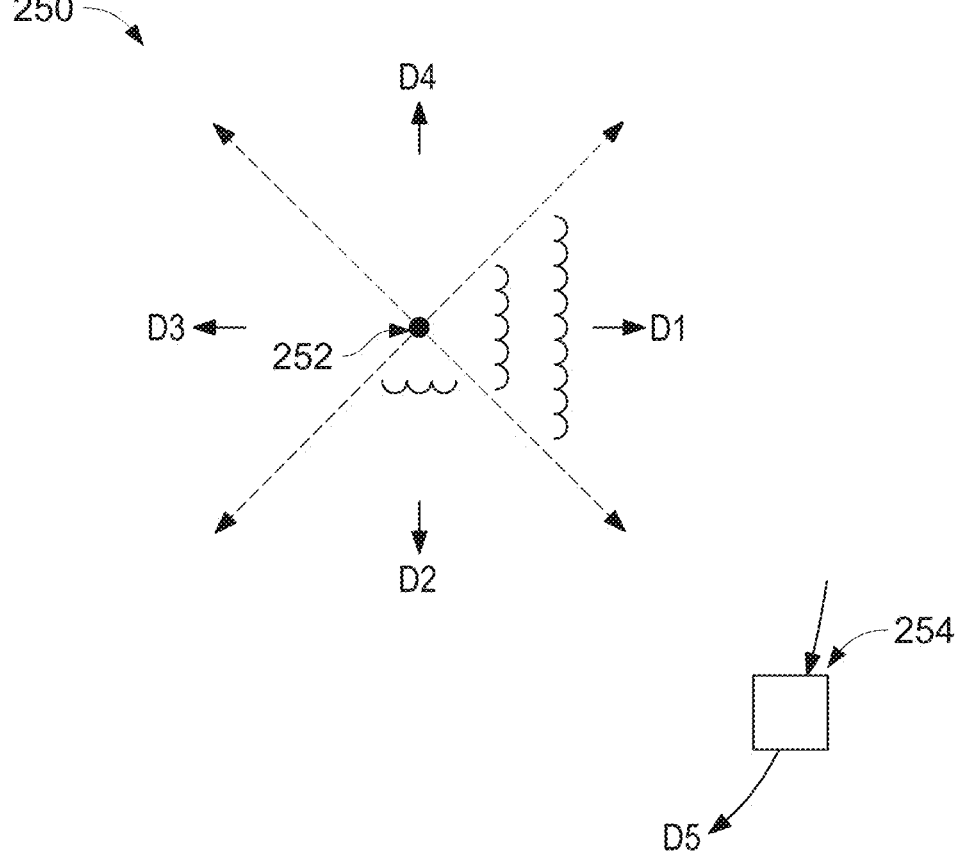
FIG. 2B illustrates an example implementation and orientation of an RF system interacting with an object, according to various embodiments of the present disclosure.

FIGS. 2A and 2B illustrate example implementations and orientations of one or more RF systems (e.g., RF systems 102 and/or 106) in operation, according to various embodiments of the present disclosure.

FIG. 2A illustrates an example implementation and orientation 200 of a plurality of RF systems (e.g., RF systems 102 and/or 106). In FIG. 2A, the plurality of RF systems 204, 206, 208, and 210 can be placed surrounding a building or area 202 such that corresponding antennas connected to the RF systems can face directions away from locations that may comprise sensitive equipment or is otherwise designated as a protected area to be omitted from monitoring by the RF systems. Although FIG. 2A shows one arrangement, infinite arrangements can be devised for each site where RF systems are deployed/installed. For example, placement of each RF system, hardware components (e.g., 103) or software components (e.g., 105) of each RF system, the type of data being shared between the RF systems, the areas or buildings to omit from the antennas' fields of view, and other criteria can vary for each site such RF systems are to be deployed in.

Additionally in FIG. 2A, the RF systems (e.g., 204, 206, 208, and 210) are shown with 1-2 directional broad-band-width antennas corresponding to each RF system. For example, RF systems 204 and 208 are shown being installed either on the roof of building 202, adjacent building 202, or on one of the side walls of building 202. The RF systems 204 and 208 also correspond to two antennas each, with each antenna facing a particular direction with a 90° field of view. For example, RF system 204 has one antenna facing D1 and a second antenna facing D2, both with a 90° field of view. Also, for example, RF system 208 has one antenna facing D5 and a second antenna facing D6, both with a 90° field of view. The RF systems 206 and 210 also correspond to two antennas each, with each antenna facing a particular direction with a 90° field of view. For example, RF system 206 has one antenna facing D3, and RF system 210 has one antenna facing D4, both antennas having a 90° field of view. In various embodiments, for example, RF system 204 could have 1 antenna with 180° field of view, or 3 antennas with a 60° field of view, or other similar combinations, to have the same overall field of view achieved by the two antennas shown. In various embodiments, RF systems (e.g., 204, 206, 208, and 210) can include any number of antennas (e.g., 1, 2, 3, 4, 5, 6, and/or the like), and antennas facing specific direction(s) can be turned on or off based on software instructions, orientation relative to sensitive equipment, orientation relative to other RF systems, customized preferences (e.g., based on the terrain or surrounding area), detected objects in the vicinity, or the like.

Advantageously, the RF systems and their corresponding antenna(s) are arranged such that the building 202 and area 201 (e.g., which could be another building, temporary building, stationary vehicle, or other friendly or sensitive equipment, or the like) are located outside of the antennas' fields of view. In various embodiments, data can be transmitted between the RF systems such that detections (e.g., training or application of a machine learning model), tracking, and/or transmissions can be coordinated, for example.

FIG. 2B illustrates an example implementation and orientation 250 of an RF system interacting with an object 254, according to various embodiments of the present disclosure. In FIG. 2B, an RF system 252 can be placed in a location (e.g., near or on a building or area). In various embodiments, multiple directional broad-bandwidth antennas can be used to cover a surrounding area. For example, FIG. 2B shows RF system 252 including at least 4 antennas facing directions D1, D2, D3, and D4. Although FIG. 2B shows one arrangement, infinite arrangements can be devised where an RF system can include any number of antennas (e.g., 1, 2, 3, 4, 5, 6, and/or the like), and antennas facing specific direction(s) can be turned on or off based on software instructions, orientation relative to sensitive equipment, orientation relative to other RF systems, customized preferences (e.g., based on the terrain or surrounding area), detected objects in the vicinity, or the like. The antennas also are shown with at least a 90° field of view. In various embodiments, for example, RF system 252 could have 8 antennas with 45° field of view, or 80 antennas with a 4.5° field of view, or other similar combinations, to have the same overall field of view achieved by the four antennas shown. Also, for example, placement of the RF system 252, hardware components (e.g., 103) or software components (e.g., 105) of the RF system 252, the type of data being shared between the RF system 252 and other RF systems or devices/sensors (e.g., 104), areas or buildings to omit from any of the antennas' fields of view, and other criteria can vary for the RF system 252.

Furthermore, in FIG. 2B, object 254 is shown moving in direction D5 from an area covered by a first antenna facing direction D1 towards an area covered by a second antenna covering direction D2. In various embodiments, power can be provided to the first antenna to improve the first antenna's performance related to receiving/transmitting RF signals in direction D1 while object 254 is in the area covered by the first antenna. As the object 254 moves along direction D2 into the area covered by the second antenna, power can be diverted from the first antenna to the second antenna so that the RF system 252 can continue to effectively receive/transmit RF signals in relation to the object 254. In various embodiments, power can be ramped down for the first antenna (e.g., ⅔ power signals shown in the direction D1 corresponding to the first antenna) and simultaneously ramped up for the second antenna (e.g., ⅓ power signals shown in the direction D2 corresponding to the second antenna). In various embodiments, power can be binary, and the first antenna can be turned off as the second antenna turns on. In various embodiments, the power for each antenna, based on movement of an identified/tracked object (e.g., 254) can be controlled by one or more computing processing modules of the RF system (or one or more RF systems) such as those described herein so that performance can be optimized (e.g., based on velocity of the identified/tracked object, distance of the identified/tracked object as compared to the RF system doing the tracking, properties of the tracked signal (e.g., strength, wavelength, frequency, or the like), or the like). Additionally, in the example shown in FIG. 2B, a third antenna facing direction D3 and a fourth antenna facing direction D4 are shown as being deactivated or turned off since the object 254 is not in the area covered by the third antenna or fourth antenna. In various embodiments, all antennas can be turned on or off at the same time as well.

In another example arrangement not shown in a figure, a first RF system can be placed on the northeast corner of a building with one antenna facing north and another facing east. Also, a second RF system can be placed on the southwest corner of the same building with one antenna facing south and the other facing west. Accordingly, the four antennas connected to the two RF systems (and/or additional RF systems and associated antennas) can monitor a 360° area (or approximately a 360° area) surrounding the building, and at the same time omitting any signal detection coming from the building itself. As a consequence of the orientation, while any of the antennas are transmitting signals, the transmission can be away from the building so that the building and any equipment or personnel in the building are not impacted or affected by any transmissions. The orientation and the signal filtering described herein can further limit interference of friendly areas and equipment in an improved manner.

Advantageously, an infinite number of other arrangements (in addition to the examples provided above) of one or more RF systems, and one or more directional antennas per RF system, are possible with the modular and configurable RF system of the present disclosure.

VI. Additional Example Hardware-Related Features and Functionality

The description of FIGS. 4A-4D, 5A-5E, 6, 7A-7B, 8, and 9A-9D below provides further details regarding implementations, components, and related functionality of the RF system. While different numerals may be used to describe the various aspects of the RF system as compared to the foregoing description, it is to be understood that similar aspects and components may include similar or the same functionality. Thus, aspects described above may be applied to aspects described below, and vice versa.

Figure 4A:
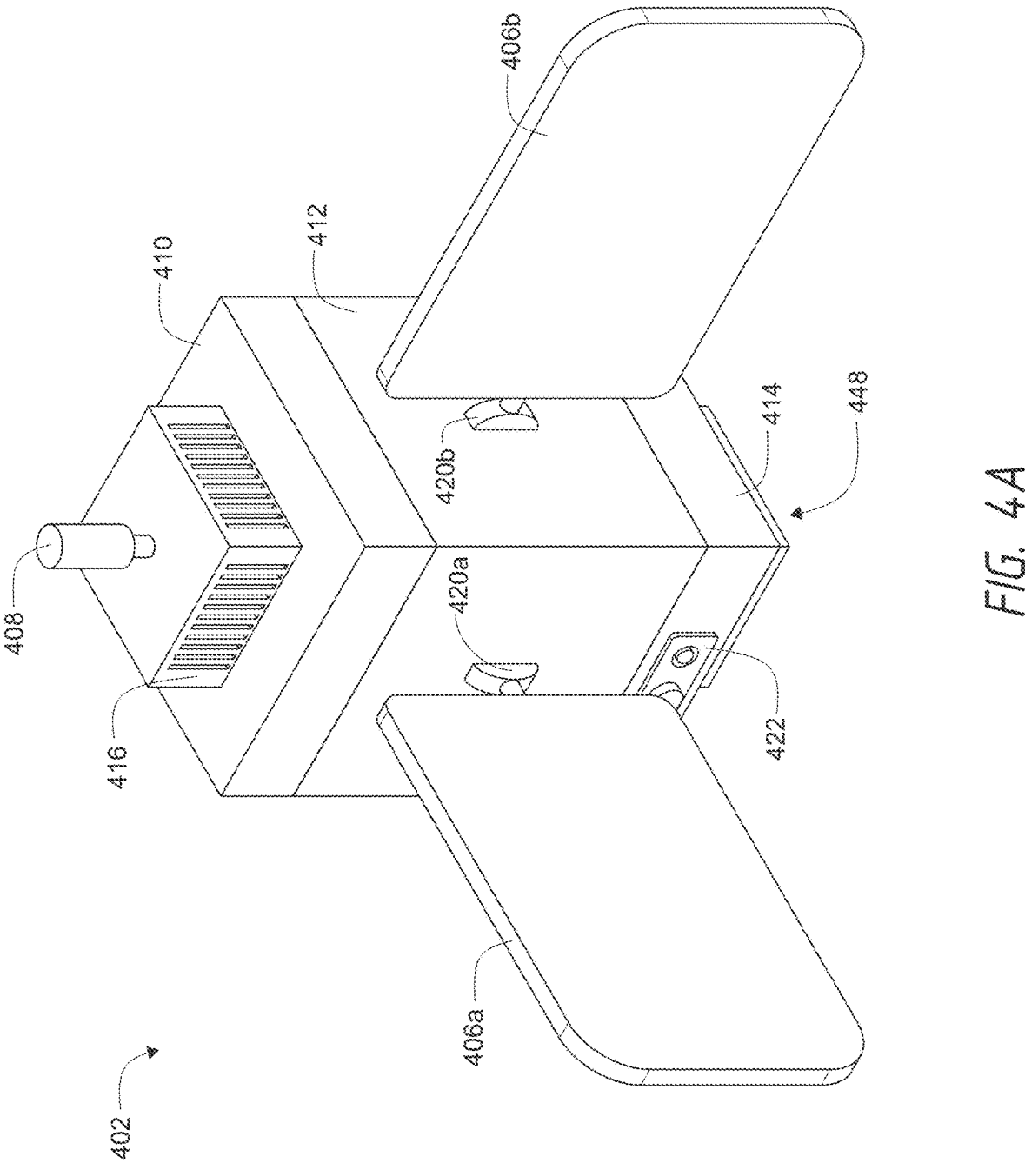
FIG. 4A illustrates a perspective view of an example implementation of an RF system comprising one module enclosure, according to various embodiments of the present disclosure.

FIG. 4A illustrates a perspective view of an example implementation of an RF system comprising one module enclosure, according to various embodiments of the present disclosure. The illustrated implementation includes an RF system 402 (which may correspond to the RF system 102 described above, in an implementation having a single module enclosure) comprising an upper enclosure 410, a module enclosure 412, a lower enclosure 414, directional antennas 406*a*-406*b*, and a direction finder 408.

The upper enclosure 410 can be disposed above the module enclosure 412. Additionally or alternatively, the lower enclosure 414 can be disposed below the module enclosure 412. As shown, the upper enclosure 410 and the lower enclosure 414 are each adjacent the module enclosure 412. Additionally, surfaces of each of the upper enclosure 410 and lower enclosure 414 are shown to be flush with corresponding surfaces of the module enclosure 412. Together, the upper enclosure 410, the module enclosure 412, and the lower enclosure 414 may form a "modular assembly" or a main housing of the RF system.

The upper enclosure 410 can include one or more air vents 416. The air vents 416 can enable or promote air flow within the modular assembly, such as within an inner portion or cavity of the RF system 402. Such air flow can improve cooling of one or more parts of the RF system 402 within the modular assembly, such as described below. The inner portion may be sealed (e.g., liquid sealed, fluid sealed) from an outer portion or cavity of the interior of the RF system 402. The outer portion may be referred to herein as a peripheral portion of the RF system 402, as the outer portion may surround or comprise a periphery of the inner portion of the RF system. The peripheral/outer portion may, for example, house the system modules, and surround the inner portion comprising, for example, the heat sinks. The seal may include a hermetical seal. The seal may promote more efficient air flow into and out of the air vent 416 and/or the air vent 430 (shown in FIG. 4B). For example, the outer portion that is sealed off from the inner portion can comprise components and areas 436, 438*a-d*, and 428 (described below in reference to FIG. 4B), for example. The seal may comprise metal, plastic, or other impervious or otherwise resistant material secured by a mechanism that facilitates one or more sealed compartments (e.g., screws with rubber O-rings, welding, caps, pins, or the like). The seal may comprise a hermetic seal, such that the system modules and other internal components of the RF system are hermetically sealed from the outside environment. In some embodiments, a filter can be placed in front of the air vents 416 and/or 430 to limit debris from entering the inner portion (e.g., where components 440*a-d*, 424, 246, 432, 434, and/or 442 are located), which inner portion may be referred to herein as a channel. For example, filters can limit or prevent dust or rocks from entering the inner portion and damaging the heat sink fins. Additionally or alternatively, the seal can reduce an accumulation of sand or other debris into the outer portion of the module enclosure 412, which may be where important system modules 438*a*-438*d* may be disposed.

As shown, the air vents 416, 430 are formed (e.g., molded) as part of the upper and lower enclosures 410, 414, respectively. However, in some examples, the air vents are coupled to the upper/lower enclosures. The upper/lower enclosures can include coupling elements (e.g., screws, pins, snaps, adhesives, and/or the like) that couple the upper/lower enclosures to the module enclosure 412. The coupling elements may be configured to be manually adjusted, such as wingnuts, winged screws, and the like.

The module enclosure 412 can be a housing configured to enclose or house one or more of the hardware elements described herein or other hardware components that might benefit from the described configuration. The module enclosure 412 can be configured to protect internal elements of the RF system 402 from harsh weather conditions, environmental hazards, wildlife interference, electromagnetic interference ("EMI"), and the like. The module enclosure 412 can be generally symmetrical about one or more axes. For example, the module enclosure 412 may exhibit substantial reflectional and/or rotational symmetry about an axis parallel to an orientation of major surfaces of one or more of the directional antennas 406*a*-406*b*, such as a generally vertical axis. The module enclosure 412 can generally comprise a shape of a portion of a rectangular prism (e.g., as shown in FIG. 4A), a triangular prism, a cylinder, or some other regular polyhedron. The module enclosure 412 may comprise one or more regular shapes and/or irregular shapes.

The upper enclosure 410, module enclosure 412, and lower enclosure 414 making up the main housing of the RF system may generally be comprised of rigid or strong material, such as metal. The main housing may generally be comprised of aluminum, but may also incorporate aspects made of other materials, such as plastic or rubber. The main housing may be made of a material, or include coatings, to generally protect internal components from EMI, weather, and/or other adverse conditions.

Each of the directional antennas 406*a*-406*b* can comprise a generally elongate and/or planar shape. For example, the directional antennas 406*a*-406*b* can have major surfaces that are opposite one another and that each have a generally rectangular shape. Other shapes of the major surfaces are possible, such as triangular, pentagonal, otherwise polygonal, circular, ovular, or irregular shapes that may include a combination of two or more shapes. Edges of each of the directional antennas 406*a*-406*b* can meet adjacent or neighboring edges at a point or along a smooth (e.g., curved) connection. As shown in FIG. 4A, for example, the connections may be curved. In some embodiments, the directional antennas 406*a*-406*b* have major surfaces shaped like organic objects, such as a shark's fin and/or bird's wing.

The major surfaces of the directional antennas 406*a*-406*b* can be covered in a protective coating and/or covering. Such protection can help protect the directional antennas 406*a*-406*b* from outdoor elements, such as the sun, adverse weather conditions, wildlife, and the like. The coating and/or covering may be configured to promote proper and/or enhanced reception and/or transmission of RF signals, or otherwise, limit interference or a reduction in the reception and/or transmission of RF signals. For example, a covering may include a plastic covering, a rubber covering, a fiberglass covering, or the like. Additionally or alternatively, the protective coating and/or covering may help obscure the directional antennas 406*a*-406*b* from being detected by human or animal senses, or even automated sensing technologies.

The directional antennas 406*a*-406*b* can be configured for rapid transport and deployment. For example, the directional antennas 406*a*-406*b* can be dimensioned such that an ordinary human being can lift and transport them. Additionally or alternatively, the directional antennas 406*a*-406*b* may be configured to be assembled without requiring additional tooling. Each of the directional antennas 406*a*-406*b* may be couplable to and/or decouplable from the module enclosure 412 (as shown in FIG. 4A) or some other portion of the RF system 402. For example, each of the directional antennas 406a-406b may be couplable to the RF system 402 via a snap fit, a friction fit, a threaded fit, an adhesive, a sliding mechanism (e.g., using gravity and corresponding physical structures to hold the directional antennas in place), and/or a press fit.

As shown, each of the directional antennas 406a-406b is coupled to the RF system via respective antenna mounts 420a-420b. The antenna mounts 420a-420b can include one or more coupling points between each of the directional antennas 406a-406b and the rest of the RF system 402 (e.g., the module enclosure 412). Each of the one or more coupling points can have one or more degrees of freedom. Each degree of freedom can reflect an ability of the respective directional antennas 406a-406b to rotate about or translate along one or more axes. For example, each coupling point can have up to 6 degrees of freedom in some embodiments. As shown, the antenna mounts 420a-420b include a single coupling point and two degrees of freedom: a first degree of freedom associated with an angular rotation and a second degree of freedom associated with axial translation. The axial translation may allow the respective directional antenna 406a-406b to be extended further from and/or moved closer to the module enclosure 412. Other arrangements are possible, some of which are described with respect to FIG. 5E below.

Each of the directional antennas 406a-406b may be associated with a respective range of motion, such as an angular range of motion relative to a default position of each of the respective directional antennas 406a-406b. For example, each of the directional antennas 406a-406b can have a range of motion of about 0 degrees, about 2 degrees, about 4 degrees, about 5 degrees, about 8 degrees, about 10 degrees, about 12 degrees, about 15 degrees, about 20 degrees, about 30 degrees, about 35 degrees, about 40 degrees, about 45 degrees, about 50 degrees, about 60 degrees, any angular value therein, or fall within any range having endpoints therein. For example, in some embodiments an angular range of each of the directional antennas 406a-406b is about 0 degrees to about 30 degrees. Other ranges of motion (or ranges thereof) are possible. The measured angle may comprise an angle of elevation or tilt as compared to a plane the RF system is stationed on (which may be the same as a line perpendicular or normal to a side surface of the RF system on which the antenna is mounted, if the RF system is mounted level).

The RF system 402 can additionally or alternatively include one or more direction finders 408. The direction finder 408 can be disposed on a top surface of the RF system 402, such as on a top surface of the upper enclosure 410 and/or of the air vents 416. The direction finder 408 may be disposed elsewhere in other embodiments, such as extending from the module enclosure 412 or a bottom surface of the RF system 402. The direction finder 408 can include a directive antenna and/or a receiver. The direction finder 408 may be configured to be pointed in one or more directions (e.g., including 360° around the RF system 402). While in a particular direction, the direction finder 408 can identify a received RF signal strength. In some embodiments, only a magnitude of the signal is used to determine the direction of an RF transmitter. Additionally or alternatively, the direction finder 408 may be able to automatically determine a direction of the RF transmitter using other variables, such as a change in signal strength. Data collected via the direction finder 408 can be used alone, or in tandem with data collected via one or more directional antennas (e.g., directional antennas 406a-406d), to determine a location where the detected signal is being emitted from.

The direction finder 408 may include a motor configured to automatically adjust an orientation of the direction finder 408. The direction finder 408 may be able to use knowledge of the direction finder 408 radiation pattern to improve its own accuracy, such as using a trained machine learning model described herein.

The direction finder 408 may comprise a Doppler system coupled to an omni directional antenna that is configured to be rotated along a circumference of a circle. In such embodiments, as the direction finder 408 moves toward the RF source, doppler shift will increase the received frequency, but when the direction finder 408 moves away from the RF source, the received frequency will decrease as the direction finder 408 moves away from the RF source. The change in frequency can be used to determine the direction of the RF source. The change in frequency may be calculated by demodulating the RF signal (e.g., frequency modulation ("FM") demodulation).

In some embodiments, a plurality of antennas may be used in the direction finder 408, and may be used along an array pattern (e.g., in a circle) on the direction finder 408. Each of the plurality of antennas may be sampled in a pattern (e.g., successively about a circle).

The direction finder 408 may use a mono-pulse or sum-difference technique. A plurality of antennas of the direction finder 408 may be connected to generate a sum and difference signal along a target angular range (e.g., 180°, 270°, 360°, and/or the like). The RF system 402 may calculate a ratio of the sum and difference signals based on the sum and difference patterns. Based on this information, the RF system 402 may determine a direction of the RF transmitter. Additionally or alternatively, the direction finder 408 may identify phase information to determine a side of the sum pattern associated with the RF transmitter. This approach may have advantages by allowing the direction finder 408 to determine the direction of a transmitter after receiving one pulse, which may be only a few microseconds in duration.

The direction finder 408 may include an omnidirectional antenna. In some embodiments, the omnidirectional antenna may include two or more crossed loop antennas. An array of omnidirectional antennas may be used to form an array (e.g., Adcock array) to more accurately and/or quickly identify an RF source. Other arrangements are possible.

The RF system 402 can include one or more mounting surfaces 448. As shown, the mounting surface 448 is on a bottom surface of the lower enclosure 414, but a mounting surface 448 may be disposed elsewhere. The mounting surface 448 can be configured to mount to another modular assembly and/or to a mount, such as a tripod or other mounting system. The mounting surface 448 may be on an underside of an air vent 430 (shown in FIG. 4B). In some cases. the mounting surface 448 may include the area surrounding the air vent 430 on the lower enclosure 414.

The RF system 402 can include other features, such as a control panel 422. The control panel 422 may include one or more buttons, levers, and/or interface elements that can allow a user to view and/or modify details related to the RF system 402. For example, the control panel 422 may include an indicator that indicates a status of the RF system 402 (e.g., on/off, active/inactive, transmitting/receiving, and/or the like). In some embodiments, the control panel 422 can include a touchscreen interface, such as a graphical user interface. A user may be able to modify a status of the RF system 402 using the touchscreen. In some embodiments, the control panel 422 can include options to turn the RF system 402 off or on. In some embodiments, the control panel 422 can include options to activate a "search mode" described herein and other specialized or custom operating modes. For example, one or more of the directional antennas (e.g., directional antennas 406a-406d) can be deactivated or activated.

The RF system 402 may have a total height (e.g., length) of between about 20 cm and about 180 cm. The RF system 402 may have a total weight of between about 10 kg and about 75 kg.

Figure 4B:
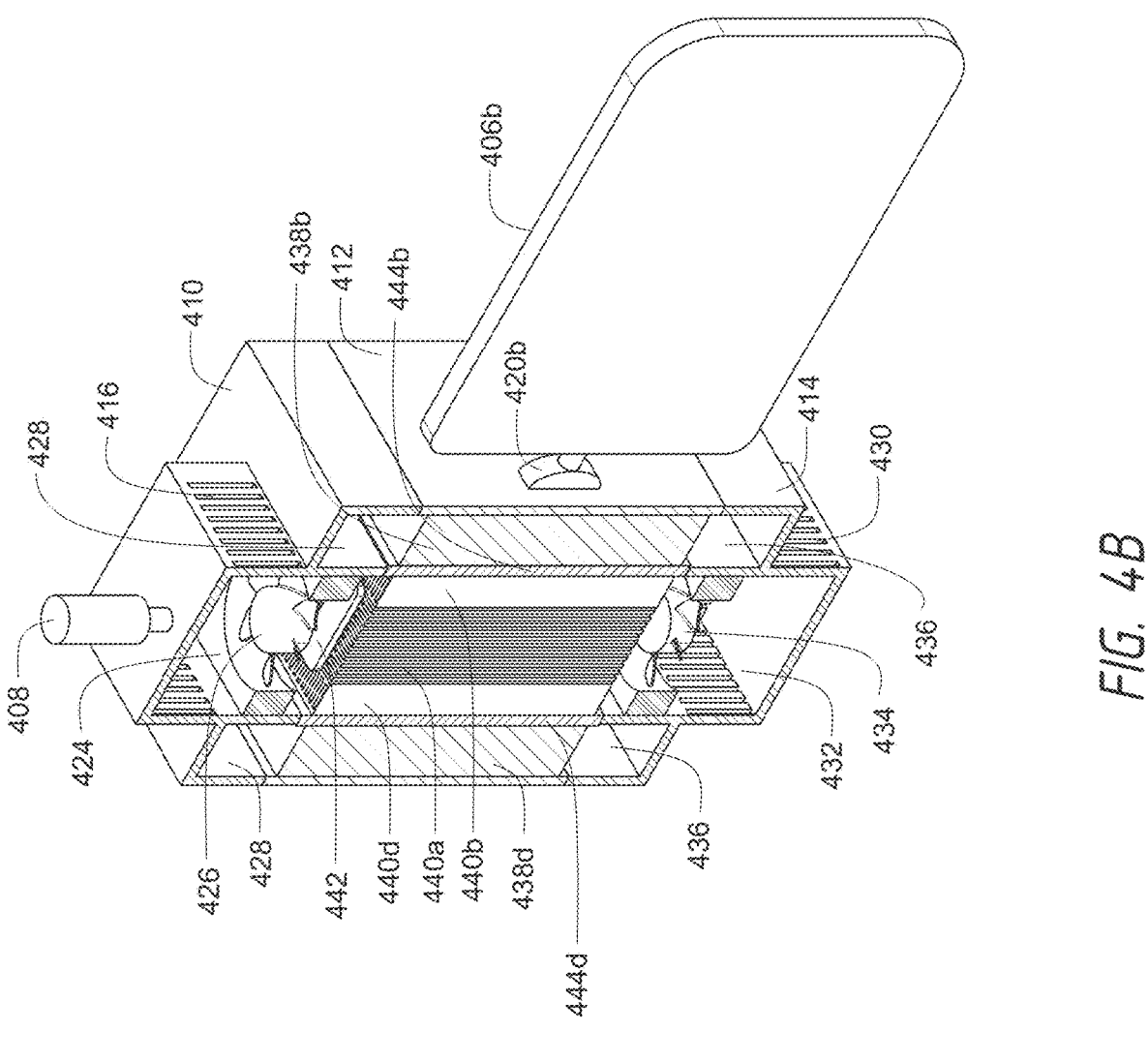
FIG. 4B illustrates a cross-section along a vertical plane of the perspective view of the example implementation of the RF system of FIG. 4A.

FIG. 4B illustrates a cross-section along a vertical plane of the perspective view of the example implementation of the RF system of FIG. 4A. The RF system 402 can include an upper enclosure vent cavity 424 within the air vents 416, one or more upper enclosure cavities 428, one or more lower enclosure cavities 436, and a lower enclosure vent cavity 432 within the air vent 430. One or more of the upper enclosure cavity 428, and/or the lower enclosure cavity 436, may generally form a loop about a central or inner portion of the RF system 402 (e.g., of the module enclosure 412). The inner portion may generally include a portion of the RF system 402 that is disposed within a plurality of internal structures, such as walls or even the thermal interfaces 444a-444d. In some embodiments, the upper enclosure cavity 428 and/or the lower enclosure cavity 436 can be a part of the inner portion of the RF system 402 and may help provide additional space for air flow so that system modules 438a-438d can be cooled. For example, in such a configuration, the surface adjacent the system modules 438a-438d of the upper enclosure cavity 428 and/or the lower enclosure cavity 436 can be sealed.

The RF system 402 can house one or more cooling fans, such as an upper enclosure fan 426 and/or a lower enclosure fan 434. The upper enclosure fan 426 may be disposed generally within the upper enclosure 410 and/or the upper enclosure vent cavity 424. The upper enclosure fan 426 may be disposed near the air vent 416 to promote the flow of heated air out of the interior of the RF system 402 via the air vent 416. Additionally or alternatively, the lower enclosure fan 434 may be disposed generally within the lower enclosure vent cavity 432 and/or within the lower enclosure cavity 436. The lower enclosure fan 434 may be disposed near the air vent 430 to promote the flow of heated air out of the air vent 430. The lower enclosure fan 434 may be configured to draw air into the air vent 430 and push air upward through the heat sinks 440a-440d within the inner portion and out of the air vent 416. The upper enclosure fan 426 may be configured to draw air in the same direction as the lower enclosure fan 434. Additionally or alternatively, the upper enclosure fan 426 and the lower enclosure fan 434 may be configured to rotate in the same direction. Drawing air into and upward within the inner portion may be beneficial as it works in coordination with a natural flow of warmer air relative to the surrounding air. Additionally this arrangement can cause air to exit through the air vent 416, which may also help reduce an amount of sand or other debris from entering the inner portion and/or the outer portion of the RF system 402. In some embodiments, it might be beneficial to create a positive pressure system (e.g., both fans blow air into the internal portion of the RF system 402). In some embodiments, it might be beneficial to create a negative pressure system (e.g., both fans blow air out of the internal portion of the RF system 402).

One or more system modules 438a-438d may be housed within at least a portion of the module enclosure 412. As shown in FIG. 4B, the system modules 438a-438d are disposed within an outer portion of the interior of the module enclosure 412. The outer portion generally surrounds the inner portion of the RF system 402. The outer portion may include wiring or other data/power connections that couple the one or more system modules 438a-438d among one another as described herein (e.g., in FIG. 6). To enable the wiring or other data/power connections, the upper enclosure cavities 428, lower enclosure cavities 436, and module enclosure cavities 446 can include openings through which wires may run, and/or printed circuit board ("PCBs") may be located, to link together the various modules, fans, control panels, and external connections (e.g., connections to antennas, direction finder, external power, and/or the like). The external connections can include various ports and associated connectors for connecting data and/or electrical communication between components outside the module enclosure (e.g., antennas, direction finder, external power, and/or the like) and components inside the module enclosure (e.g., the various modules). The ports can allow for power cables and/or wires to plug into, and can provide a water-proof or other weather-resistant seal. The system modules 438a-438d can include a RF module 438a, a SOM module 438b, a RF module 438c, and a power supply module 438d. Other modules are possible. The description below that references particular modules and aspects of the RF system may be understood to similarly apply to other implementations of those modules and aspects.

The RF module 438a can include, for example, an amplifier and/or a multiplexer. The RF module 438a can be in communication with and/or otherwise coupled to a corresponding directional antenna 406a (not shown in FIG. 4B). The RF module 438a can include a multi-channel (e.g., four channel) power amplifier that is configured to amplify the RF signal output by the directional antenna 406a. The power amplifier may operate on frequencies between about 70 MHz and about 6 GHz. The RF module 438a can be configured to output at least about 20 W of radio signal per channel. The multiplexer can switch between a transmit mode and a receive mode. Additionally or alternatively, the multiplexer can modulate transmitted signals according to a target signal amplitude and/or frequency. Multiplexing may be accomplished in combination with one or more other elements of the RF system 402, such as the SOM module 438b (see, e.g., discussion of the SOM module 538b of FIG. 6). The multiplexer can include a receiving channel switch matrix that allows the RF module 438a to multiplex a current function of the associated directional antenna 406a. The RF module 438c can include one or more features describe above. The RF module 438c may be coupled to the directional antenna 406b in one or more ways described above for how the RF module 438a is coupled to the directional antenna 406a.

As noted above, the RF system can include one or more processing modules. The processing modules may comprise system-on-module ("SOM") aspects, and may thus be referred to herein as "SOM modules". The SOM module 438b can include an integration of digital and analog functions on a single processing board. The SOM module 438b can include a processor, memory, computer executable code, and/or other elements configured to perform certain functions described herein. In some embodiments, the SOM module 438b can include a trained machine learning model that has been trained to identify target RF signals that may come from a source of interest. A trained machine learning model may additionally or alternatively be stored in one or more other components described herein. The SOM module 438b may include a software defined radio ("SDR") transceiver that is configured to perform one or more functions traditionally performed by different kinds of hardware (e.g., signal mixing, signal filtering, signal amplification, signal modulation and/or demodulation, signal detection, and/or the like). The SOM module 438b can receive one or more attributes of an RF signal from one or more elements of the RF system 402 (e.g., from the directional antenna 406a and/or the directional antenna 406b) and determine a source direction (e.g., from the direction finder 408, the directional antennas, and/or via communications with other aspects of the operating environment 100 as described above), a source amplitude, a source frequency, a source identifier, and/or another aspect of the source. Based on one or more of the source direction, source amplitude, source frequency, and/or source identifier, the SOM module 438b uses an ML model to determine a type of target, and determine one or more signals to transmit to the target object. Further, the SOM module 438b can transmit instructions and/or data related to one of those aspects to another element of the RF system 402, an element of a different RF system 402, and/or a remote computing device (e.g., a remote server). Thus, the SOM module 438b can help identify a source and/or transmit information based on that identification. In some embodiments, the SOM module 438b can modify a direction, amplitude, frequency, and/or other attribute of an RF signal transmitted by the directional antennas 406a-406b. In some embodiments, the RF system 402 can modify a direction the transmitted RF signal based on the identified attribute of a received RF signal. The directional antennas 406a-406b may be configured to receive signals at a relatively high bandwidth and/or angular arc in order to identify a source signal. Additionally or alternatively, the directional antennas 406a-406b may be configured to transmit RF signals at a relatively narrower or more precise bandwidth and/or angular arc in order to interfere with or disrupt a target source signal or hardware that is emitting the source signal. In some embodiments the primary receiving and/or transmitting angular arc of one of the directional antennas may be between about 80° (80 degrees) and about 110° (110 degrees) but other arcs are possible.

The power supply module 438d can provide one or more of the other system modules 438a-438c and/or other elements of the RF system 402 with sufficient power to perform their respective functions. The power supply module 438d can include and/or be coupled to a power source (e.g., a battery, grid power, generated power). The power supply module 438d can be coupled to an external and/or internal power source (e.g., in some embodiments the RF system includes an internal battery power source that provides power to the components of the RF system via the power supply module(s)). The power supply module 438d can convert power from one character to another. For example, the power supply module 438d may convert AC power to DC power, and can output DC power in multiple voltages and amperages as needed by the various components of the RF system 402. Additionally or alternatively, the power supply module 438d can output at least 1200 W of power at a voltage of between about 16-50 V. Additionally or alternatively, the power supply module 438d can output at least 25 A of power. The power supply module 438d may be configured to transmit data to and/or from one or more of the other system modules 438a-438c. In some embodiments, the power supply module 438d may be replaced with another system module and the RF system 402 can be connected to power via an electrical wire or to another source of power (e.g., another RF system).

The system modules 438a-438d and power/data communication may be disposed at least partly or completely within the outer portion of the RF system 402. Because each of the system modules 438a-438d may produce heat that may need to be released to the atmosphere, having this outer portion arrangement can allow air to flow through the inner portion of the RF system 402. Inside the inner portion, the RF system 402 can include one or more heat sinks 440a-440d configured to allow heat from the system modules 438a-438d to be transfer from the system modules 438a-438d to the one or more respective heat sinks 440a-440d. Each of the system modules may comprise a respective housing, which may be made of a thermally conductive material, such as metal. One or more of the heat sinks 440a-440d may be disposed at least in part within the inner portion of the module enclosure 412. The heat sinks 440a-440d can be thermally coupled to (e.g., adjacent to) corresponding thermal interfaces 444a-444d. Each of the thermal interfaces 444a-444d can be coupled to corresponding one or more system modules of the system modules 438a-438d. For example, the thermal interface 444a may be thermally coupled to the RF module 438a, and the thermal interface 444b may be thermally coupled to the SOM module 438b. The thermal interfaces can be made of a thermally conductive material, such as metal. Each of the heat sinks 440a-440d can be shaped to increase the radiation of heat therefrom and/or to allow increased air flow therethrough to promote the transfer of heat away from any corresponding elements via convection, conduction, and/or radiation. For example, one or more of the heat sinks 440a-440d can include a zipper fin shape. A zipper fin shape can include a plurality of peaks and valleys, which can provide high heat transfer while providing high structural integrity. The heat sinks 440a-440d can include, for example, a plurality of metal (e.g., copper, aluminum, iron, and/or the like) fins. In some embodiments, each of the fins is plated in a corrosive-resistant layer, such as a metal (e.g., nickel plating). The upper enclosure fan 426 and/or the lower enclosure fan 434 may help promote the movement of air through the central portion of the RF system 402 to improve heat transfer away from the system modules 438a-438d. In some embodiments, the RF system 402 includes a plug 442 that can promote air flow through the heat sinks 440a-440d, such as by directing airflow through a structure of the heat sinks 440a-440d instead of through a gap in between the 4 heat sinks 440a-440d. The plug 442 may be disposed on an axis of the RF system 402. In some embodiments, the system modules can comprise additional thermal managing features to direct heat to a surface that is touching thermal interfaces 444a-444d. The system modules can also include a thermal paste or material that is placed between the thermal interfaces 444a-444d and the adjacent surface of corresponding system modules to improve heat transfer efficiency.

Figures 4C, 4D:
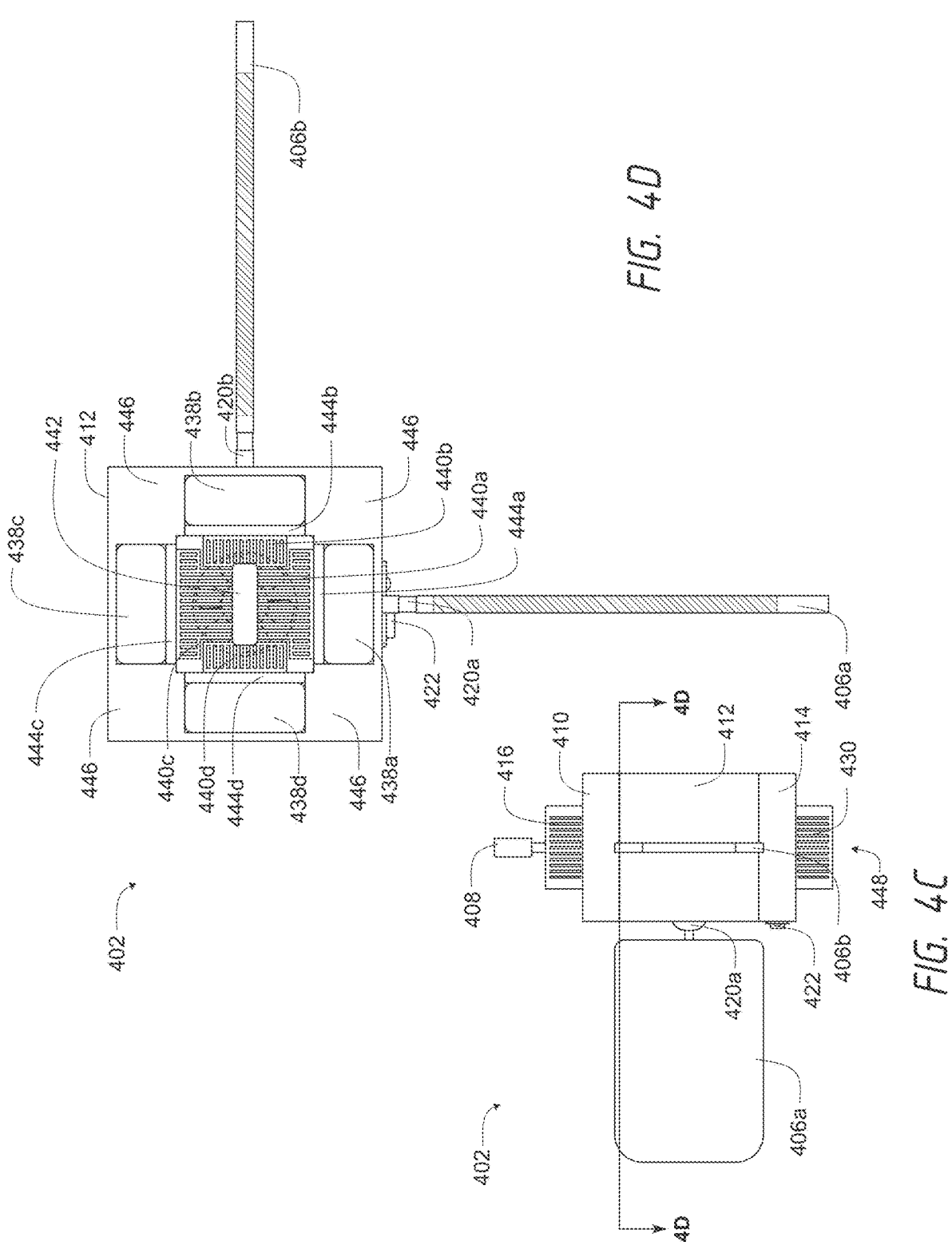
FIG. 4C illustrates a side view of the example implementation of the RF system of FIG. 4A.
FIG. 4D illustrates a top view of a cross-section along a horizontal plane of the example implementation of the RF system of FIG. 4C.

FIG. 4C shows a side view of the RF system 402 shown in FIG. 4A. FIG. 4D shows a cross section of a top view of the RF system 402 of FIG. 4A, along the section 4D shown in FIG. 4C. As shown in FIG. 4D, the RF system 402 can include one or more module enclosure cavities 446. The module enclosure cavities 446 can include communication links (e.g., wiring) and/or other elements described herein.

As shown in FIG. 4D, one or more of the heat sinks 440a-440d (e.g., heat sink 440a and heat sink 440c) may have longer (or otherwise higher-surface-area) heating elements (e.g., fins) than others of the heat sinks 440a-440d (e.g., heat sink 440b and heat sink 440d). Heating elements with larger surface area may promote improved heat transfer and/or dissipation. Accordingly, system modules 438a-438d, such as the RF module 438a and the RF module 438c, may produce higher amounts of heat and therefore be coupled to corresponding heat sinks (heat sink 440*a* and heat sink 440*c*) with larger surface areas than the other combined heat sinks.

Figure 5A:
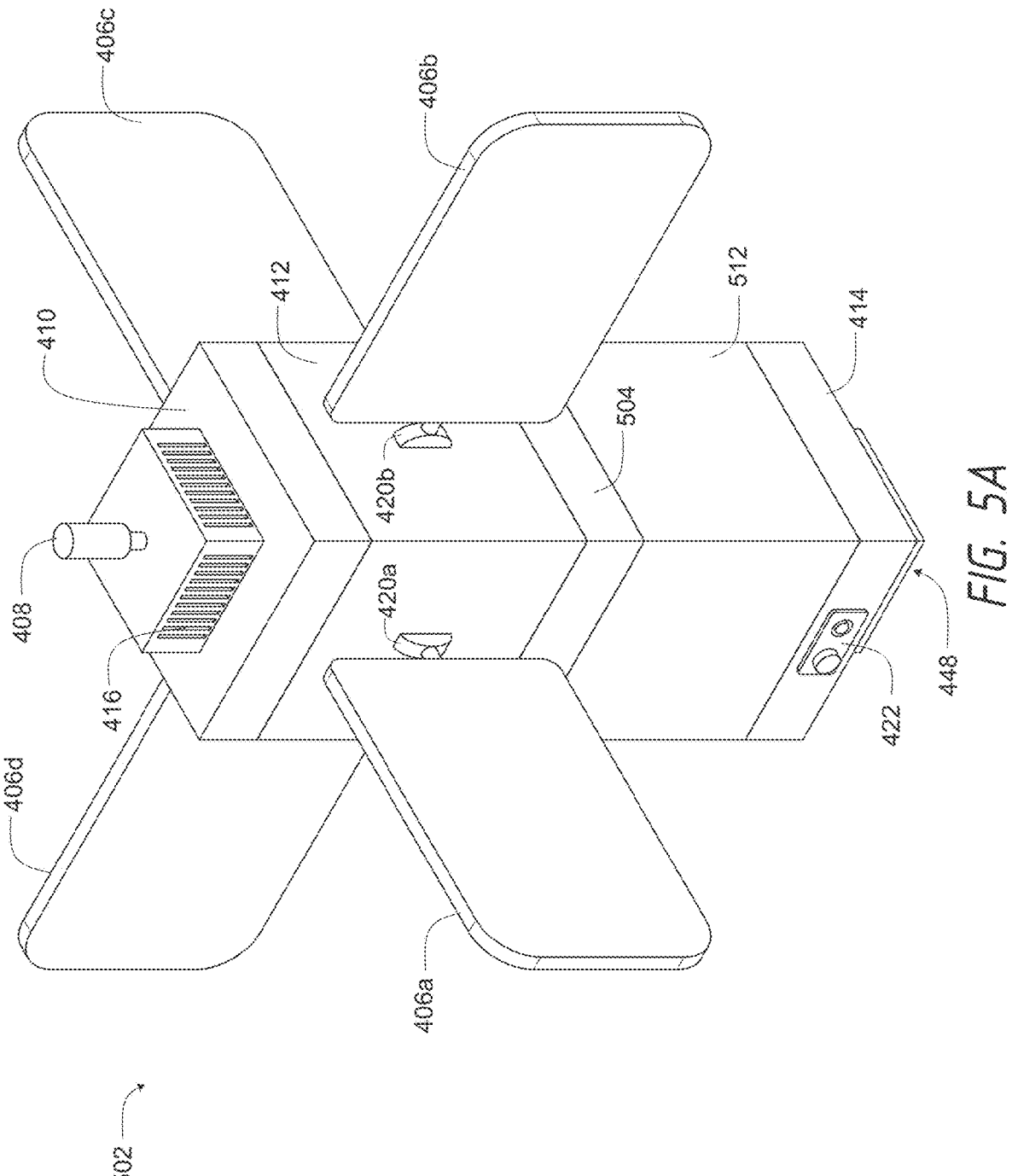
FIG. 5A illustrates a perspective view of an example implementation of an RF system comprising two module enclosures, according to various embodiments of the present disclosure.

FIG. 5A illustrates a perspective view of an example implementation of an RF system comprising two module enclosures, according to various embodiments of the present disclosure. The illustrated implementation includes an RF system 502 (which may correspond to the RF system 102 described above, in an implementation having a two module enclosures) comprising an upper enclosure 410, a module enclosure 412, a joining enclosure 504, a second module enclosure 512, a lower enclosure 414, directional antennas 406*a*-406*b*, and a direction finder 408. The module enclosure 512 may include one or more features of the module enclosure 412. The module enclosure 512 can be disposed between the joining enclosure 504 and the lower enclosure 414. Additionally or alternatively, the module enclosure 412 can be disposed between the upper enclosure 410 and the joining enclosure 504. The RF system 502 can be represent a double or dual modular assembly. Other RF systems 502 can comprise a triple, quadruple, or higher-order modular assembly, in some embodiments. Higher-order modular assemblies can include additional module enclosures and joining enclosures between neighboring or consecutive module enclosures. Higher-order modular assemblies can also optionally include additional directional antennas. As noted above, the RF system 502 can be configured to be assembled manually. For example, a user may be able to convert the RF system 402 (e.g., single modular assembly) into the RF system 502 (e.g., double modular assembly) without the need for machinery or certain tools (e.g., uncommon tools).

The joining enclosure 504 can include coupling elements (e.g., screws, pins, snaps, adhesives, and/or the like) that couple the modular enclosures to the joining enclosure. The coupling elements may be configured to be manually adjusted, such as wingnuts, winged screws, and the like.

The RF system 502 may have a total height (e.g., length) of between about 30 cm and about 250 cm. The RF system 502 may have a total weight of between about 35 kg and about 100 kg.

Figure 5B:
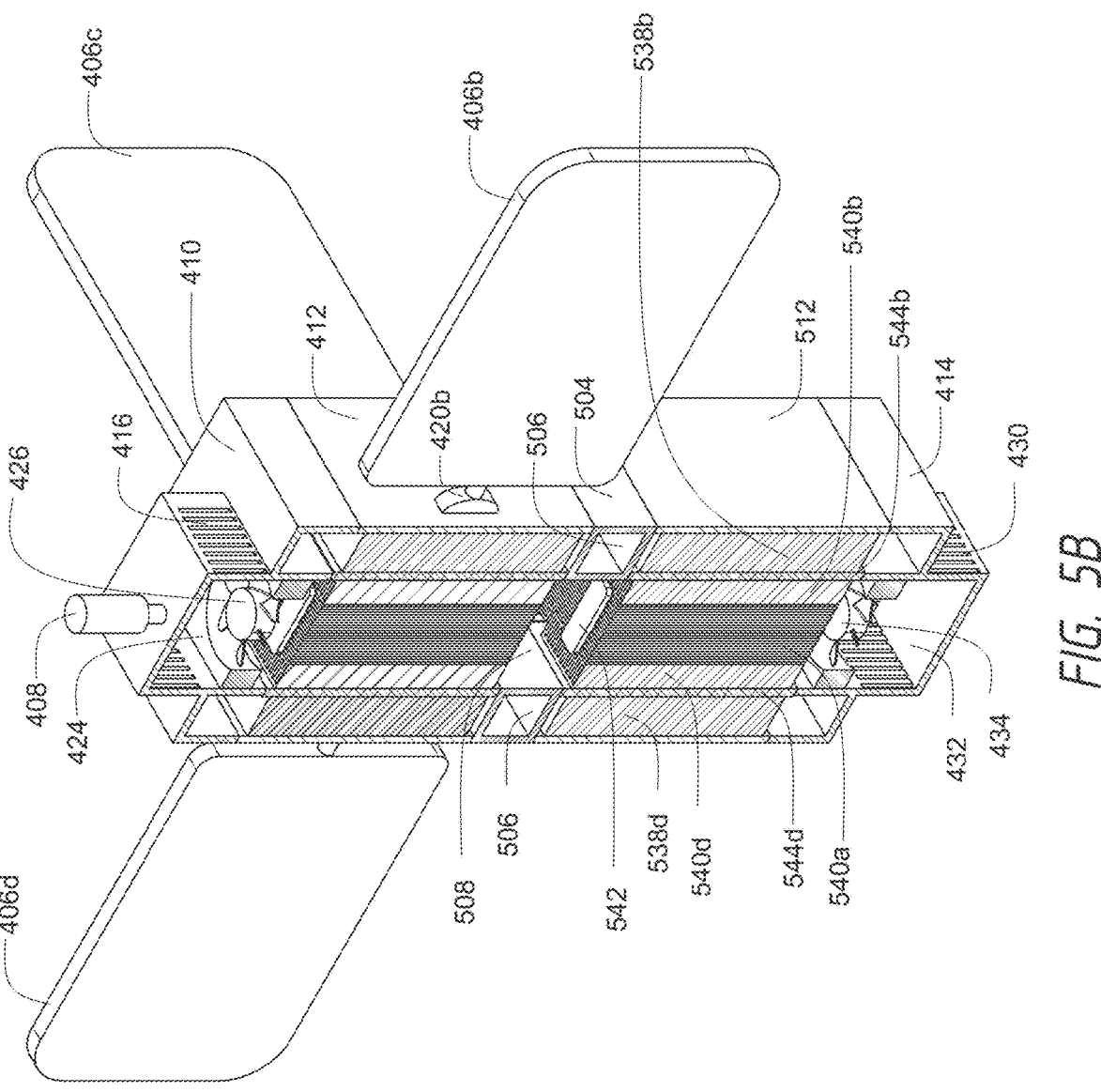
FIG. 5B illustrates a cross-section along a vertical plane of the perspective view of the example implementation of the RF system of FIG. 5A.

FIG. 5B illustrates a cross-section along a vertical plane of the perspective view of the example implementation of the RF system of FIG. 5A. Within the joining enclosure 504 one or more joining enclosure cavities 506 and joining enclosure vent cavity 508 may be included. The joining enclosure cavities 506 can be discrete or may be joined into a single cavity. In some embodiments, the joining enclosure cavity 506 forms a cavity surrounding the central portion (e.g., along a vertical axis) of the RF system 502. Additionally or alternatively, the upper enclosure 410 and/or the lower enclosure 414 may each form respective cavities surrounding the central portion of the RF system 502. The joining enclosure vent cavity 508 may comprise a portion of the inner portion of the RF system that may provide a channel for air flow through inner portion (e.g., through the inner portion of the module enclosure 512, the joining enclosure vent cavity 508, and the inner portion of the module enclosure 412).

The second module enclosure 512 can include therein one or more components that are included in the module enclosure 412 of the RF system 402 described above. The module enclosure 512 can include one or more system modules 538*a*-538*d*, thermal interfaces 544*a*-544*d*, heat sinks 540*a*-540*d*, and/or other components described above. As shown in FIG. 5B, the module enclosure 512 houses an RF module 538*a*, a SOM module 538*b*, a second RF module 538*c*, a power supply module 538*d*, four heat sinks 540*a*-540*d*, and corresponding thermal interfaces 544*a*-544*d*. Although two enclosure fans 426, 434 are shown, more or fewer such enclosure fans may be included. The RF system 502 can further include one or more plugs 542 that serve a purpose similar to or essentially identical to the plug 442 described above.

As shown, the RF module 438*a*, the RF module 438*c*, the RF module 538*a*, and the RF module 538*c* are configured to operatively couple to corresponding directional antenna 406*a*, directional antenna 406*b*, directional antenna 406*c*, and directional antenna 406*d*. In some embodiments, each modular assembly of a multi-module assembly can be configured to provide power, control, and/or amplification/multiplexing for up to two directional antennas. Accordingly, the RF system 402 described above includes two directional antennas 406*a*-406*b* as a single modular assembly, while the RF system 502 can support up to four directional antennas 406*a*-406*d* as a double modular assembly. Each of the directional antennas 406*a*-406*d* may be oriented at approximately 90° from a consecutive directional antenna. This arrangement may help improve sensing capability (e.g., precision and/or accuracy) of a target source.

Figures 5C, 5D:
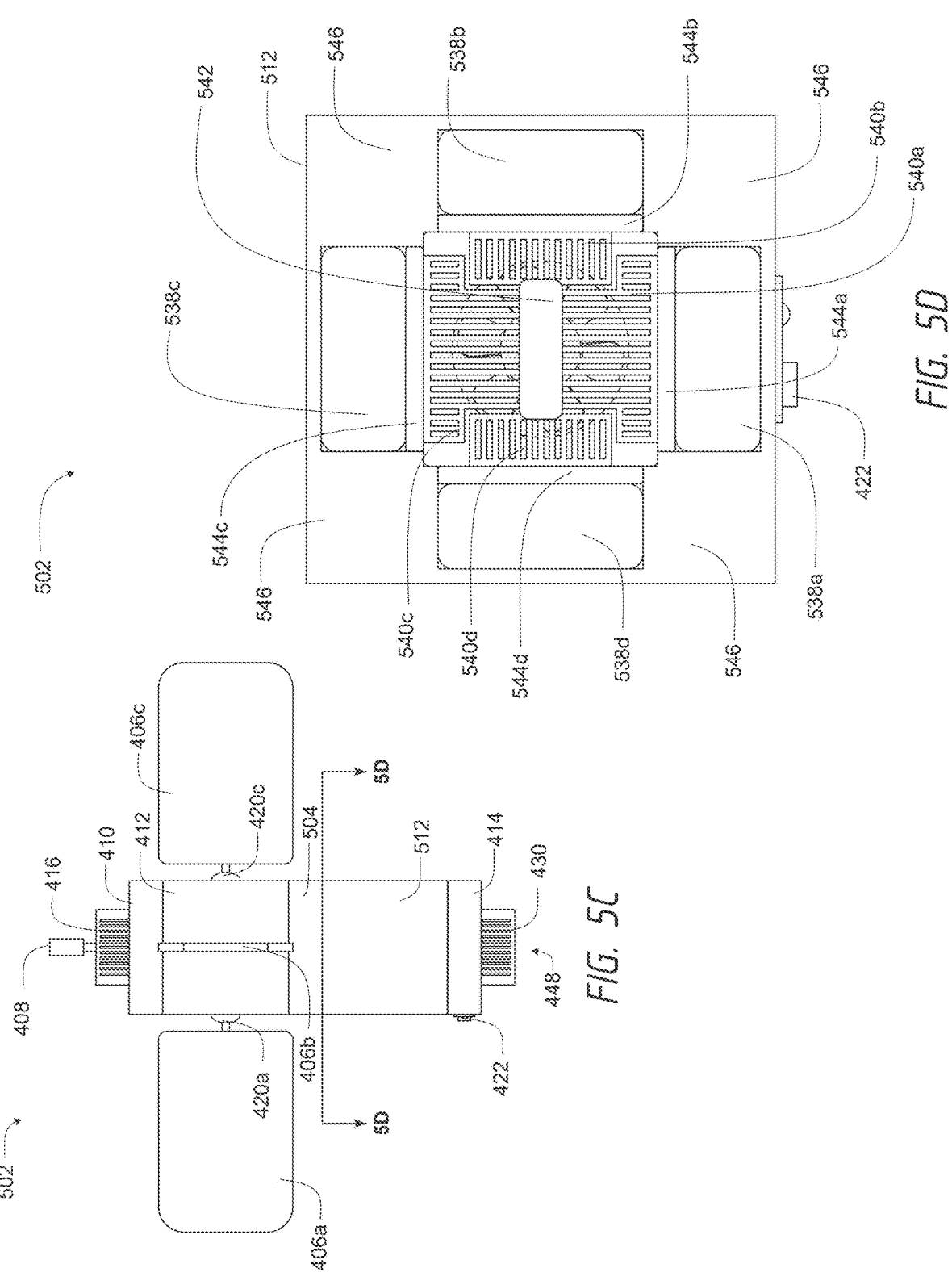
FIG. 5C illustrates a side view of the example implementation of the RF system of FIG. 5A.
FIG. 5D illustrates a top view of a cross-section along a horizontal plane of the example implementation of the RF system of FIG. 5C.

FIG. 5C shows a side view of the RF system 502 shown in FIG. 5A. FIG. 5D shows a cross section of a top view of the RF system 502 of FIG. 5A, along the section 5D shown in FIG. 5C. As shown in FIG. 5D, the RF system 502 can include one or more module enclosure cavities 546. The module enclosure cavities 546 and the joining enclosure cavities 506 can include communication links (e.g., wiring) and/or other elements described herein. For example, as noted above, to enable the wiring or other data/power connections, the upper enclosure cavities 428, lower enclosure cavities 436, module enclosure cavities 446, module enclosure cavities 546, and joining enclosure cavities 506 can include various openings and spaces through which wires may run, and/or printed circuit board ("PCBs") may be located, to link together the various modules, fans, control panels, and external connections (e.g., connections to antennas, the direction finder, external power, and/or the like).

As shown in FIG. 5D, one or more of the heat sinks 540*a*-540*d* (e.g., heat sink 540*a* and heat sink 540*c*) may have longer (or otherwise higher-surface-area) heating elements (e.g., fins) than others of the heat sinks 540*a*-540*d* (e.g., heat sink 540*b* and heat sink 540*d*). Heating elements with larger surface area may promote improved heat transfer and/or dissipation. Accordingly, system modules 538*a*-538*d*, such as the RF module 538*a* and the RF module 538*c*, may produce higher amounts of heat and therefore be coupled to corresponding heat sinks (heat sink 540*a* and heat sink 540*c*) with larger surface areas than the other combined heat sinks.

Figure 5E:
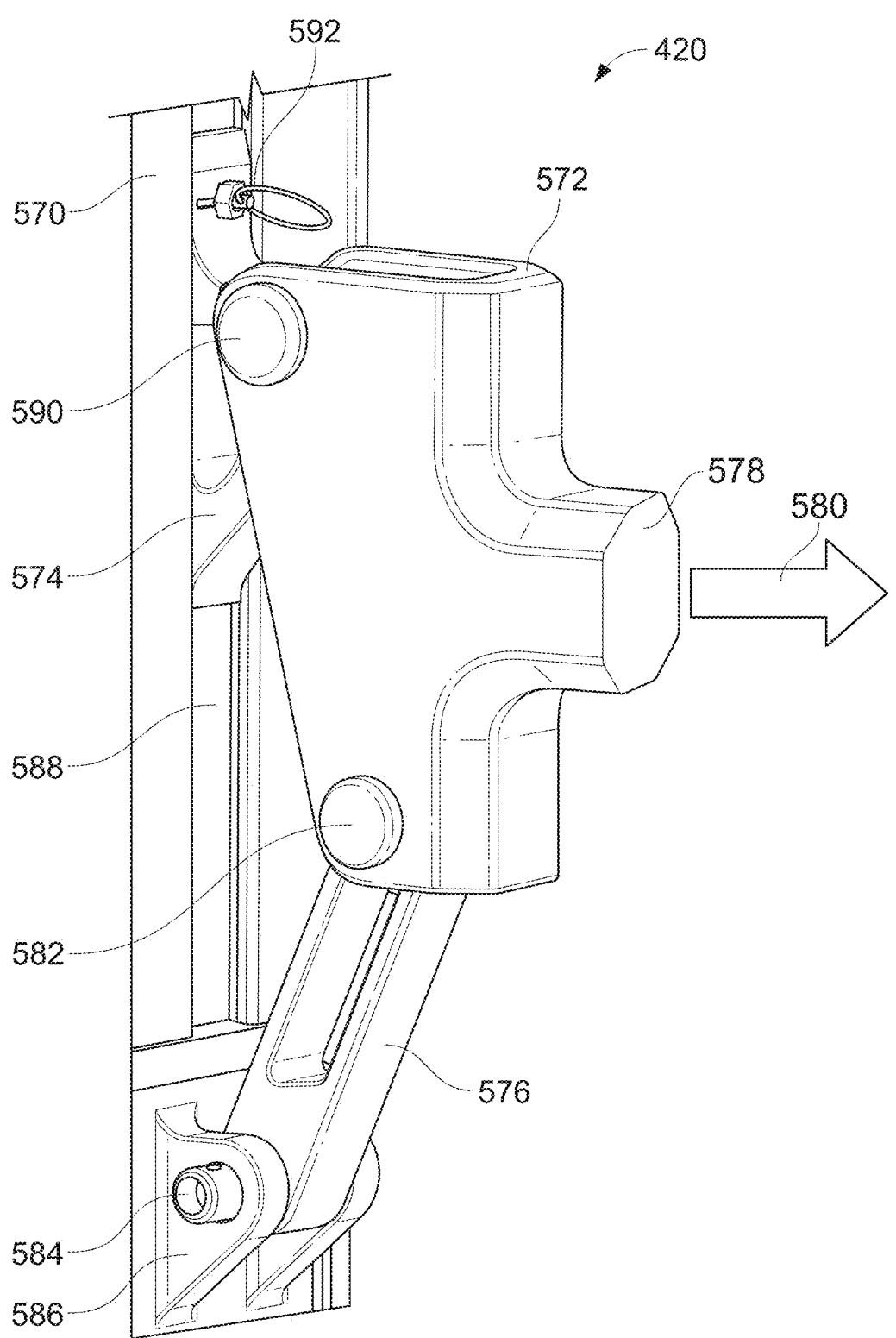
FIG. 5E illustrates a perspective view of an example implementation of an antenna mount of an RF system, according to various embodiments of the present disclosure.

FIG. 5E illustrates an example antenna mount 420, according to certain embodiments described herein. The antenna mount 420 may correspond to any of the antenna mounts 420*a*-420*b* described above. The antenna mount 420 can include an antenna bracket 572 that is mounted to a side 570 of the RF system 502 (or RF system 402). The antenna bracket 572 can include an antenna interface 578 that couples to an antenna (e.g., any of directional antennas 406*a*-406*d*). The antenna may be coupled via a coupling device (e.g., attachment device), an adhesion, or some other coupling. In some embodiments, the antenna is machined, molded, or otherwise formed with the antenna interface 578. The antenna interface 578 can define an antenna orientation 580, which can relate to an angle or tilt of the antenna. The antenna mount 420 can be configured, using the structures associated with the antenna mount 420, to modify the antenna orientation 580 (e.g., the tilt or angle of the antenna).

The antenna bracket 572 can be coupled to the side 570 via one or more coupling features. A first coupling feature can include a sliding bracket 574. The antenna bracket 572 may be coupled to the sliding bracket 574 via a pivot 590. The sliding bracket 574 can slidably couple to the side 570 via a track 588. The track 588 may be a linear track in some embodiments, for example as shown in FIG. 5E. The track 588 may allow the pivot 590 to translate parallel to the side 570 (e.g., at approximately the same distance from the side 570 during translation). Other arrangements are possible. In some embodiments, the sliding bracket 574 can be fixed in place along the track 588 via a locking pin 592. The track 588 may include one or more markings or other indicators that can indicate a particular orientation (e.g., the antenna orientation/angle/tilt 580) of the antenna associated with that indicator. The markings may indicate a degree of orientation of the antenna orientation 580 and/or associated antenna.

A second coupling feature can include a mounting bracket 576. The mounting bracket 576 can be coupled to the side 570 via a fixed mount 586. The mounting bracket 576 may be rotatably coupled to the fixed mount 586 via a pivot 584. The mounting bracket 576 may be coupled to the antenna bracket 572 via a pivot 582. The pivot 584 can allow the mounting bracket 576 to rotate about the pivot 584, thus modifying a position of the pivot 582 and/or an orientation of the antenna bracket 572, thus providing a first degree of freedom of the antenna orientation 580.

In various implementations, and as described below in reference to FIG. 9B, when coupling an antenna to a side of an RF module, initially the pivot 584 and pivot 590 may not be in place, such that the antenna bracket 572 and mounting bracket 576 are separable from the sliding bracket 574 and fixed mount 586. To couple the antenna to the RF module, the user may first insert the pivot 590 of the antenna bracket 572 into a receiving portion of the sliding bracket 574 at a first, high angle. The user may then rotate the antenna bracket 572 about the pivot 590, causing the pivot 590 to be rotatably locked into the receiving portion of the sliding bracket 574. Then, the user may insert the pivot 584 (which may comprise a locking pin), fully coupling the antenna to the side of the RF system. Thus, advantageously, the antenna may be quickly coupled to the RF system without tools. Similarly, advantageously, the antenna may be quickly removed from the RF system, without tools, by removing the pivot 584, rotating the antenna bracket 572 to a high angle, and removing the pivot 590 from the receiving portion of the sliding bracket 574.

With the two coupling features shown in FIG. 5E, a position of the antenna interface 578 may be modified in at least two degrees of freedom. A first degree of freedom may include a rotational degree of freedom, which includes rotation about the pivot 582. A second degree of freedom may include a distance of the antenna interface 578 from the side 570, based on the combination of the sliding bracket 574 and the mounting bracket 576. The coupling features may further include ports for connecting data and/or electrical communication (e.g., wires, cables) between the antenna (e.g., directional antennas 406a-406d) and modules inside the module enclosures. The ports can allow for power cables and/or wires to plug into one or more elements described herein. The ports can allow for water-proof or other weather-resistant connections.

Figure 6:
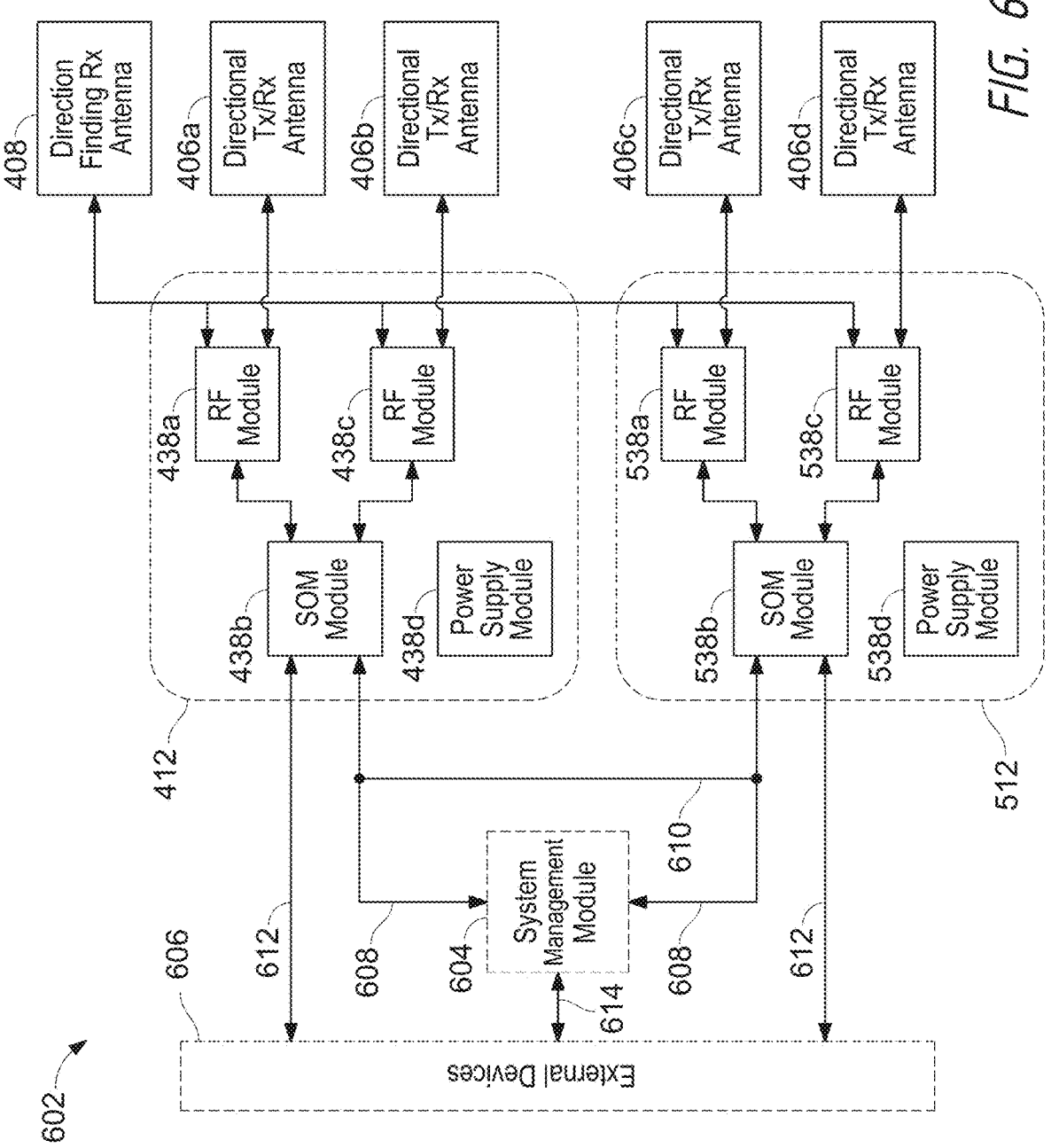
FIG. 6 illustrates a block diagram of example hardware components of an RF system, according to various embodiments of the present disclosure.
Figure 7A:
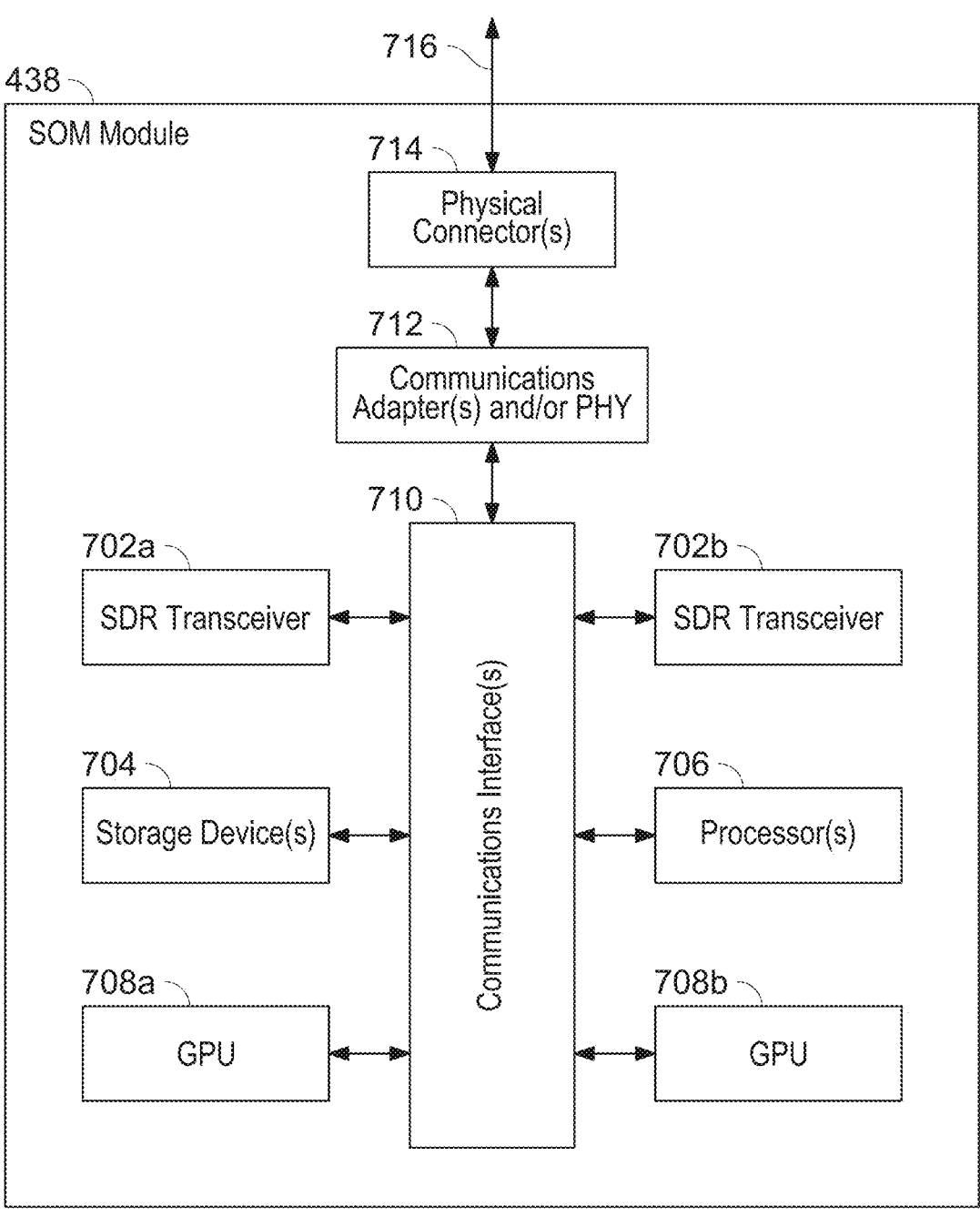
FIGS. 7A-7B and 8 illustrate block diagrams of example modules of an RF system, according to various embodiments of the present disclosure.
Figure 7B:
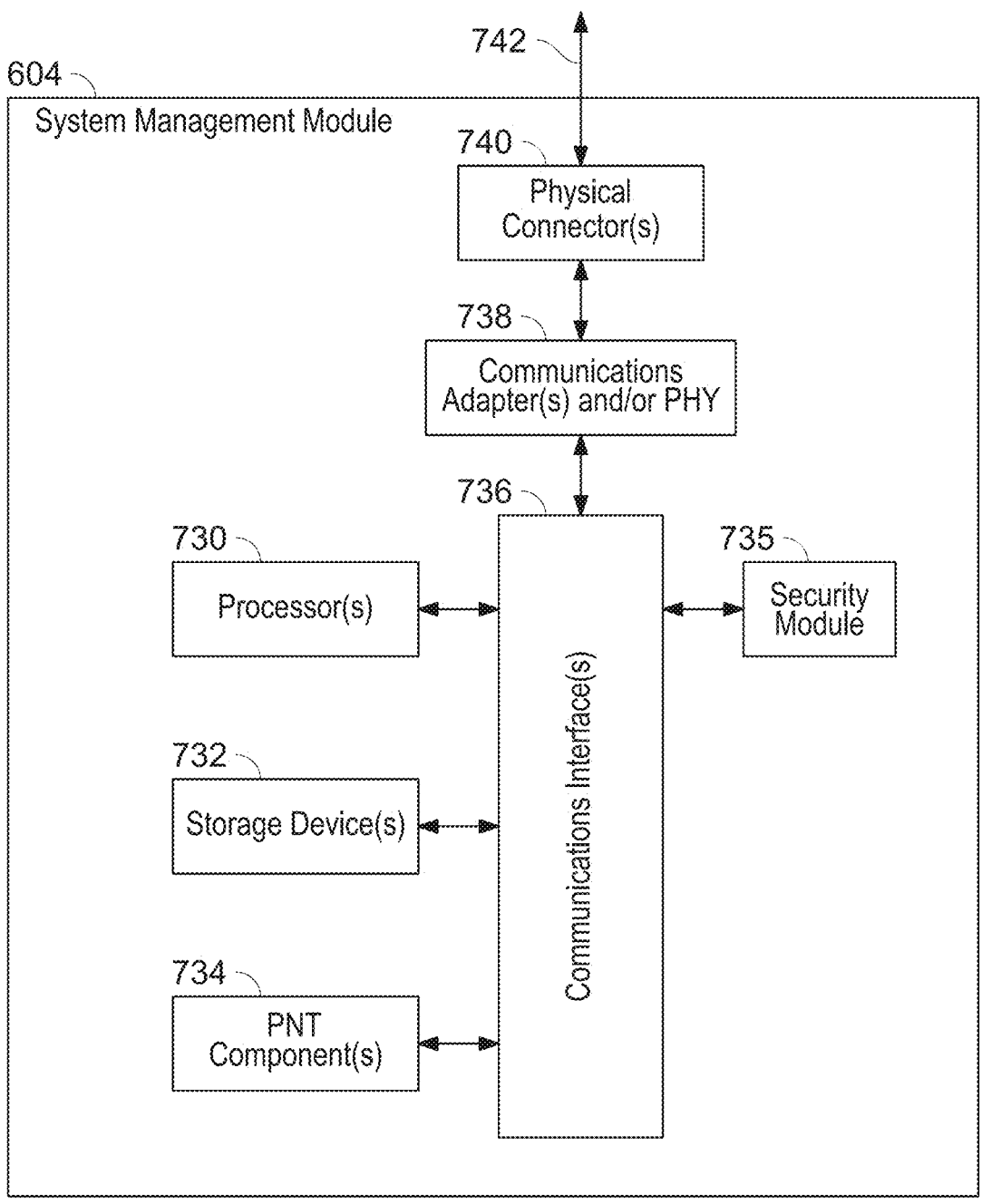
Figure 8:
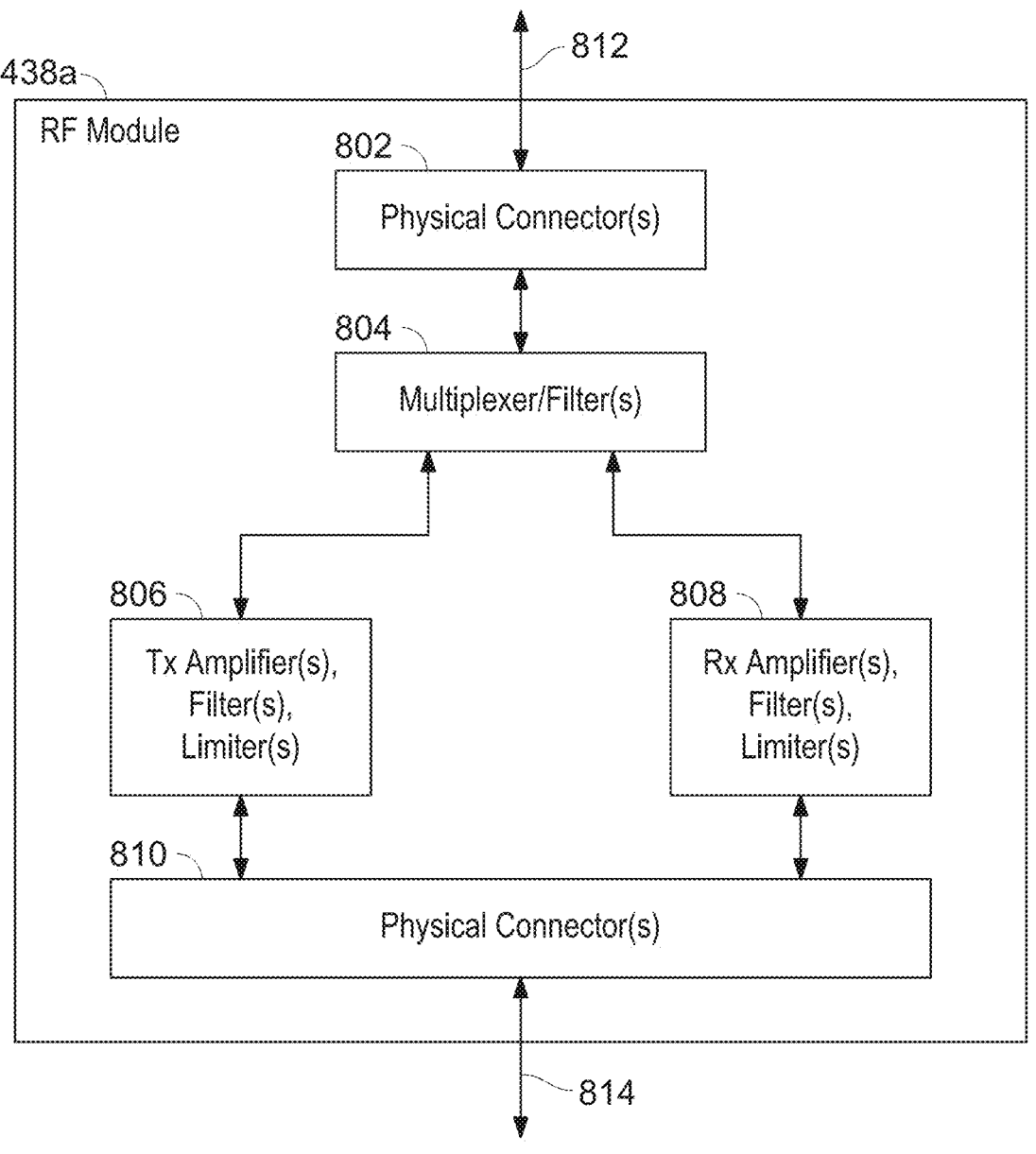

FIGS. 6-8 illustrate block diagrams of power and/or data connections, communications, and/or transfer among one or more of the system modules of the RF system (e.g., system modules 438a-438d, system modules 538a-538d), antennas of the RF system (e.g., directional antennas 406a-406d, direction finder 408), and external devices, as described above. FIG. 6 illustrates a block diagram of a system of first and second module enclosures, corresponding directional antennas, a system management module 604, and external devices. A system 602 can include the module enclosure 412, the module enclosure 512, the directional antennas 406a-406d, a direction finder 408, a system management module 604, and/or one or more external devices 606 (e.g., other RF systems, other systems or sensors, and/or the central processing server.

In various implementations, the direction finder 408 can communicate data with the RF modules 438a, 438c, 538a, and/or 538c. For example, the direction finder 408 may detect a signal source direction and communicate information related to the signal source direction (e.g., source direction, detection arc, magnitude, frequency, and/or the like) and transmit that information to one, two, three, or all of the RF modules 438a, 438c, 538a, and/or 538c. Additionally, the directional antennas 406a-406d may communicate with corresponding RF modules 438a, 438c, 538a, 538c. For example, the RF modules 438a, 438c, 538a, 538c may receive one or more signals from the corresponding directional antennas 406a-406d, and/or may cause transmission of signal via the corresponding directional antennas 406a-406d. The RF modules 438a, 438c are in communication with, and can transmit to and receive information from, the corresponding SOM module 438b. Similarly, the RF modules 538a, 538c are in communication with, and can transmit to and receive information from, the corresponding SOM module 538b. As described herein, the SOM module(s) 438b, 538b may receive signals, process portions of the signal (e.g., by application of one or more ML models), and determine one or more signals to transmit, among various other functionality. For example, the SOM module(s) 438b, 538b may also determine a location of a target object for transmission of the signals, which determination may be made based on information from one or more of the direction finder 408, the directional antennas 406a-406d, and/or external devices 606. The SOM module(s) 438b, 538b may then cause transmission of the determined RF signal to transmit via corresponding RF modules and directional antennas 406a-406d.

The SOM modules 438b, 538b may communicate with one another via one or more communications links 610. The SOM module 438b and/or the SOM module 538b may determine which of the directional antennas 406a-406d should transmit an RF signal. Additionally or alternatively, the SOM module 438b and/or SOM module 538b can transmit instructions for transmission to corresponding RF modules 438a, 438c, 538a, 538c. The RF modules 438a, 438c, 538a, 538c can then transmit a signal to corresponding directional antennas 406a-406d to cause the directional antennas 406a-406d to transmit the RF signal at the target frequency, magnitude, direction, and/or the like. The RF modules 438a, 438c, 538a, 538c can be configured to amplify and/or multiplex the signal received by the corresponding SOM module 438b, 538b. Each of the power supply modules 438d, 538d can provide power for the elements within the corresponding module enclosure 412, 512 and/or to the corresponding direction finder 408 and/or directional antennas 406a-406d.

In some embodiments, the SOM modules 438b, 538b can each communicate with a system management module 604 via one or more communications links 608. The communications links 608 may be wired or wireless. Additionally or alternatively, the system management module 604 may be remote from the module enclosures 412, 512. In some embodiments, the system management module 604 can communicate with external devices 606 and transmit data to and from the external devices 606. For example, the system management module can receive updates to a machine learning model or other software, information regarding an RF signal detected, information regarding an RF signal to transmit, information regarding what and where to transmit or receive an RF signal, or the like. Such information, for example, can be transmitted to the SOM modules for processing and coordinating with the other devices and components. In some embodiments, the system management module 604 can determine which of the directional antennas 406a-406d should transmit an RF signal and/or one or more attributes of said signal. For example, the system management module 604 may determine that two of the directional antennas 406a-406d should transmit a signal each at different magnitudes and/or directions. Additionally or alternatively, in some embodiments the system management module 604 and/or the SOM modules 438b, 538b may be able to automatically control transmissions of corresponding directional antennas 406a-406d.

In some implementations, the RF system may not include a system management module 604. In such implementations, the SOM modules 438b, 538b may incorporate the functionality and/or components of the system management module 604 to provide the functionality of the RF system described herein. As noted above, via one or more communications links 610, the SOM modules 438b, 538b may communicate and coordinate with one another. The "processing modules" described above may be understood as being similar to the SOM modules, and/or combined functionality of the SOM modules and the system management module.

The SOM modules 438b, 538b can communicate with one or more external devices 606 via communications links 612. The communications links 612 may be wired or wireless. Additionally or alternatively, the external devices 606 may be remote from the module enclosures 412, 512 and/or from the system management module 604. The system management module 604 may be able to communicate with the external devices 606 via communications links 614, which may be wired or wireless. The SOM modules 438b, 538b, the system management module 604, and/or the external devices 606 may include one or more communications interfaces or components (e.g., wireless, wired data interfaces) that can be configured to transmit and/or receive data via the same. In some embodiments, the external devices 606 may include one or more of: the additional systems or sensors (e.g., 104), other RF systems (e.g., 106), a central processing server (e.g., 107), and/or user device(s) (e.g., 110).

In various embodiments, and as noted above, each of the modules (e.g., the SOM module(s), the RF module(s), the power supply module(s), and/or the system management module(s)) may internally include various thermal couplings, heat pipes or conductors, and/or the like, to conduct heat to the thermal interfaces and thereby to heat sinks.

FIG. 7A illustrates a block diagram of an example SOM module, according to various embodiments. The SOM module 438b shown (e.g., 438a and/or 438b) includes one or more communications links 716 that allow the SOM module 438b to communicate with one or more other system modules described herein. The communications links 716 may be wired and/or wireless. The SOM module 438b can include SDR transceivers 702a-702b, one or more storage device(s) 704 (which may include any type of data storage, volatile or non-volatile memory, solid-state storage, and/or the like, as described above), one or more processor(s) 706, one or more GPUs 708a-708b, one or more communications adapter(s) and/or PHY (e.g., physical layer or layer 1 as implemented by a PHY chip or similar chip(s)) 712, and one or more physical connector(s) 714. The one or more communications interface(s) 710 can comprise, for example, one or more buses or communications channels, and may be in communication with (e.g., wired, wireless) SDR transceivers 702a-702b, the storage device(s) 704, the processor(s) 706, the GPUs 708a-708b, and/or the communications adapter(s) and/or PHY 712.

The GPUs 708a-708b can be configured to execute advanced computations that are slower than, less efficient than, or not possible on a general-purpose processor. For example, the GPUs 708a-708b may be configured to perform matrix calculation, perform linear algebra calculations, execute Fourier transforms, and/or other advanced calculations, including execute the ML models as described herein. Also, for example, the GPUs 708a-708b may be configured to perform many calculations per second (e.g., 10, 15, 20, 30, or more Tera FLOPS per second). These GPUs 708a-708b may include their own memory and/or processors or may execute instructions stored on the storage device(s) 704 and/or as instructed by the processors 706. The instructions may be executed by the processor(s) 706 and/or the GPUs 708a-708b. For example, the processor(s) 706 may instruct the GPUs 708a-708b to apply an ML model to sampled RF data to, e.g., determine a type of object, as described herein. Additionally or alternatively, the processor(s) 706 may support in making the calculations and other determinations.

The SDR transceivers 702a-702b comprise circuitry and functionality to produce, modify, detect, sense, or otherwise work with RF signals as described herein. For example, the SDR transceivers 702a-702b may be configured to transmit/receive signals that can be mixed, filtered, amplified, modulated/demodulated, and/or detected using one or more components described herein. As a further example, the SDR transceivers 702a-702b can receive instructions from the processor 706 to generate one or more signals to be transmitted by the RF system (e.g., to target an identified object). Thereafter, the SDR transceivers 702a-702b can generate the signals, which can then be communicated to the RF modules (as appropriate for targeting, and including instructions regarding an amount of power to transmit on any applicable antenna) for amplification and transmission via the directional antennas.

The communications interface(s) 710 may, for example, comprise a bus, and may receive and transmit data to the one or more components of the SOM module 438b via various wired and/or wireless data communication connections. The communications interface(s) 710 can transmit the data to the physical connector(s) 714 via the communications adapter(s) and/or PHY 712. The communications interface(s) 710 may include, for example, a PCIe switch. The communications adapter(s) and/or PHY 712 can include hardware transmission and/or receiving adapters, and/or for example, an electrical, mechanical, and procedural interface to a transmission medium (e.g., using a PHY chip, or other similar chip(s)), and can define the means of transmitting a stream of raw bits over a physical data link connecting network nodes. For instance, the bitstream may be grouped into code words or symbols and converted to a physical signal that is transmitted over a transmission medium. Accordingly, the SOM module may include communications adapters and associated physical connectors to provide communications with other components using various connections and protocols, including wired and wireless. For example, the SOM module may support wired or wireless ethernet, optical connections, and/or any other types of power or data connections.

The SDR transceivers 702a-702b may include one or more analog-to-digital ("ADCs") converters and one or more digital-to-analog converts ("DAC"). For example, received signals (received, e.g., via a directional antenna and RF module, and communicated to the processing module) may be passed through an ADC for further digital domain sampling and analysis, as described herein. Signals to be transmitted may be generated by the SDR transceiver, and passed through a DAC before being communicated to an RF module for amplification and transmission via a directional antenna). In various implementations, the ADCs and DACs may be located elsewhere in the system, e.g., as separate components of the SOM modules and/or RF modules.

FIG. 7B illustrates an example system management module 604, according to various embodiments. In implementations in which a given RF system includes two or more SOM modules 438 (e.g., when the RF system includes two or more module enclosures) the multiple SOM modules 438 may communicate with one another directly (e.g., via communication links 610 of FIG. 6) to provide the functionality described herein, or may communicate with one another via the system management module 604 that may provide coordination functionality among the multiple SOM modules 438. In implementations using a system management module, the system management module may provide communications with other external systems or sensors, and may relay those communications to the multiple SOM modules 438. In various implementations, the system management module may incorporate components and/or functionality of one or more of the SOM modules, such as PNT components 734. In various implementations, when the RF system includes two or more SOM modules, one of the SOM modules can be manually and/or automatically designated to act as the system management module (and thus no physically separate system management module is present) to provide the coordination and communication functionality described above. Thus, in these implementations, the components (including PNT component(s) 734) and functionality of the system management module 604 described below may be subsumed into, combined with, or provided by, a SOM module (e.g., the SOM module(s) may provide the functionality that is generally coextensive with the "processing modules" as described above in reference to FIG. 1B).

The system management module 604 can include one or more processor(s) 730, one or more storage device(s) 732 (which may include any type of data storage, volatile or non-volatile memory, solid-state storage, and/or the like, as described above), one or more PNT component(s) 734, one or more communications interface(s) 736, one or more security modules 735, one or more communications adapter(s) and/or PHY (e.g., physical layer or layer 1 as implemented by a PHY chip or similar chip(s)) 738, one or more physical connector(s) 740, and/or communications links 742.

The PNT component(s) 734 can be configured to allow the RF system to determine its location (longitude, latitude, and altitude/elevation) to target degree of precision (e.g., within a few cm, a few m). The location can be determined using time signals transmitted/received along a line of sight with the PNT component(s) 734 and/or with one or more antennas described herein (e.g., the directional antennas 406a-406d, the direction finder 408). The system can be used for providing position and/or navigation for tracking the position of another device having a receiver (e.g., a target source signal). For example, the PNT component(s) 734 may be configured to determine a location and/or movement of an RF system described herein (e.g., the RF system 402, the RF system 502) or some other system that may be remote from the system management module 604. The PNT component(s) 734 may receive and/or process signals to calculate a current local time, which may allow for time synchronization with one or other elements described herein.

In various embodiments, the one or more PNT components may include, for example, global navigation satellite system capabilities (e.g., global positioning system ("GPS") capabilities), among other PNT functions. The one or more PNT components may further provide orientation information, altitude information, angle/tilt information, and/or the like. In some implementations, the PNT capabilities of the RF system may be provided in and/or by the direction finder, in whole or in part. The PNT capabilities may also be referred to herein as "positioning capabilities", and the one or more PNT components may also be referred to herein as "positioning components", and/or the like. The PNT capabilities of the RF system may be used, for example, in object location determinations and/or tracking, as described herein, because such functionality may be dependent on the position, orientation, tilt, and/or the like, of the RF system (e.g., such that the correct directional antennas, with the correct orientation and tilt, may be used to detect or target an object).

The security module(s) 735 may be configured to secure data and/or communications associated with the system management module 604. For example, the security module(s) 735 can secure data that is received by the system management module 603 or RF system from one or more external devices, systems, sensors, and/or other RF systems. Also, for example, the security module(s) 735 can secure data that is transmitted by the system management module 603 or RF system to one or more external devices, systems, sensors, and/or other RF systems. External devices may include, for example, additional systems or sensors 104, other RF systems, central processing service 107, user device(s) 110, or any device(s) connected to such external devices. Security features may include one or more of: encryption (e.g., end-to-end encryption, data encryption, etc.), cryptographic functions (e.g., cryptographic keys, etc.), and/or the like. In some embodiments, the security module(s) 735 may also provide hardware acceleration to the system management module 604 and/or one or more other components of an RF system, for example. In some embodiments the security module(s) 735 may comprise one or more specialized chips to perform its configured function(s). Such specialized chips may provide, for example, hardware acceleration for encryption and/or cryptographic functions of the security module(s) 735. Some additional examples and details of various functions of the security module(s) 735, including providing secure communications among the various components of the operating environment 100, are described herein and in the '436 Patent.

The processor(s) 730 may be configured to execute software instructions stored on the storage device(s) 732 and/or on other elements of the system management module 604. The communications interface(s) 736 (which can comprise, for example, one or more buses or communications channels) can receive and/or transmit signals among the other components of the system management module 604. The communications interface(s) 736 can communicate signals to the physical connector(s) 740 via the communications adapter(s) 738 (analogously to the description of FIG. 7A above). These signals can be communicated externally (e.g., to provide communications with the SOM module(s) and/or external devices) as described herein via the communications links 742 (analogously to the description of FIG. 7A above).

FIG. 8 illustrates a block diagram of an example RF module (e.g., the RF module 438*a*, the RF module 438*c*, the RF module 538*a*, the RF module 538*c*). The RF module 438*a* shown can include one or more physical connector(s) 802, one or more, multiplexer and/or filter(s) 804, one or more transmit amplifier(s), filter(s), and/or limiter(s) 806, one or more receive amplifier(s), filter(s), and/or limiter(s) 808, and/or one or more physical connector(s) 810.

The physical connector(s) 802 and physical connector(s) 810 can be in communication with other elements described herein. For example, the physical connector(s) 802 may comprise components for establishing wired or wireless communications with one or more antennas described herein (e.g., directional antennas 406*a*-406*d*, direction finder 408) via one or more communications links 812. Additionally or alternatively, the physical connector(s) 810 may comprise components for establishing wired or wireless communications with a corresponding SOM module (e.g., SOM module 438*b*, SOM module 538*b*) via one or more communications links 814. Accordingly, the RF module may include components (e.g., physical connectors, and optionally communications adapters) to provide communications with other components using various connections and protocols, including wired and wireless. For example, the RF module may support dedicated wired connections for high power, wired or wireless ethernet, optical connections, and/or any other types of power or data connections.

The multiplexer and/or filter(s) 804 can include one or more multiplexers. The multiplexer can switch a function of the RF module 438*a*, such as between a transmission function and/or a receiving function. In some embodiments, the multiplexer can modulate and/or demodulate a signal that is received and/or transmitted. The multiplexer and/or filter(s) 804 can additionally or alternatively include one or more filters. The filters can include a broadband, narrowband, high-pass, low-pass, notch filter, or other kind of filter for RF signals. In some embodiments, the filters can be configured to reduce noise within a received and/or transmitted RF signal. The multiplexer and/or filter(s) 804 may serve as a gross multiplexing and/or filtering. Signals may be further (e.g., more granular) amplified, filtered, and/or limited by corresponding transmit amplifier(s), filter(s), and/or limiter(s) 806 and/or receive amplifier(s), filter(s), and/or limiter(s) 808. Whether the transmit amplifier(s), filter(s), and/or limiter(s) 806 or the receive amplifier(s), filter(s), and/or limiter(s) 808 are used may be based at least in part on the multiplexing setting associated with the multiplexer and/or filter(s) 804.

FIG. 9A illustrates an example flow or method of assembling an RF system, according to various embodiments of the present disclosure. Although FIG. 9A discloses one example, other methods of assembling an RF system are possible and described elsewhere herein. Further, in various implementations various blocks of the flow or method may be rearranged, optional, and/or omitted, and/or additional blocks may be added. The blocks illustrated schematically in FIG. 9A will be described with reference to certain hardware components of the present disclosure. However, it will be understood that the hardware components of FIG. 9A and/or individual components or subsets thereof may equally be implemented in conjunction with other hardware components, software components, and/or systems without departing from the scope of the present disclosure. Additional information regarding coupling an antenna to a module enclosure is described herein with respect to FIGS. 4A-5D, for example.

At block 902, the method can include providing one or more module enclosures (e.g., the module enclosure 412, the module enclosure 512). At block 904 the method includes inserting one or more system modules (e.g., system modules 438*a*-438*d*, system modules 538*a*-538*d*) into the one or more enclosures. The method can include assembly of the one or more elements without the need for tools. The system modules may be locked in and/or adhered (e.g., glued, soldered) to one or more portions (e.g., interior sides) of the module enclosures. The module enclosures may include a locking mechanism that presses the system modules against a thermal interface side of the module enclosure so as to maximize thermal transfer.

At block 906, the method can include inserting heatsinks into the module enclosures into the inner portion of the module enclosure. The heat sinks coupled to the thermal interfaces, which thermal interfaces are coupled to the system modules as described above.

At block 908, the method includes coupling upper, lower, and/or joining enclosures together to form a module assembly. The module assembly may be a single, double, triple, or higher-order module assembly. The coupling may include a coupling that can be coupled (e.g., assembled) without a need for power and/or other tools. For example, couplings may include various coupling features, such as friction fits (e.g., snap fits), coupling elements (e.g., screws, nails, attachment devices, and/or the like).

At block 910, the method includes coupling (e.g., attaching, connecting, and/or the like) one or more antennas, such as the directional antennas 406*a*-406*d* and/or the direction finder 408 described above. The antennas may be coupled as described in FIG. 5E above and/or FIG. 9B below. For example, an antenna bracket may be rotationally coupled to one or more coupling features. Additionally or alternatively, the antenna bracket and/or one or more of the coupling features may be fixedly coupled to a side of the RF system. In some embodiments, all of the antennas may be coupled to the same portion of the modular assembly (e.g., to an upper module enclosure).

At block 912, the method includes providing communications links and power connections among various components, including the system modules, of the RF system, and including during the assembly steps described above. The communications links can include various wires and/or optical connections (e.g., cables, such as ethernet) which may be provided via the various cavities of the enclosures of the RF system, as described above. The block 912 may include coupling one or more connectors that may be configured to protect certain components, including the communication links and/or power connections, from adverse weather or other environmental conditions described herein. The communications links may be wired links and/or wireless data interfaces. In some embodiments, the method includes coupling one or more antennas to exterior portions or exterior surfaces of the module enclosure and providing communications links between the one or more antennas and one or more of the one or more modules. Such external to internal communications links may be provided via one or more plugs or ports positioned on outside surfaces of the RF system, which may be configured to seal the inside of the enclosure from the outside environment, and which may be configured to provide secure connections with corresponding connectors of, for example, wires coming from the antennas, external power source, and/or the like.

At block 914 the method may include mounting the RF system. This may include mounting a portion of a modular assembly (e.g., a bottom, a side, a top) to a mounting surface, such as another RF system and/or to a mounting system (e.g., a tripod, a building, the ground, and/or the like). The mounting may include a coupling that can be coupled (e.g., assembled) without a need for power and/or other tools. At block 916 the method may include providing power, activating, and/or operating the RF system. Operating the RF system may include receiving RF signals via the one or more antennas, processing the received RF signals, and/or transmitting RF signals at one or more frequencies.

FIG. 9B illustrates an example flow or method of coupling an antenna to a module enclosure, according to various embodiments of the present disclosure. Although FIG. 9B discloses one example, other methods of coupling an antenna to the module enclosure are possible and described elsewhere herein. Further, in various implementations various blocks of the flow or method may be rearranged, optional, and/or omitted, and/or additional blocks may be added. The blocks illustrated schematically in FIG. 9B will be described with reference to certain hardware components of the present disclosure. However, it will be understood that the hardware components of FIG. 9B and/or individual components or subsets thereof may equally be implemented in conjunction with other hardware components, software components, and/or systems without departing from the scope of the present disclosure. Additional information regarding the coupling an antenna to a module enclosure is described herein with respect to FIG. 5E, for example.

At block 922, a first coupling feature (e.g., sliding bracket 574) of an antenna mount (e.g., 420 in FIG. 5E and elsewhere) can be slid into a track (e.g., track 588) on a side (e.g., side 570) of a module enclosure. In some embodiments, the first coupling feature can be positioned in the track on the side of an RF system. In some embodiments, the first coupling feature may slidably move in the track (e.g., along a line).

At block 924, a first pivot point (e.g., pivot 590) of the antenna bracket (e.g., antenna bracket 572) can be inserted into a receiving portion of the first coupling feature (e.g., sliding bracket 574) at a first angle. The first angle may comprise a high angle. The antenna bracket is then rotated about the first pivot point (e.g., pivot 590), causing the pivot point to be rotatably locked into the receiving portion of the first coupling feature. For example, the antenna bracket may be rotated from the high angle, down to a lower angle where the second coupling feature may possibly couple to the fixed mount. The first pivot point may comprise a locking portion of the antenna bracket, and may comprise a cylindrically shaped portion (e.g., a rod) with a notch (e.g., a notched cylinder or rod). The notch may allow for engagement and disengagement of the locking portion of the antenna bracket with the receiving portion of the first coupling feature at a first angle (e.g., the high angle), but not at other angles. Accordingly, the locking portion of the antenna bracket may be coupled to the receiving portion of the first coupling feature by a rotational movement. The coupling between the antenna bracket may be coupled to the receiving portion of the first coupling feature provides a first pivot point.

At block 926, a second coupling feature (e.g., mounting bracket 576) of the antenna mount can be coupled to a fixed mount (e.g., fixed mount 586) on the side of the module enclosure (e.g., the same side as the first coupling feature). For example, the mounting bracket (e.g., mounting bracket 576) may be rotatably coupled to the fixed mount via a second pivot point (e.g., pivot 584) on one end and the mounting bracket (e.g., mounting bracket 576) may be coupled to the antenna bracket (e.g., antenna bracket 572) via a third pivot point (e.g., pivot 582) on another end. In some embodiments, a self-locking pin (e.g., pivot 584) can be used to couple or secure the second coupling feature to the fixed mount. The second and third pivot points corresponding to the second coupling feature can allow the mounting bracket to rotate about the pivot points, thus modifying a position of the pivot and/or an orientation of the antenna bracket, thus providing a first degree of freedom of the antenna orientation.

In some embodiments, the first coupling feature can slide directly into a track (e.g., track 588) and be translated parallel to the side, for example, at approximately the same distance from the side during translation. Other coupling arrangements are also possible, such as bolting, welding, screwing, snapping, or the like. In some embodiments, there may be no first degree of freedom provided by the coupling arrangement for the first coupling feature. In some embodiments, there may be two or more degrees of freedom provided by the coupling arrangement for the first coupling feature (e.g., by incorporating additional pivot points along the mounting bracket or elsewhere). In some embodiments, a fixed mount can be included on the side of the enclosure and/or RF system. In some embodiments, the first coupling feature can be coupled to the fixed mount, and the second coupling feature and be coupled to the antenna bracket.

At block 928, in some embodiments, and optionally, an antenna can be coupled to the antenna bracket via an antenna interface (e.g., antenna interface 578, and described elsewhere herein), for example. Alternatively, the antenna is machined, molded, or otherwise formed with the antenna bracket. In some embodiments, other sensor equipment or devices can be attached to the antenna interface.

At block 930, the first coupling feature can slide along the track to a target position, and can be locked in place using a locking pin (e.g., locking pin 592). In some embodiments, the locking pin can be configured to lock in one of a plurality of slots (e.g., slots) located on the track. In some embodiments, the slots can be spaced at a specific distance (e.g., about every 10 mm, 1 cm, 2 cm, 5 cm, or the like). In some embodiments, the slots can be spaced at specific distances that may correspond to a specific angle or tilt of an antenna, such as the one connected at block 928, for example. The angle of the antenna may comprise an angle of elevation or tilt as compared to a plane the RF system is stationed on (which may be the same as a line perpendicular or normal to a side surface of the RF system on which the antenna is mounted, if the RF system is mounted level). For instance, there may be a first slot at a first location on the track corresponding to a tilt 5° from a line perpendicular to the center of the antenna interface surface. Also, for instance, there may be a second slot space a distance away from the first slot at a second location on the track corresponding to a tilt 10° from a line perpendicular to the center of the antenna interface surface. In addition, there can be numerous slots that correspond to certain degrees of tilt. In some embodiments, the degree of tilt can be relevant to address placement issues. For example, if an RF system is placed on the roof of a building, the degree of tilt may need to be adjusted so that an antenna connected to the antenna bracket can be directed down (e.g., −10°) to monitor signals closer to the earth's surface as well as the sky, instead of just the sky.

At block 932, an antenna wire can be coupled to RF system via a port or connection on the RF system. In some embodiments, the port or connection can be located externally on, or internally in, the RF system. In some embodiments, the port or connection can provide an interface for power and/or data transfer to and from the antenna. For example, power and signals can be transferred to the antenna from the RF module so that the antenna transmits RF signals. Also, for example, power and signals can be transferred from the antenna to the RF module and then the processing module to analyze and/or process. Additional information regarding transmission and signal processing is described elsewhere herein.

FIG. 9C illustrates an example flow or method of managing thermal transfer in an RF system, according to various embodiments of the present disclosure. Although FIG. 9C discloses one example, other methods of managing thermal transfer in an RF system are possible and described elsewhere herein. Further, in various implementations various blocks of the flow or method may be rearranged, optional, and/or omitted, and/or additional blocks may be added. The blocks illustrated schematically in FIG. 9C will be described with reference to certain hardware components of the present disclosure. However, it will be understood that the hardware components of FIG. 9C and/or individual components or subsets thereof may equally be implemented in conjunction with other hardware components, software components, and/or systems without departing from the scope of the present disclosure At block 942, the method includes providing one or more heat sinks (e.g., heat sinks 540a-540d) in an inner portion of an RF system (e.g., RF system 402, RF system 502). The one or more heat sinks may be disposed within the inner portion and surrounded by the module enclosure's periphery, which may extend vertically within the RF system (e.g., within a module enclosure 412 of the RF system). The heat sinks may include a zipper fin or other structure configured to draw heat away from the heat sinks and/or other components of the RF system. The inner portion of the one or more module enclosures, into which the one or more heat sinks are inserted, and through which air may flow, may be referred to as a cavity or channel.

At block 944 the method includes providing sealed thermal interfaces (e.g., thermal interfaces 544a-544d) between the heat sinks and the walls of the inner portion of the module enclosure opposite the system modules. The thermal interfaces may fluid seal (e.g., liquid seal) an inner portion of the RF system from an outer portion of an interior of the RF system. Providing the seal may include providing an adhesive, sealant, or other material. Additionally or alternatively, the thermal interfaces may be adhered and/or formed to a portion of the interior of the RF system and/or to the system modules.

At block 946 one or more plugs (e.g., plug 442, plug 542) may be provided at least partially between two or more of the heat sinks. For example, the plugs can prevent air avoiding the heat sinks. Thus, they may redirect air flow to occur through the heat sinks.

Air movement may be promoted via air vents and/or cooling fans disposed in upper and/or lower enclosure of the RF system, at block 948. The cooling fans may be coordinated to push air in the same direction as one another. For example, at block 950 the method can include activating the cooling fans to cause air to flow through the inner portion of RF system (e.g., into and up from lower enclosure, through heat sinks, and out of upper enclosure). This may provide improved cooling of the one or more heat sinks and/or system modules described herein. An alignment between coupled modular assemblies (e.g., a double modular assembly) can include disposing the one or more fans such that the fans draw air through both of the modular assemblies (e.g., an interior thereof), the one or more heat sinks, the second cavity, and the second one or more heat sinks to draw heat from the one or more modules and the second one or more modules.

As noted above, the inner portion of the one or more module enclosures, into which the one or more heat sinks are inserted, and through which air may flow, may be referred to as a cavity or channel. The channel may extend from the lower enclosure, through the one or more module enclosures, and to the upper enclosure. Air may flow through this channel as caused by the one or more fans.

Figure 9D:
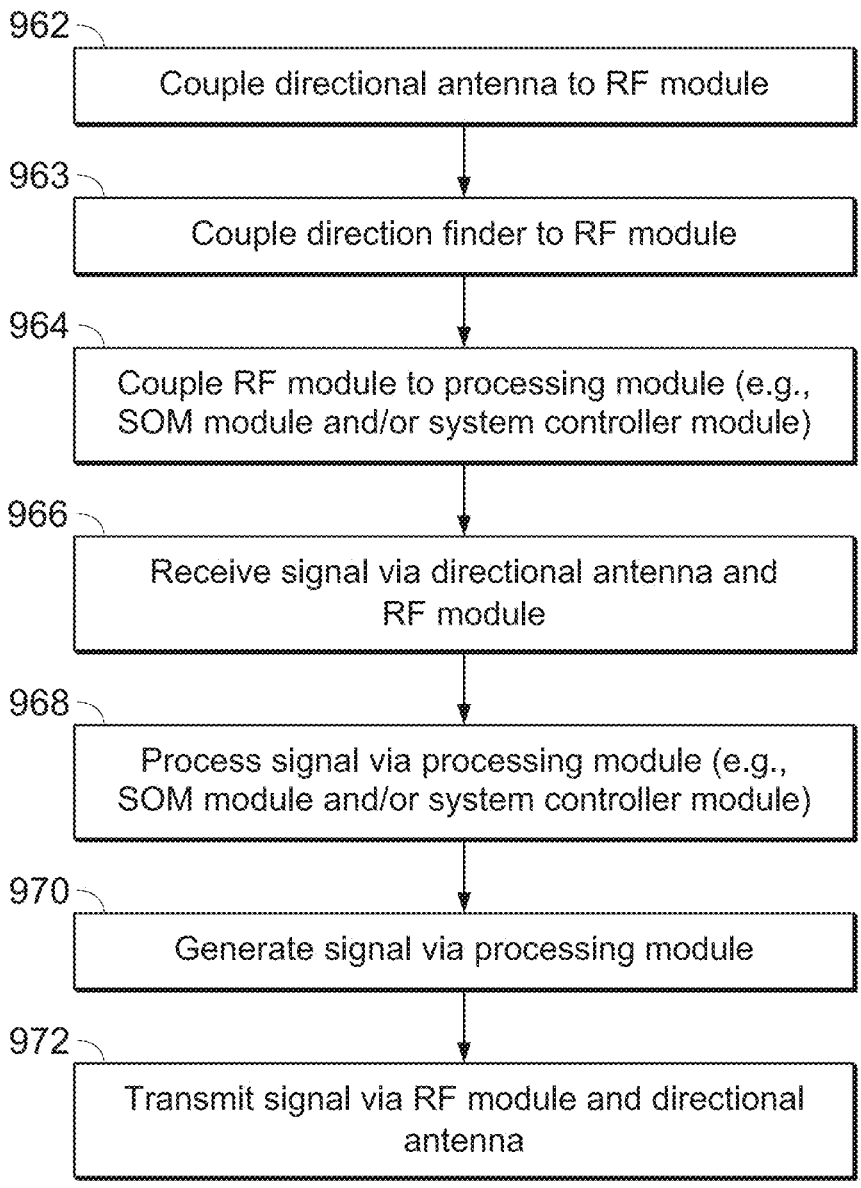

FIG. 9D illustrates an example flow or method of operating of an RF system to, e.g., receive and/or transmit signals, according to various embodiments of the present disclosure. Although FIG. 9D discloses one example, other methods of operating an RF system are possible and described elsewhere herein. Further, in various implementations various blocks of the flow or method may be rearranged, optional, and/or omitted, and/or additional blocks may be added. The blocks illustrated schematically in FIG. 9D will be described with reference to certain hardware components of the present disclosure. However, it will be understood that the hardware components of FIG. 9D and/or individual components or subsets thereof may equally be implemented in conjunction with other hardware components, software components, and/or systems without departing from the scope of the present disclosure.

At block 962, a directional antenna can be coupled to an RF module. In some embodiments, one or more cables or wires can also be coupled at one end(s) to the directional antenna and at the other end(s) to the RF module. In some embodiments, the antenna can be coupled directly or indirectly (e.g., via a port or plug on the RF system, as described above) to the RF module so that electrical communication can occur. In addition, in some embodiments, the antenna (e.g., using a different or same cable or wire used to connect to the RF module) can draw or receive power from the corresponding RF system's power supply. At block 963, the direction finder is similarly coupled to one or more RF modules, and/or one or more SOM/processing modules.

At block 964, the RF module can be coupled to the processing module. For example, the processing module can include a SOM module and/or a system management module, each of which is described in more detail herein.

At block 966, the antenna can receive a signal (e.g., RF signal). In some embodiments, the signal can be transferred (e.g., via the coupling described at block 962) to the RF module and/or the processing module (e.g., SOM module and/or a system management module). In various embodiments, the signals may be amplified, filtered, and/or limited by the RF module before they are communicated to the associated processing module.

At block 968, the processing module, once it receives the signal at block 966, processes the signal. For example, processing of the signal can be similar to any of the examples and methods/flows described herein, and may include application of a ML model. The processing may include determining a location or position of a target object, and/or determining one or more signals to transmit.

At block 970, the processing module can generate one or more signals. For example, generating of a signal can be similar to any of the examples and methods/flows described herein.

At block 972, the processing module can send the generated signal to the RF module, and the RF module can cause the signal to be transmitted via a directional antenna. For example, transmission of a signal can be similar to any of the examples and methods/flows described herein. In various embodiments, the signals may be amplified, filtered, and/or limited by the RF module before they are communicated to the associated directional antenna.

VII. Additional Implementation Details and Embodiments

In an implementation the system (e.g., one or more aspects of the RF system 102, RF systems 106, the central processing server 107, user devices 110, other aspects of the operating environment 100, and/or the like) may comprise, or be implemented in, a "virtual computing environment". As used herein, the term "virtual computing environment" should be construed broadly to include, for example, computer-readable program instructions executed by one or more processors (e.g., as described in the example of FIG. 3) to implement one or more aspects of the modules and/or functionality described herein. Further, in this implementation, one or more services/modules/engines and/or the like. of the system may be understood as comprising one or more rules engines of the virtual computing environment that, in response to inputs received by the virtual computing environment, execute rules and/or other program instructions to modify operation of the virtual computing environment. For example, a request received from the user computing device 301 may be understood as modifying operation of the virtual computing environment to cause the request access to a resource from the system. Such functionality may comprise a modification of the operation of the virtual computing environment in response to inputs and according to various rules. Other functionality implemented by the virtual computing environment (as described throughout this disclosure) may further comprise modifications of the operation of the virtual computing environment, for example, the operation of the virtual computing environment may change depending on the information gathered by the system. Initial operation of the virtual computing environment may be understood as an establishment of the virtual computing environment. In some implementations the virtual computing environment may comprise one or more virtual machines, containers, and/or other types of emulations of computing systems or environments. In some implementations the virtual computing environment may comprise a hosted computing environment that includes a collection of physical computing resources that may be remotely accessible and may be rapidly provisioned as needed (commonly referred to as "cloud" computing environment).

Implementing one or more aspects of the system as a virtual computing environment may advantageously enable executing different aspects or modules of the system on different computing devices or processors, which may increase the scalability of the system. Implementing one or more aspects of the system as a virtual computing environment may further advantageously enable sandboxing various aspects, data, or services/modules of the system from one another, which may increase security of the system by preventing, e.g., malicious intrusion into the system from spreading. Implementing one or more aspects of the system as a virtual computing environment may further advantageously enable parallel execution of various aspects or modules of the system, which may increase the scalability of the system. Implementing one or more aspects of the system as a virtual computing environment may further advantageously enable rapid provisioning (or de-provisioning) of computing resources to the system, which may increase scalability of the system by, e.g., expanding computing resources available to the system or duplicating operation of the system on multiple computing resources. For example, the system may be used by thousands, hundreds of thousands, or even millions of users simultaneously, and many megabytes, gigabytes, or terabytes (or more) of data may be transferred or processed by the system, and scalability of the system may enable such operation in an efficient and/or uninterrupted manner.

Various embodiments of the present disclosure may be a system, a method, and/or a computer program product at any possible technical detail level of integration. The computer program product may include a computer-readable storage medium (or mediums) having computer-readable program instructions thereon for causing a processor to carry out aspects of the present disclosure.

For example, the functionality described herein may be performed as software instructions are executed by, and/or in response to software instructions being executed by, one or more hardware processors and/or any other suitable computing devices. The software instructions and/or other executable code may be read from a computer-readable storage medium (or mediums). Computer-readable storage mediums may also be referred to herein as computer-readable storage or computer-readable storage devices.

The computer-readable storage medium can be a tangible device that can retain and store data and/or instructions for use by an instruction execution device. The computer-readable storage medium may be, for example, but is not limited to, an electronic storage device (including any volatile and/or non-volatile electronic storage devices), a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a solid-state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions (as also referred to herein as, for example, "code," "instructions," "module," "application," "software application," and/or the like) for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, Java, C++, or the like, and procedural programming languages, such as the "C" programming language or similar programming languages. Computer-readable program instructions may be callable from other instructions or from itself, and/or may be invoked in response to detected events or interrupts. Computer-readable program instructions configured for execution on computing devices may be provided on a computer-readable storage medium, and/or as a digital download (and may be originally stored in a compressed or installable format that requires installation, decompression, or decryption prior to execution) that may then be stored on a computer-readable storage medium. Such computer-readable program instructions may be stored, partially or fully, on a memory device (e.g., a computer-readable storage medium) of the executing computing device, for execution by the computing device. The computer-readable program instructions may execute entirely on a user's computer (e.g., the executing computing device), partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In various embodiments, electronic circuitry including, for example, programmable logic circuitry, field-programmable gate arrays ("FPGA"), or programmable logic arrays ("PLA") may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart(s) and/or block diagram(s) block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. For example, the instructions may initially be carried on a magnetic disk or solid-state drive of a remote computer. The remote computer may load the instructions and/or modules into its dynamic memory and send the instructions over a telephone, cable, or optical line using a modem. A modem local to a server computing system may receive the data on the telephone/cable/optical line and use a converter device including the appropriate circuitry to place the data on a bus. The bus may carry the data to a memory, from which a processor may retrieve and execute the instructions. The instructions received by the memory may optionally be stored on a storage device (e.g., a solid-state drive) either before or after execution by the computer processor.

The flowcharts and block diagrams in the Figures illustrate the architecture, functionality, and operation of possible implementations of systems, methods, and computer program products according to various embodiments of the present disclosure. In this regard, each block in the flowchart or block diagrams may represent a service, module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. In addition, certain blocks may be omitted or optional in some implementations. The methods and processes described herein are also not limited to any particular sequence, and the blocks or states relating thereto can be performed in other sequences that are appropriate.

It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. For example, any of the processes, methods, algorithms, elements, blocks, applications, or other functionality (or portions of functionality) described in the preceding sections may be embodied in, and/or fully or partially automated via, electronic hardware such application-specific processors (e.g., application-specific integrated circuits (ASICs)), programmable processors (e.g., field programmable gate arrays (FPGAs)), application-specific circuitry, and/or the like (any of which may also combine custom hard-wired logic, logic circuits, ASICs, FPGAs, and/or the like. with custom programming/execution of software instructions to accomplish the techniques).

Any of the above-mentioned processors, and/or devices incorporating any of the above-mentioned processors, may be referred to herein as, for example, "computers," "computer devices," "computing devices," "hardware computing devices," "hardware processors," "processing units," and/or the like. Computing devices of the above-embodiments may generally (but not necessarily) be controlled and/or coordinated by operating system software, such as Mac OS, iOS, Android, Chrome OS, Windows OS (e.g., Windows XP, Windows Vista, Windows 7, Windows 8, Windows 10, Windows 11, Windows Server, and/or the like), Windows CE, Unix, Linux, SunOS, Solaris, Blackberry OS, VxWorks, or other suitable operating systems. In other embodiments, the computing devices may be controlled by a proprietary operating system. Conventional operating systems control and schedule computer processes for execution, perform memory management, provide file system, networking, I/O services, and provide a user interface functionality, such as a graphical user interface ("GUI"), among other things.

For example, FIG. 3 shows a block diagram that illustrates a computer system 300 upon which various implementations and/or aspects (e.g., one or more aspects of the RF system 102, RF systems 106, the central processing server 107, user devices 110, other aspects of the operating environment 100, and/or the like) may be implemented. Computer system 300 includes a bus 302 or other communication mechanism for communicating information, and a hardware processor, or multiple processors, 304 coupled with bus 302 for processing information. Hardware processor(s) 304 may be, for example, one or more general purpose microprocessors.

Computer system 300 also includes a main memory 306, such as a random-access memory (RAM), cache and/or other dynamic storage devices, coupled to bus 302 for storing information and instructions to be executed by processor 304. Main memory 306 also may be used for storing temporary variables or other intermediate information during execution of instructions to be executed by processor 304. Such instructions, when stored in storage media accessible to processor 304, render computer system 300 into a special-purpose machine that is customized to perform the operations specified in the instructions. The main memory 306 may, for example, include instructions to implement **, and/or other aspects of functionality of the present disclosure, according to various implementations.

Computer system 300 further includes a read only memory (ROM) 308 or other static storage device coupled to bus 302 for storing static information and instructions for processor 304. A storage device 310, such as a magnetic disk, optical disk, or USB thumb drive (Flash drive), and/or the like, is provided and coupled to bus 302 for storing information and instructions.

Computer system 300 may be coupled via bus 302 to a display 312, such as a cathode ray tube (CRT) or LCD display (or touch screen), for displaying information to a computer user. An input device 314, including alphanumeric and other keys, is coupled to bus 302 for communicating information and command selections to processor 304. Another type of user input device is cursor control 316, such as a mouse, a trackball, or cursor direction keys for communicating direction information and command selections to processor 304 and for controlling cursor movement on display 312. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

Computing system 300 may include a user interface module to implement a GUI that may be stored in a mass storage device as computer executable program instructions that are executed by the computing device(s). Computer system 300 may further, as described below, implement the techniques described herein using customized hard-wired logic, one or more ASICs or FPGAs, firmware and/or program logic which in combination with the computer system causes or programs computer system 300 to be a special-purpose machine. According to one embodiment, the techniques herein are performed by computer system 300 in response to processor(s) 304 executing one or more sequences of one or more computer-readable program instructions contained in main memory 306. Such instructions may be read into main memory 306 from another storage medium, such as storage device 310. Execution of the sequences of instructions contained in main memory 306 causes processor(s) 304 to perform the process steps described herein. In alternative embodiments, hard-wired circuitry may be used in place of or in combination with software instructions.

Various forms of computer-readable storage media may be involved in carrying one or more sequences of one or more computer-readable program instructions to processor 304 for execution. For example, the instructions may initially be carried on a magnetic disk or solid-state drive of a remote computer. The remote computer can load the instructions into its dynamic memory and send the instructions over a telephone line using a modem. A modem local to computer system 300 can receive the data on the telephone line and use an infra-red transmitter to convert the data to an infra-red signal. An infra-red detector can receive the data carried in the infra-red signal and appropriate circuitry can place the data on bus 302. Bus 302 carries the data to main memory 306, from which processor 304 retrieves and executes the instructions. The instructions received by main memory 306 may optionally be stored on storage device 310 either before or after execution by processor 304.

Computer system 300 also includes a communication interface 318 coupled to bus 302. Communication interface 318 provides a two-way data communication coupling to a network link 320 that is connected to a local network 322. For example, communication interface 318 may be an integrated services digital network (ISDN) card, cable modem, satellite modem, or a modem to provide a data communication connection to a corresponding type of telephone line. As another example, communication interface 318 may be a local area network (LAN) card to provide a data communication connection to a compatible LAN (or WAN component to communicated with a WAN). Wireless links may also be implemented. In any such implementation, communication interface 318 sends and receives electrical, electromagnetic, or optical signals that carry digital data streams representing various types of information.

Network link 320 typically provides data communication through one or more networks to other data devices. For example, network link 320 may provide a connection through local network 322 to a host computer 324 or to data equipment operated by an Internet Service Provider (ISP) 326. ISP 326 in turn provides data communication services through the worldwide packet data communication network now commonly referred to as the "Internet" 328. Local network 322 and Internet 328 both use electrical, electromagnetic, or optical signals that carry digital data streams. The signals through the various networks and the signals on network link 320 and through communication interface 318, which carry the digital data to and from computer system 300, are example forms of transmission media.

Computer system 300 can send messages and receive data, including program code, through the network(s), network link 320 and communication interface 318. In the Internet example, a server 330 might transmit a requested code for an application program through Internet 328, ISP 326, local network 322 and communication interface 318.

The received code may be executed by processor 304 as it is received, and/or stored in storage device 310, or other non-volatile storage for later execution.

As described above, in various embodiments certain functionality may be accessible by a user through a web-based viewer (such as a web browser), or other suitable software program. In such implementations, the user interface may be generated by a server computing system and transmitted to a web browser of the user (e.g., running on the user's computing system). Alternatively, data (e.g., user interface data) necessary for generating the user interface may be provided by the server computing system to the browser, where the user interface may be generated (e.g., the user interface data may be executed by a browser accessing a web service and may be configured to render the user interfaces based on the user interface data). The user may then interact with the user interface through the web-browser. User interfaces of certain implementations may be accessible through one or more dedicated software applications. In certain embodiments, one or more of the computing devices and/or systems of the disclosure may include mobile computing devices, and user interfaces may be accessible through such mobile computing devices (for example, smartphones and/or tablets).

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The term "substantially" when used in conjunction with the term "real-time" forms a phrase that will be readily understood by a person of ordinary skill in the art. For example, it is readily understood that such language will include speeds in which no or little delay or waiting is discernible, or where such delay is sufficiently short so as not to be disruptive, irritating, or otherwise vexing to a user.

Conjunctive language such as the phrase "at least one of X, Y, and Z," or "at least one of X, Y, or Z," unless specifically stated otherwise, is to be understood with the context as used in general to convey that an item, term, and/or the like may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general-purpose computer comprising one or more processors should not be interpreted as excluding other computer components, and may possibly include such components as memory, input/output devices, and/or network interfaces, among others.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

VIII. Example Clauses

Examples of the implementations of the present disclosure can be described in view of the following example clauses. The features recited in the below example implementations can be combined with additional features disclosed herein. Furthermore, additional inventive combinations of features are disclosed herein, which are not specifically recited in the below example implementations, and which do not include the same features as the specific implementations below. For sake of brevity, the below example implementations do not identify every inventive aspect of this disclosure. The below example implementations are not intended to identify key features or essential features of any subject matter described herein. Any of the example clauses below, or any features of the example clauses, can be combined with any one or more other example clauses, or features of the example clauses or other features of the present disclosure.

Clause 1: A system for monitoring objects surrounding an area, the system comprising: a first RF system comprising:

one or more first antennas that are positioned to face a first direction; and a first processing module in communication with the one or more first antennas, wherein the first processing module comprises: a computer readable storage medium comprising program instructions and a machine learning model, wherein the machine learning model has been trained to identify a type of object associated with a first set of RF signals; and one or more first processors that are configured to execute the first program instructions to cause the first RF system to: collect, using the one or more first antennas, a first set of RF signal data associated with a first object; identify, by application of the machine learning model, a type of object associated with the first object; based at least in part on the type of object, generate and cause transmission of, using the one or more first antennas, a second set of RF signals different from the first set of RF signals; and based on a determination that the first object is moving away from the first direction and towards a second direction corresponding to a second one or more antennas, transmit, to a second RF system, a data packet associated with the second set of RF signals; and the second RF system comprising: the one or more second antennas that are positioned to face the second direction different from the first direction; and a second processing module in communication with to the one or more second antennas and comprising a second one or more processors configured to execute second program instructions to cause the second RF system to: receive, from the first RF system, the data packet; and generate and cause transmission of, using the one or more second antennas, the second set of RF signals.

Clause 2: The system of clause 1, wherein the first one or more antennas and the second one or more antennas are directional, broad-bandwidth, or both.

Clause 3: The system of any of clauses 1-2, wherein the first direction and the second direction are both facing away from an area.

Clause 4: The system of clause 3, wherein the area corresponds to a building or multiple buildings.

Clause 5: The system of any of clauses 1-4, wherein the transmission of the second set of RF signals by the one or more first antennas is transmitted in the first direction.

Clause 6: The system of any of clauses 1-5, wherein the transmission of the second set of RF signals by the one or more second antennas is transmitted in the second direction.

Clause 7: The system of any of clauses 1-6, wherein the one or more first processors are configured to execute the first program instructions to cause the first RF system to: in response to the determination that the first object is moving out of the first direction and into the second direction, reduce power output of the transmission of the second set of RF signals by the first one or more antennas over a period of time.

Clause 8: The system of clause 7, wherein the one or more second processors are configured to execute the first program instructions to cause the second RF system to: in response to receiving the data packet, increase power output of the transmission of the second set of RF signals by the second antenna over the period of time.

Clause 9: The system of any of clauses 1-8, wherein the object comprises a velocity.

Clause 10: The system of any of clauses 1-9, wherein the one or more first antennas includes a first antenna that radiates or receives signals over an area that is between 80 degrees and 110 degrees in a direction the first antenna is configured to face.

Clause 11: The system of any of clauses 1-10, wherein the one or more first antennas comprises two, three, or four antennas.

Clause 12: The system of any of clauses 1-11, wherein the one or more first antennas are configured to be adjustable with respect to an angle of elevation or tilt as compared to a plane the first RF system is stationed on.

Clause 13: The system of any of clauses 1-12, wherein the first processing module further comprises: one or more graphical processing units (GPUs) configured to execute the machine learning model.

Clause 14: A computer implemented method comprising, by a first RF system comprising one or more hardware processors executing program instructions: receiving, via one or more directional antennas, a first set of RF signals; identifying, by application of a machine learning model, a type of object associated with the first set of RF signals; based at least in part on the type of object, generating and causing transmission of a second set of RF signals different from the first set of RF signals; and based on a determination that a first object is moving away from the first direction and towards a second direction corresponding to a second one or more antennas, transmitting, to a second RF system, a data packet associated with the second set of RF signals.

Clause 15: The computer implemented method of clause 14, wherein the second RF system is configured to receive the data packet and cause transmission of the second set of RF signals.

Clause 16: The computer implemented method of any of clauses 14-15, wherein the second set of RF signals are transmitted via one or more directional antennas.

Clause 17: The computer implemented method of clause 16, wherein the one or more directional antennas include a first set of directional antennas associated with the first RF system, and a second set of directional antennas associated with the second RF system.

Clause 18: The computer implemented method of clause 17, wherein the first set of directional antennas are generally oriented in a first directions, and the second set of directional antennas are generally oriented in a second directions different from the first direction.

Clause 19: A system comprising: a computer readable storage medium having program instructions embodied therewith; and one or more processors configured to execute the program instructions to cause the system to perform the computer-implemented method of any of clauses 14-18.

Clause 20: A computer program product comprising a computer-readable storage medium having program instructions embodied therewith, the program instructions executable by one or more processors to cause the one or more processors to perform the computer-implemented method of any of clauses 14-18.

Clause 21: A modular RF system comprising: a first module enclosure configured to house a first plurality of modules; one or more antennas coupled to the module enclosure on one or more exterior surfaces of the module enclosure and configured to receive RF signals and transmit RF signals; a first channel extending from a bottom portion of the first module enclosure, through an interior portion of the first module enclosure, to a top portion of the first module enclosure; a first one or more heat sinks positioned within the first channel and thermally coupled to the first plurality of modules; and at least one fan positioned at a top or a bottom of the first module enclosure and configured to cause air to flow through the first channel and the first one or more heat sinks.

Clause 22: The modular RF system of clause 21 further comprising: a direction finder coupled to an exterior surface of the RF system, in communication with at least one of the first plurality of modules, and configured to receive RF signals and provide direction finding information to the at least one of the first plurality of modules.

Clause 23: The modular RF system of any of clauses 21-22, wherein the one or more antennas comprise a first two antennas, and wherein the first two antennas are in electrical communication with at least two of the first plurality of modules.

Clause 24: The modular RF system of any of clauses 21-23 further comprising: a second module enclosure configured to house a second plurality of modules and coupled to the first module enclosure; a second channel extending from a bottom portion of the second module enclosure, through an interior portion of the second module enclosure, to a top portion of the second module enclosure, wherein the second channel is aligned with the first channel; and a second one or more heat sinks positioned within the first channel and thermally coupled to the first plurality of modules, wherein the at least one fan is configured to cause air to flow through the first and second channels, through and the first and second one or more heat sinks.

Clause 25: The modular RF system of clause 24, wherein the one or more antennas comprise four antennas, wherein two antennas of the four antennas are in electrical communication with at least two of the first plurality of modules, and wherein two other antennas of the four antennas are in electrical communication with at least two of the second plurality of modules.

Clause 26: The modular RF system of any of clauses 24-25, wherein the second module enclosure is coupled to the first module enclosure via a joining enclosure.

Clause 27: The modular RF system of any of clauses 21-26 further comprising: an upper enclosure with air vents; and a lower enclosure with air vents.

Clause 28: The modular RF system of clause 27, wherein a first fan is positioned in the upper enclosure, and wherein a second fan is positioned in the lower enclosure.

Clause 29: The modular RF system of any of clauses 21-28, wherein the first plurality of modules includes at least one of: a power supply module, an RF module, or a processing module.

Clause 30: The modular RF system of any of clauses 21-29, wherein the first plurality of modules is housed within a peripheral portion of the first module enclosure that surrounds the first channel and is configured to hermetically seal the first plurality of modules within the peripheral portion.

Clause 31: The modular RF system of any of clauses 21-30, wherein the one or more antennas comprise broad-bandwidth, directional antennas.

Clause 32: The modular RF system of any of clauses 21-31, wherein: each of the one or more antennas radiates or receives greater power in a specific direction, the one or more antennas are configured to operate independently, and each of the one or more antennas is configured operate in coordination with one or more other of the one or more antennas.

Clause 33: The modular RF system of any of clauses 21-32, wherein the one or more antennas includes a first antenna that radiates or receives signals over an area that is between 80 degrees and 110 degrees in a direction the first antenna is configured to face.

Clause 34: The modular RF system of any of clauses 21-33, wherein one or more antennas comprises two, three, or four antennas.

Clause 35: The modular RF system of any of clauses 21-34, wherein the one or more antennas are configured to be adjustable with respect to an angle of elevation or tilt as compared to a plane the modular RF system is stationed on.

Clause 36: The modular RF system of any of clauses 21-35, wherein the first plurality of modules comprises at least: a power supply module, two RF modules, and a processing module.

Clause 37: The modular RF system of clause 36, wherein the power supply module is configured to provide power to at least the two RF modules and the processing module.

Clause 38: The modular RF system of any of clauses 36-37, wherein each respective one of the two RF modules is in electrical communication with a respective one of the one or more antennas, and wherein each of the two RF modules is in electrical communication with the processing module and configured with at least: a multiplexer, a reception amplifier, and a transmission amplifier.

Clause 39: The modular RF system of any of clauses 36-38, wherein each of the RF modules is configured to: receive RF signals from an antenna of the one or more antennas; amplify, filter, and/or limit the received RF signals; and provide the amplified, filtered, and/or limited received RF signals to the processing module.

Clause 40: The modular RF system of any of clauses 36-39, wherein each of the RF modules is configured to: receive RF signals from the processing module; amplify, filter, and/or limit the received RF signals; and transmit the amplified, filtered, and/or limited received RF signals via an antenna of the one or more antennas.

Clause 41: The modular RF system of any of clauses 36-40, wherein the processing module is configured to: receive RF signals; process RF signals; determine RF signals to transmit based on the processed RF signals; generate RF signals to transmit; and cause transmission of generated RF signals.

Clause 42: The modular RF system of any of clauses 36-41, wherein the processing module comprises at least: a processor, a graphics processing unit (GPU), a software defined radio (SDR) transceiver, and a storage device.

Clause 43: An antenna mount of an RF system, the antenna mount comprising: a first coupling feature positioned in a track of a side of the RF system, wherein the first coupling feature may slidably move in the track; an antenna bracket coupled to the first coupling feature, wherein the coupling between the antenna bracket and the first coupling feature provides a first pivot point, and wherein an antenna is coupled to the antenna bracket; a fixed mount on the side of the RF system; and a second coupling feature coupled to the fixed mount, wherein the coupling between the fixed mount and the second coupling feature provides a second pivot point, and wherein the second coupling feature is coupled to the antenna bracket providing a third pivot point.

Clause 44: The antenna mount of clause 43, wherein the first coupling feature is configured to be slid along the track to provide a target angle for the antenna by movement of the first, second, and third pivot points.

Clause 45: The antenna mount of any of clauses 43-44, wherein the antenna bracket is coupled to the first coupling feature by insertion of a first locking portion of the antenna bracket into a receiving locking portion of the first coupling feature at a first angle, and then rotation of the antenna bracket causing engagement of the first locking portion with the receiving locking portion.

Clause 46: The antenna mount of any of clauses 43-45, wherein the second coupling feature is coupled to the fixed mount with a locking pin.

Clause 47: The antenna mount of any of clauses 43-46, wherein the first coupling feature is releasably locked in place on the track using a locking component.

Clause 48: An antenna mounting method in an RF system, the method comprising: providing a first coupling feature of an antenna mount in a track of a side of the RF system, wherein the first coupling feature may slidably move in the track; providing a fixed mount on the side of the RF system; coupling an antenna bracket to the first coupling feature, wherein the coupling between the antenna bracket and the first coupling feature provides a first pivot point, and wherein an antenna is coupled to the antenna bracket; coupling a second coupling feature of the antenna mount to the fixed mount, wherein the coupling between the fixed mount and the second coupling feature provides a second pivot point, and wherein the second coupling feature is coupled to the antenna bracket providing a third pivot point; and sliding the first coupling feature along the track to provide a target angle for the antenna by movement of the first, second, and third pivot points.

Clause 49: The method of clause 48, wherein coupling the antenna bracket to the first coupling feature comprises inserting a first locking portion of the antenna bracket into a receiving locking portion of the first coupling feature at a first angle, and then rotating the antenna bracket to cause the first locking portion to engage with the receiving locking portion.

Clause 50: The method of any of clauses 48-49, wherein the second coupling feature is coupled to the fixed mount using a locking pin.

Clause 51: The method of clause any of clauses 48-50 further comprising: locking the first coupling feature in place on the track using a locking component.

Clause 52: An RF transceiver system comprising: a first module enclosure comprising: a first inner portion comprising a first cavity that is open on a top and a bottom of the first module enclosure portion, and a first peripheral portion that surrounds the first cavity and is configured to support a first one or more modules; a first one or more heat sinks positioned in the first inner portion of the first module enclosure; a first one or more thermal interfaces on at least one wall of the first inner portion of the first module enclosure and configured to provide thermal coupling between the first one or more heat sinks and the first one or more modules; and a first fan configured to cause air to flow through the first cavity and the first one or more heat sinks.

Clause 53: The RF transceiver system of clause 52, wherein the first one or more modules include at least one of: a power supply module, an RF module, or a processing module.

Clause 54: The RF transceiver system of any of clauses 52-53, wherein each of the first one or more modules includes a housing comprised of a thermally conductive material.

Clause 55: The RF transceiver system of any of clauses 52-54, wherein each of the first one or more thermal interfaces comprises a thermally conductive material.

Clause 56: The RF transceiver system of any of clauses 52-55, wherein the first module enclosure is configured to hermetically seal first one or more modules within the first peripheral portion.

Clause 57: The RF transceiver system of any of clauses 52-56 further comprising: a lower enclosure coupled to the bottom of the first module enclosure and supporting the first fan, wherein the lower enclosure includes one or more vents through which air may flow.

Clause 58: The RF transceiver system of any of clauses 52-57 further comprising: a second fan configured to cause air to flow through the first cavity and the first one or more heat sinks.

Clause 59: The RF transceiver system of clause 58 further comprising: an upper enclosure supporting the second fan, wherein the upper enclosure includes one or more vents through which air may flow.

Clause 60: The RF transceiver system of clause 59 further comprising: a second module enclosure comprising: a second inner portion comprising a second cavity that is open on a top and a bottom of the second module enclosure portion, and a second peripheral portion that surrounds the second cavity and is configured to support a second one or more modules; a second one or more heat sinks positioned in the second inner portion of the second module enclosure; and a second one or more thermal interfaces on at least one wall of the second inner portion of the second module enclosure and configured to provide thermal coupling between the second one or more heat sinks and the second one or more modules.

Clause 61: The RF transceiver system of clause 60, wherein the first module enclosure is coupled to the second module enclosure to provide an alignment between the first cavity and the second cavity.

Clause 62: The RF transceiver system of clause 61, wherein the upper enclosure is coupled to the top of the second module enclosure.

Clause 63: The RF transceiver system of any of clauses 52-62 further comprising: a plug in an opening between the first one or more heat sinks to direct air flow though the first one or more heat sinks.

Clause 64: A thermal management method of an RF system, the thermal management method comprising: providing one or more heat sinks on an inner portion of the RF system, wherein the inner portion comprises a cavity in a module enclosure portion of the RF system that is open on a top and a bottom of the module enclosure portion; providing thermal coupling, via thermal interfaces on the inner portion of the RF system, between the one or more heat sinks, and one or more modules, wherein the one or more modules include at least one of: a power supply module, an RF module, or a processing module; and providing at least a first fan configured to draw air through the cavity and the one or more heat sinks to draw heat from the one or more modules.

Clause 65: The method of clause 64, wherein the one or more modules are positioned in a peripheral portion of the module enclosure that surrounds the cavity.

Clause 66: The method of clause 65, wherein the one or more modules are hermetically sealed within the peripheral portion of the module enclosure.

Clause 67: The method of any of clauses 64-66, wherein the first fan is positioned in at least one of: an upper portion of the RF system, or a lower portion of the RF system.

Clause 68: The method of any of clauses 64-67, further comprising: at least a second fan configured to draw air through the cavity and the one or more heat sinks to draw heat from the one or more modules.

Clause 69: The method of clause 68, wherein the first fan is positioned in at least one of: an upper portion of the RF system, or a lower portion of the RF system; and wherein the second fan is positioned in a different one of at least one of: the upper portion of the RF system, or the lower portion of the RF system.

Clause 70: The method of any of clauses 64-69, wherein the first and second fans are configured to draw air in a same direction through the cavity.

Clause 71: The method of any of clauses 64-70, wherein the first and second fans are configured to draw air from the lower portion of the RF system to the upper portion of the RF system.

Clause 72: The method of any of clauses 64-71, further comprising: activating at least the first and second fans.

Clause 73: The method of any of clauses 64-72, further comprising: activating at least the first fan.

Clause 74: The method of any of clauses 64-73, further comprising: providing second one or more heat sinks on a second inner portion of the RF system, wherein the second inner portion comprises a second cavity in a second module enclosure portion of the RF system that is open on a top and a bottom of the second module enclosure portion; and providing thermal coupling, via thermal interfaces on the second inner portion of the RF system, between the second one or more heat sinks, and second one or more modules, wherein the second one or more modules include at least one of: a power supply module, an RF module, or a processing module, wherein the second module enclosure portion is coupled to the first module enclosure portion to provide an alignment between the cavity and the second cavity such that at least the first fan is configured to draw air through both the cavity, the one or more heat sinks, the second cavity, and the second one or more heat sinks to draw heat from the one or more modules and the second one or more modules.

Clause 75: The method of clause 74, wherein the second one or more modules are positioned in a peripheral portion of the second module enclosure that surrounds the second cavity.

Clause 76: The method of any of clauses 64-75 further comprising: providing a plug in an opening between the one or more heat sinks to direct air flow though the one or more heat sinks.

Clause 77: A system comprising: a first directional antenna; a first RF module in communication with the first directional antenna; and a first processing module in communication with the first RF module, wherein the system is configured to: receive first RF signals via the first directional antenna and the first RF module; process the first RF signals using the first processing module; generate second RF signals using the first processing module; and transmit the second RF signals via the first RF module and the first directional antenna.

Clause 78: The system of clause 77 further comprising: a second directional antenna; and a second RF module in communication with the second directional antenna, wherein the first processing module is in communication with the second RF module, and wherein the system is further configured to: receive the first RF signals via the second directional antenna and the second RF module.

Clause 79: The system of clause 78, wherein the system is further configured to: transmit the second RF signals via the second RF module and the second directional antenna.

Clause 80: The system of clause 79, wherein the system is further configured to: selectively transmit the second RF signals at varying powers via both the first RF module and first directional antenna, and the second RF module and second directional antenna.

Clause 81: The system of clause 80 further comprising: third and fourth directional antennas; third and fourth RF modules in communication with the respective third and fourth directional antennas; and a second processing module in communication with the third and fourth RF modules, wherein the system is further configured to: receive the first RF signals via the third directional antenna and the third RF module, and via the fourth directional antenna and the fourth RF module.

Clause 82: The system of clause 81, wherein the system is further configured to: transmit the second RF signals via the third directional antenna and the third RF module, and via the fourth directional antenna and the fourth RF module.

Clause 83: The system of clause 82, wherein the system is further configured to: selectively transmit the second RF signals at varying powers via all of the first RF module and first directional antenna, the second RF module and second directional antenna, the third RF module and the third directional antenna, and the fourth RF module and the fourth directional antenna.

Clause 84: The system of clause 81, wherein the first and second processing modules are in communication with one another and configured to coordinate with one another.

Clause 85: The system of any of clauses 77-84, the RF module comprises at least: a multiplexer, a reception amplifier, and a transmission amplifier.

Clause 86: The system of any of clauses 77-85, the processing module comprises at least: a processor, a graphics processing unit (GPU), a software defined radio (SDR) transceiver, and a storage device.

Clause 87: The system of any of clauses 77-86, further comprising: a power supply module in electrical communication with the first RF module and the processing module.

Clause 88: A method of assembling an RF system, the method comprising: providing a module enclosure; providing one or more modules in the module enclosure, the one or more modules comprising at least one of: a power supply module, an RF module, or a processing module; providing one or more heat sinks in an interior portion of the module enclosure and thermally coupled to the one or more modules; coupling upper and lower enclosures to the module enclosure, wherein the upper and lower enclosures each comprise a respective fan; and providing communications links and power connections among the one or more modules.

Clause 89: The method of clause 88 further comprising: coupling one or more antennas to exterior portions of the module enclosure; and providing communications links between the one or more antennas and one or more of the one or more modules.

Clause 90: The method of clause 89 further comprising: mounting the RF system so that the upper enclosure is oriented at a top of the RF system.

Clause 91: A method of assembling an RF system, the method comprising: providing a first module enclosure; providing a first one or more modules in the first module enclosure, the first one or more modules comprising at least one of: a power supply module, an RF module, or a processing module; providing a first one or more heat sinks in an interior portion of the first module enclosure and thermally coupled to the first one or more modules; providing a second module enclosure; providing a second one or more modules in the second module enclosure, the second one or more modules comprising at least one of: a power supply module, an RF module, or a processing module; providing a second one or more heat sinks in an interior portion of the second module enclosure and thermally coupled to the second one or more modules; coupling the first module enclosure to the second module enclosure using a joining enclosure; coupling an upper enclosure to the first module enclosure, wherein the upper enclosure comprises a fan; coupling a lower enclosure to the second module enclosure, wherein the lower enclosure comprises a fan; and providing communications links and power connections among the first and second one or more modules.

Clause 92: The method of clause 91 further comprising: coupling one or more antennas to exterior portions of at least one of the first module enclosure of the second module enclosure; and providing communications links between the one or more antennas and one or more of the first one or more modules and the second one or more modules.

Clause 93: The method of clause 92 further comprising: mounting the RF system so that the upper enclosure is oriented at a top of the RF system.

Clause 94: A computer implemented method for training model to detect RF signals, the computer implemented method comprising, by one or more hardware processors executing program instructions: accessing raw RF signal data; sampling the raw RF signal data; generating a spectrogram based on the sampled raw RF signal data; generate and cause transmission of display instructions configured to display the spectrogram; receive annotation data corresponding to a signal of interest included in the spectrogram; based at least in part on the annotations, generating a first subset of RF signal data corresponding to the signal of interest; and training a machine learning model by inputting, into the machine learning model, the first subset of RF signal data for training the machine learning model.

Clause 95: The computer implemented method of clause 94, wherein the raw RF signal data are collected from one or more broad-bandwidth directional antennas.

Clause 96: The computer implemented method of any of clauses 94-95, further comprising, by the one or more hardware processors executing program instructions: filtering raw RF signal data.

Clause 97: The computer implemented method of clause 96, wherein the filtering includes a complete or partial suppression of one or more aspects of the raw RF signal data, the sampled raw RF signal data, or the first subset of RF signal data.

Clause 98: The computer implemented method of any of clauses 96-97, wherein the filtering comprises removing one or more RF signals from the raw RF signal data that correspond to: (1) one or more base line RF signals, (2) one or more previously-identified RF signals, (3) one or more RF signals already identifiable or otherwise known, (4) RF signals associated with friendly equipment, (5) RF signals associated with equipment that has been manually or automatically flagged as friendly, or (6) a preconfigured whitelist or blacklist.

Clause 99: The computer implemented method of any of clauses 94-98, wherein the sampling of the raw RF signal data comprises sampling the raw RF signal data at a preconfigured timestep.

Clause 100: The computer implemented method of clause 99, wherein the preconfigured timestep is between 0 ms and 15 ms.

Clause 101: The computer implemented method of any of clauses 99-100, wherein the preconfigured timestep is further based at least in part on hardware components associated with an RF system implementing the method.

Clause 102: The computer implemented method of any of clauses 94-101, wherein the spectrogram comprises the sampled raw RF signal data as a function of frequency, time, and/or intensity.

Clause 103: The computer implemented method of any of clauses 94-102, wherein the annotation data further correspond to a period of time in which the signal of interest is present on the spectrogram.

Clause 104: The computer implemented method of any of clauses 94-103, wherein the annotation data further correspond to one or more frequencies or frequency bands associated with the signal of interest.

Clause 105: The computer implemented method of any of clauses 94-104, wherein the generating of the first subset of RF signal data includes removal of at least a portion of the raw RF signal data that is not part of the signal of interest.

Clause 106: The computer implemented method of any of clauses 94-105, wherein an output of the trained machine learning model is configured to be predicted classes and probabilities corresponding to the signal of interest that can be used to identify a type of object.

Clause 107: A system comprising: a computer readable storage medium having program instructions embodied therewith; and one or more processors configured to execute the program instructions to cause the system to perform the computer-implemented method of any of clauses 94-106.

Clause 108: A computer program product comprising a computer-readable storage medium having program instructions embodied therewith, the program instructions executable by one or more processors to cause the one or more processors to perform the computer-implemented method of any of clauses 94-106.

Clause 109: A computer implemented method for applying a machine learning model to identify one or more RF signals, the computer implemented method comprising, by one or more hardware processors executing program instructions: accessing raw RF signal data; sampling the raw RF signal data; inputting, into a machine learning model, the sampled RF signal data; and based on an output from the machine learning model, identify a type of object.

Clause 110: The computer implemented method of clause 109, wherein the raw RF signals are collected from one or more broad-bandwidth directional antennas.

Clause 111: The method of any of clauses 109-110, further comprising, by the one or more hardware processors executing program instructions: filtering raw RF signal data.

Clause 112: The method of clause 111, wherein the filtering includes a complete or partial suppression of one or more aspects of the raw RF signal data, the sampled raw RF signal data, or a subset of RF signal data.

Clause 113: The method of any of clauses 111-112, wherein the filtering comprises removing one or more RF signals from the raw RF signal data that correspond to: (1) RF signals associated with friendly equipment, (2) RF signals associated with equipment that has been manually or automatically flagged as friendly, or (3) a preconfigured whitelist or blacklist.

Clause 114: The method of any of clauses 109-113, wherein the sampling of the raw RF signal data comprises sampling the raw RF signal data at a preconfigured timestep.

Clause 115: The method of clause 114, wherein the preconfigured timestep is between 0 ms and 15 ms.

Clause 116: The method of any of clauses 114-115, wherein the preconfigured timestep is further based at least in part on hardware components associated with an RF system implementing the method.

Clause 117: The method of any of clauses 109-116, wherein an output of the machine learning model includes predicted classes and probabilities corresponding to one or more RF signals that are identified by the machine learning model.

Clause 118: The method of clause 117, wherein identification of the type of object is further based on bandwidth, channel, signal rate associated with the one or more RF signals that are identified by the machine learning model.

Clause 119: A system comprising: a computer readable storage medium having program instructions embodied therewith; and one or more processors configured to execute the program instructions to cause the system to perform the computer-implemented method of any of clauses 109-118.

Clause 120: A computer program product comprising a computer-readable storage medium having program instructions embodied therewith, the program instructions executable by one or more processors to cause the one or more processors to perform the computer-implemented method of any of clauses 109-118.

Clause 121: A computer implemented method comprising, by one or more hardware processors executing program instructions: collecting, by a first set of antennas, a first set of RF signal data associated with a first object; inputting, into a machine learning model, the first set of RF signal data; based on an output from the machine learning model, identify a type of object associated with the first object; based at least in part on the type of object, generating a second set of RF signals different from the first set of RF signals; and generating and causing transmission, using a second set of antennas, of the second set of RF signals.

Clause 122: The computer implemented method of clause 121, wherein the first set of antennas are directional, broad-bandwidth, or both.

Clause 123: The computer implemented method of any of clauses 121-122, wherein the first set of RF signal data is sampled prior to inputting the first set of RF signal data into the machine learning model.

Clause 124: The computer implemented method of any of clauses 121-123, further comprising, by the one or more hardware processors executing program instructions: determine additional features associated with the first set of RF signals or the type of object.

Clause 125: The computer implemented method of clause 124, wherein the additional features associated with the first set of RF signals include one or more of: bandwidth, channel, and signal rate.

Clause 126: The computer implemented method of any of clauses 121-125, wherein the first set of antennas are the same as the second set of antennas.

Clause 127: The computer implemented method of any of clauses 121-126, wherein the first set of antennas are different from the second set of antennas.

Clause 128: The computer implemented method of any of clauses 121-127, wherein the transmission of the second set of RF signals includes transmission of the second set of RF signals in a direction associated with the first object.

Clause 129: The computer implemented method of any of clauses 121-128, further comprising, by the one or more hardware processors executing program instructions: accessing a preconfigured list of RF frequencies; and prior to transmission of the second set of RF signals, filtering the second set of RF signals to remove one or more RF frequencies based at least in part on the preconfigured list.

Clause 130: The computer implemented method of any of clauses 121-129, further comprising, by the one or more hardware processors executing program instructions: while causing transmission of the second set of RF signals, automatically tracking a location of an object associated with the first set of RF signals.

Clause 131: The computer implemented method of clause 130, wherein the tracking of the location of the object is performed by a radio direction finder.

Clause 132: A system comprising: a computer readable storage medium having program instructions embodied therewith; and one or more processors configured to execute the program instructions to cause the system to perform the computer-implemented method of any of clauses 121-131.

Clause 133: A computer program product comprising a computer-readable storage medium having program instructions embodied therewith, the program instructions executable by one or more processors to cause the one or more processors to perform the computer-implemented method of any of clauses 121-131.

Clause 134: A RF system comprising: a direction finder; a plurality of antennas, wherein: each of the plurality antennas receives or radiates RF signals in a specific direction, the plurality antennas are configured to operate independently, and each of the plurality of antennas is configured operate in coordination with one or more other antennas of the plurality of antennas; and electronic circuitry comprising one or more hardware processors configured to execute programmable instructions to cause the RF system to: track a first RF signal using a first antenna; determine, using data collected from the direction finder or the first antenna: that the first RF signal is being emitted from an object, and a velocity associated with the object; and based at least in part on the determinations, activate a second antenna to continue tracking the first RF signal.

Clause 135: The RF system of clause 134, wherein the first RF signal is detected within a first area corresponding to the first antenna.

Clause 136: The RF system of any of clauses 134-135, wherein tracking the first RF signal is also based at least in part on information received from one or more of: other RF systems, devices, or sensors.

Clause 137: The RF system of any of clauses 134-136, wherein the object is moving relative to the first antenna.

Clause 138: The RF system of any of clauses 134-137, wherein the object is moving out of a first area.

Clause 139: The RF system of any of clauses 134-138, wherein the object is moving into a second area associated with a second antenna.

Clause 140: The RF system of any of clauses 134-139, wherein the one or more hardware processors are further configured to cause the RF system to: based at least in part on the activation of the second antenna, deactivate the first antenna.

Clause 141: The RF system of clause 140, wherein deactivation of the second antenna occurs contemporaneously after activation of the first antenna.

Clause 142: The RF system of any of clauses 140-141, wherein deactivation of the second antenna occurs once a period of time elapses after activation of the first antenna.

Clause 143: The RF system of clause 142, wherein the period of time is preconfigured or automatically configured based on the velocity that was determined.

Clause 144: A computer implemented method comprising, by one or more hardware processors executing program instructions: accessing or receiving detection data associated with a first object, wherein the detected data is collected or generated by one or more: RF systems, sensors, and devices configured to detect RF signals or objects; collecting, using one or more antennas, RF signal data associated with the first object; based at least in part on the detection data and the RF signal data, identifying a first set of RF signal data associated with the first object; identifying, by application of a machine learning model, a type of object associated with the first object; and based at least in part on the type of object, generating and causing transmission, using the one or more antennas, of a second set of RF signals different from the first set of RF signals.

Clause 145: The method of clause 144, wherein the detection data includes a portion of the first set of RF signals.

Clause 146: The method of any of clauses 144-145, wherein the detection data indicates a physical location associated with the first object.

Clause 147: The method of clause 146, wherein the one or more antennas are configured to face a direction corresponding to the physical location.

Clause 148: The method of any of clauses 144-147, wherein the one or more antennas are directional, broad-bandwidth, or both.

Clause 149: The method of any of clauses 144-148, wherein the causing transmission of the second set of RF signals includes transmission of the second set of RF signals in a direction associated with the first object.

Clause 150: The method of any of clauses 144-149, wherein the machine learning model comprises: inputting, into the machine learning model, the first set of RF signal data such that the machine learning model outputs the type of object associated with the first object.

Clause 151: A system comprising: a computer readable storage medium having program instructions embodied therewith; and one or more processors configured to execute the program instructions to cause the system to perform the computer-implemented method of any of clauses 144-151.

Clause 152: A computer program product comprising a computer-readable storage medium having program instructions embodied therewith, the program instructions executable by one or more processors to cause the one or more processors to perform the computer-implemented method of any of clauses 144-151.

Clause 153: A computer-implemented method comprising, by one or more hardware processors executing program instructions: based on a first set of RF signals associated with a first object and an application of a machine learning model that has been trained to identify a type of object associated with the first set of RF signals, generating and causing transmission of, using a first antenna corresponding to a first RF system, a second set of RF signals; determining that the first object is moving out of an area associated with the first antenna and into an area associated with a second antenna; and based on the determination: adjust power supplied to the first antenna; adjust power supplied to the second antenna; and cause transmission, using the second antenna, of the second set of RF signals.

Clause 154: The computer implemented method of clause 153, wherein the transmission of the second set of RF signals by the first antenna or the second antenna includes transmission of the second set of RF signals in a direction associated with the first object.

Clause 155: The computer implemented method of any of clauses 153-154, wherein the determination that the first object is moving out of an associated with the first antenna and into an area associated with a second antenna is performed using at least a direction finder.

Clause 156: The computer implemented method of any of clauses 153-155, wherein the second antenna corresponds to the first RF system.

Clause 157: The computer implemented method of any of clauses 153-156, wherein the second antenna corresponds to a second RF system.

Clause 158: The computer implemented method of any of clauses 153-157, wherein adjusting the power supplied to the first antenna comprises ceasing transmission of the second set of RF signals.

Clause 159: The computer implemented method of any of clauses 153-158, wherein adjusting the power supplied to the second antenna comprises initiating transmission of the second set of RF signals.

Clause 160: The computer implemented method of clause 159, further comprising, by the one or more hardware processors executing program instructions: in response to the initiating of the transmission of the second set of RF signals by the second antenna: reducing power output of the transmission of the second set of RF signals by the first antenna over a period of time; and contemporaneously increasing power output of the transmission of the second set of RF signals by the second antenna over the period of time.

Clause 161: The computer implemented method of clause 160, wherein the second antenna corresponds to the first RF system, and wherein total power used at any moment in time by the first antenna and the second antenna remains constant.

Clause 162: The computer implemented method of any of clauses 153-161, wherein the second antenna corresponds to a second RF system, and wherein total power used at any moment in time by the first antenna and the second antenna remains constant.

Clause 163: A system comprising: a computer readable storage medium having program instructions embodied therewith; and one or more processors configured to execute the program instructions to cause the system to perform the computer-implemented method of any of clauses 155-162.

Clause 164: A computer program product comprising a computer-readable storage medium having program instructions embodied therewith, the program instructions executable by one or more processors to cause the one or more processors to perform the computer-implemented method of any of clauses 155-162.

Clause 165: An RF system comprising: one or more antennas; an RF module electrically connected to the one or more antennas, wherein the RF module comprises a power amplifier; a processing module electrically connected to the RF module, wherein the processing module comprises: a first one or more graphical processing units (GPUs); a computer readable storage medium comprising program instructions and a machine learning model, wherein the machine learning model has been trained to identify a type of object associated with a first set of RF signals; and one or more first processors that are configured to execute the program instructions to cause the first RF system to: receive a data packet comprising software updates; and install the software updates to update functionality of the RF system.

Clause 166: The RF system of clause 165, wherein the one or more antennas are directional, broad-bandwidth, or both.

Clause 167: The RF system of clause 165, wherein the software updates include one or more of: firmware updates corresponding to hardware components of the RF system, updates corresponding to software components utilized by the RF system, and machine learning model updates.

Clause 168: The RF system of clause 165, wherein the data packet is received from a central processing server or another RF system.

Clause 169: A computer-implemented method for applying a machine learning model to identify one or more RF signals, the computer-implemented method comprising, by one or more hardware processors executing program instructions: receiving raw RF signal data through two or more directional antennas, wherein the two or more directional antennas are configured to be selectably activated; sampling the raw RF signal data; inputting, into a machine learning model, the sampled RF signal data; and based on an output from the machine learning model, identify a type of an object.

Clause 170: The computer-implemented method of clause 169, further comprising, by the one or more hardware processors executing program instructions: selecting for activation one or both of the two or more directional antennas for receiving the raw RF signals, wherein the two or more directional antennas comprise broad-bandwidth directional antennas.

Clause 171: The computer-implemented method of clause 170, further comprising, by the one or more hardware processors executing program instructions: determining, based on positioning of the two or more directional antennas, a location of the object.

Clause 172: The computer-implemented method of any of clauses 169-171, further comprising, by the one or more hardware processors executing program instructions: filtering the raw RF signal data.

Clause 173: The computer-implemented method of clause 172, wherein the filtering includes a complete or partial suppression of one or more aspects of the raw RF signal data, the sampled raw RF signal data, or a subset of RF signal data.

Clause 174: The computer-implemented method of any of clauses 172-173, wherein the filtering comprises removing one or more RF signals from the raw RF signal data that correspond to: (1) RF signals associated with friendly equipment, (2) RF signals associated with equipment that has been manually or automatically flagged as friendly, or (3) a preconfigured whitelist or blacklist.

Clause 175: The computer-implemented method of any of clauses 169-174, wherein the sampling of the raw RF signal data comprises sampling the raw RF signal data at a preconfigured timestep.

Clause 176: The computer-implemented method of clause 175, wherein the preconfigured timestep is between 0 ms and 15 ms.

Clause 177: The computer-implemented method of any of clauses 175-176, wherein the preconfigured timestep is further based at least in part on hardware components associated with an RF system implementing the method.

Clause 178: The computer-implemented method of any of clauses 169-177, wherein an output of the machine learning model includes predicted classes and probabilities corresponding to one or more RF signals that are identified by the machine learning model.

Clause 179: The computer-implemented method of clause 179, wherein identification of the type of object is further based on bandwidth, channel, signal rate associated with the one or more RF signals that are identified by the machine learning model.

Clause 180: The computer-implemented method of any of clauses 169-179, wherein an output of the machine learning model includes predicted classes and probabilities corresponding to one or more RF signals that are identified by the machine learning model.

Clause 181: The computer-implemented method of any of clauses 169-180 further comprising training the machine learning model, wherein training the machine learning model comprises: based at least in part on annotations corresponding to a signal of interest included in a spectrogram, generating a first subset of RF signal data corresponding to the signal of interest, wherein the spectrogram is generated based on raw RF signal training data; and inputting, into the machine learning model, the first subset of RF signal data for training the machine learning model to identify the signal of interest.

Clause 182: The computer-implemented method of clause 181, wherein the raw RF signal training data are collected from one or more broad-bandwidth directional antennas.

Clause 183: The computer-implemented method of any of clauses 181-182, wherein the spectrogram comprises the raw RF signal training data as a function of frequency, time, and/or intensity.

Clause 184: The computer-implemented method of any of clauses 181-183, wherein the annotations further correspond to a period of time in which the signal of interest is present on the spectrogram.

Clause 185: The computer-implemented method of any of clauses 181-184, wherein the annotations further correspond to one or more frequencies or frequency bands associated with the signal of interest.

Clause 186: The computer-implemented method of any of clauses 181-185, wherein the generating of the first subset of RF signal data includes removal of at least a portion of the raw RF signal training data that is not part of the signal of interest.

Clause 187: A system comprising: a computer readable storage medium having program instructions embodied therewith; and one or more processors configured to execute the program instructions to cause the system to perform the computer-implemented method of any of clauses 169-186.

Clause 188: A computer program product comprising a computer-readable storage medium having program instructions embodied therewith, the program instructions executable by one or more processors to cause the one or more processors to perform the computer-implemented method of any of clauses 169-186.

What is claimed is:

1. An RF transceiver system comprising:
a first module enclosure comprising:
    a first inner portion comprising a first cavity, and
    a first peripheral portion that surrounds the first cavity, the first peripheral portion being sealed from liquids, and surrounds or encloses a first one or more modules;
a first one or more heat sinks positioned in the first inner portion of the first module enclosure;
a first one or more thermal interfaces on at least one wall of the first inner portion of the first module enclosure and configured to provide thermal coupling between the first one or more heat sinks and the first one or more modules; and
a first fan configured to cause air to flow through the first cavity and the first one or more heat sinks, wherein the first cavity is open on a top and a bottom to enable airflow from the bottom to the top of the RF transceiver system, the airflow passing across the first one or more heat sinks to dissipate heat generated by the first one or more modules.

2. The RF transceiver system of claim 1, further comprising:
a lower enclosure coupled to the bottom of the first module enclosure and supporting the first fan, wherein the lower enclosure includes one or more intake vents, wherein the first fan is configured to draw air upward from the lower enclosure through the first cavity and across the first one or more heat sinks to an upper end of the RF transceiver system.

3. The RF transceiver system of claim 1, further comprising:

a second fan configured to cause air to flow through the first cavity and the first one or more heat sinks.

4. The RF transceiver system of claim 3, further comprising:

an upper enclosure supporting the second fan, wherein the upper enclosure includes one or more exhaust vents.

5. The RF transceiver system of claim 4, further comprising:

a second module enclosure comprising:

a second inner portion comprising a second cavity that is open on a top and a bottom, and a second peripheral portion that surrounds or encloses a second one or more modules;

a second one or more heat sinks positioned in the second inner portion of the second module enclosure; and a second one or more thermal interfaces on at least one wall of the second inner portion of the second module enclosure and configured to provide thermal coupling between the second one or more heat sinks and the second one or more modules.

6. The RF transceiver system of claim 5, wherein the first module enclosure is coupled to the second module enclosure to provide an alignment between the first cavity and the second cavity.

7. The RF transceiver system of claim 6, wherein the upper enclosure is coupled to the top of the second module enclosure.

8. The RF transceiver system of claim 1, wherein the first cavity is also sealed from fluids, hermetically sealed, and airtight.

9. The RF transceiver system of claim 1, wherein the first cavity is configured to provide for electromagnetic interference (EMI) shielding.

10. The RF transceiver system of claim 1, wherein the first one or more thermal interfaces comprise heat spreaders, conductive walls, or equivalent thermally conductive members.

11. The RF transceiver system of claim 1, wherein the first one or more modules comprise at least one RF module being operatively coupled to at least one directional antenna supported by the first module enclosure.

12. The RF transceiver system of claim 5, wherein the second module enclosure is coupled to the first module enclosure such that the second cavity is aligned with the first cavity, and the first fan is configured to cause air to flow through both the first cavity and the second cavity to cool the first and second module enclosures.

* * * * *